United States Patent
Antonuk

(10) Patent No.: US 8,492,728 B2
(45) Date of Patent: Jul. 23, 2013

(54) PHOTODIODE AND OTHER SENSOR STRUCTURES IN FLAT-PANEL X-RAY IMAGERS AND METHOD FOR IMPROVING TOPOLOGICAL UNIFORMITY OF THE PHOTODIODE AND OTHER SENSOR STRUCTURES IN FLAT-PANEL X-RAY IMAGERS BASED ON THIN-FILM ELECTRONICS

(75) Inventor: Larry E. Antonuk, Ann Arbor, MI (US)

(73) Assignee: Regents of the University of Michigan, Ann Arbor, MI (US)

( * ) Notice: Subject to any disclaimer, the term of this patent is extended or adjusted under 35 U.S.C. 154(b) by 411 days.

(21) Appl. No.: 12/817,634

(22) Filed: Jun. 17, 2010

(65) Prior Publication Data

US 2010/0320391 A1  Dec. 23, 2010

Related U.S. Application Data

(60) Provisional application No. 61/213,530, filed on Jun. 17, 2009.

(51) Int. Cl.
*G01T 1/20* (2006.01)
(52) U.S. Cl.
USPC .................. 250/370.11; 250/361 R; 250/362; 438/69
(58) Field of Classification Search
USPC ................... 250/361 R, 362, 370.01, 370.08, 250/370.09, 370.11; 257/E27.111; 438/57, 438/69, 73
See application file for complete search history.

(56) References Cited

U.S. PATENT DOCUMENTS

| | | |
|---|---|---|
| 5,057,892 A | 10/1991 | Iwanczyk |
| 5,079,426 A | 1/1992 | Antonuk et al. |
| 5,262,649 A | 11/1993 | Antonuk et al. |
| 5,420,452 A | 5/1995 | Tran et al. |
| 5,440,149 A | 8/1995 | Shimizu et al. |
| 6,288,388 B1 | 9/2001 | Zhang et al. |
| 6,538,591 B2 | 3/2003 | Sato et al. |
| 6,730,914 B2 | 5/2004 | Chao et al. |
| 7,042,980 B2 | 5/2006 | Endo |
| 7,279,353 B2 | 10/2007 | Rhodes |

OTHER PUBLICATIONS

Richard L. Weisfield, et al., "High-Performance Amorphous Silicon Image Sensor for X-Ray Diagnostic Medical Imaging Applications", SPIE—The International Society for Optical Engineering, vol. 3659, pp. 307-317 (1999).

(Continued)

*Primary Examiner* — Mark R Gaworecki
(74) *Attorney, Agent, or Firm* — Oblon, Spivak, McClelland, Maier & Neustadt, L.L.P.

(57) ABSTRACT

A radiation sensor including a scintillation layer configured to emit photons upon interaction with ionizing radiation and a photodetector including in order a first electrode, a photosensitive layer, and a photon-transmissive second electrode disposed in proximity to the scintillation layer. The photosensitive layer is configured to generate electron-hole pairs upon interaction with a part of the photons. The radiation sensor includes pixel circuitry electrically connected to the first electrode and configured to measure an imaging signal indicative of the electron-hole pairs generated in the photosensitive layer and a planarization layer disposed on the pixel circuitry between the first electrode and the pixel circuitry such that the first electrode is above a plane including the pixel circuitry. A surface of at least one of the first electrode and the second electrode at least partially overlaps the pixel circuitry and has a surface inflection above features of the pixel circuitry. The surface inflection has a radius of curvature greater than one half micron.

58 Claims, 38 Drawing Sheets

OTHER PUBLICATIONS

Kunio Doi, Ph.D. et al, "Digital Radiographic Imaging System With Multiple-Slit Scanning X-Ray Beam: Preliminary Report[1]", Radiology, Nov. 1986, vol. 161, No. 2, pp. 513-518.

Toshio Kameshima, et al. "Novel Large Area Mis-Type X-Ray Image Sensor for Digital Radiography", Part of the SPIE Conference on Physics of Medical Imaging, San Diego, California, Feb. 1998, SPIE vol. 3336, pp. 453-462.

Timothy J. Tredwell, et al. "Imaging Arrays for Medical Applications", RIT Quantum Limited Detector Workshop, Mar. 2009, pp. 1-107.

Richard L. Weisfield, et al., "Performance Analysis of a 127-Micron Pixel Large-Area TFT/Photodiode Array With Boosted Fill Factor", Medical Imaging 2004: Physics of Medial Imaging, Proceedings of SPIE vol. 5368, pp. 338-348.

Written Opinion mailed Aug. 31, 2010, International Application No. PCT/US2010/038777, International Filing Date Jun. 16, 2010, Priority Date Jun. 17, 2009, pp. 1-14.

Youcef El-Mohri, et al. "Active Pixel Imagers Incorporating Pixel-Level Amplifiers Based on Polycrystalline-Silicon Thin-Film Transistors", Med. Phys. 36 (7), Jul. 2009, pp. 3340-3355.

Hong Du, et al. "Signal Behavior of Polycrystalline $HGI_2$ at Diagnostic Energies of Prototype, Direct Detection, Active Matrix, Flat-Panel Imagers", Phys. Med. Biol. 53, Published Feb. 14, 2008, pp. 1325-1351.

Larry E. Antonuk, et al. "An Investigation of Signal Performance Enhancements Achieved Through Innovative Pixel Design Across Several Generations of Indirect Detection, Active Matrix. Flat-Panel Arrays", Med. Phys. 36 (7), Jul. 2009, pp. 3322-3339.

PHOTODIODE AND OTHER SENSOR STRUCTURES IN FLAT-PANEL X-RAY IMAGERS AND METHOD FOR IMPROVING TOPOLOGICAL UNIFORMITY OF THE PHOTODIODE AND OTHER SENSOR STRUCTURES IN FLAT-PANEL X-RAY IMAGERS BASED ON THIN-FILM ELECTRONICS

CROSS REFERENCE TO RELATED APPLICATIONS

This application is related to and claims priority under 35 U.S.C. 119(e) to U.S. provisional patent application 61/213,530, filed Jun. 17, 2009, entitled "PHOTODIODE AND OTHER SENSOR STRUCTURES IN FLAT-PANEL X-RAY IMAGERS AND METHOD FOR IMPROVING TOPOLOGICAL UNIFORMITY OF THE PHOTODIODE AND OTHER SENSOR STRUCTURES IN FLAT-PANEL X-RAY IMAGERS BASED ON THIN-FILM ELECTRONICS," the entire disclosures of which are hereby incorporated by reference.

STATEMENT REGARDING FEDERALLY SPONSORED RESEARCH OR DEVELOPMENT

This invention was made with government support under EB000558 awarded by the National Institutes of Health. The government has certain rights in the invention.

BACKGROUND OF THE INVENTION

1. Field of the Invention

The present invention pertains generally to devices designed to detect incident ionizing radiation in order to form images.

2. Discussion of the Background

In the field of x-ray imaging, imagers based on active matrix imaging arrays are commonly used for numerous medical and non-medical applications. Unless otherwise indicated herein, the term active matrix will be used to refer to the principle of addressing a two-dimensional grid of imaging pixels by way of switches, with an addressing switch in each pixel. Imagers based on active matrix imaging arrays will be referred to as active matrix flat-panel imagers (AMFPIs) or, more concisely, as active matrix imagers. In addition, the terms active matrix array and active matrix imaging array will be used interchangeably.

An AMFPI typically incorporates a single array, including materials that are highly resistant to the effects of ionizing radiation. However, AMFPIs sometimes include two adjacent arrays arranged side-by-side, or four adjacent arrays arranged in a square or rectangle. One reason for the ubiquity and usefulness of active matrix imagers is that the arrays can be manufactured, with acceptable yield and at reasonable cost, at sizes considerably beyond what is possible with conventional crystalline silicon (c-Si) technology. In the case of c-Si technology, pixilated imaging arrays (such as charge coupled devices (CCDs), CMOS sensors, active pixel sensors, and passive pixel sensors) are ultimately limited by the size of the silicon wafers used for fabrication, currently up to ~300 mm. CCDs, CMOS sensors and active and passive pixel sensors made from crystalline silicon are typically fabricated with dimensions of less than ~4 cm by 4 cm. While such devices have been made with dimensions as large as ~20 cm by 20 cm, these devices are hard to yield and costly to produce. Also, while large area devices can be made by tiling small area c-Si arrays, this introduces additional, significant engineering problems, challenges, and costs. In the case of AMFPIs, while active matrix arrays can be made as small as two pixels by two pixels (which would be smaller than 1 cm by 1 cm), active matrix arrays for AMFPIs are typically fabricated in sizes ranging from ~10 cm by 10 cm up to ~43 cm×43 cm—greatly exceeding the range of pixilated, c-Si imaging arrays. Moreover, there is no technical reason that prohibits the creation of even larger active matrix imaging arrays—for example, equivalent to the size of the largest active matrix liquid crystal displays (AMLCDs) which have been fabricated as large as ~108 inches on the diagonal.

In an active matrix imaging array, a two-dimensional grid of imaging pixels is addressed by way of thin-film switches. The array includes a thin substrate on which the imaging pixels are fabricated. Each pixel incorporates a circuit in which an addressing switch is connected to some form of pixel storage capacitor. Each switch usually takes the form of thin-film transistor (TFT), but can also take the form of a thin-film diode or a combination of two or more thin-film diodes. While simple array designs incorporate only a single switch per pixel for purposes of addressing, more complex designs can include additional circuit elements in the pixel that serve to improve the performance and/or extend imager capabilities. Moreover, further circuit elements can be incorporated on the array substrate outside of the pixels. These elements can be configured to carry out such functions as controlling the voltages on the gate address lines, multiplexing signals from the data lines, or for other purposes related to the operation of the array.

Materials used in the fabrication of the arrays include various metals to form features such as address lines, contacts to address lines, traces, vias, electrode surfaces and light blocking surfaces, as well as the source, drain and gate of TFTs. Metals such as aluminum, copper, chromium, molybdenum, tantalum, titanium, tungsten, indium tin oxide and gold, as well as alloys of these materials, such as TiW, MoCr and AlCu, can be used. The thickness of a given metal layer deposited onto the array during fabrication can range from ~10 nm to several µm. Passivation layers can include materials such as silicon oxynitride ($Si_2N_2O$), silicon nitride ($Si_3N_4$), polyimide, and Benzocyclobutene polymer (BCB). The thickness of a given passivation layer deposited onto the array surface during fabrication can range from ~100 nm up to 10 µm. Dielectrics in devices such as TFTs and capacitors can include materials such as silicon nitride ($Si_3N_4$), silicon dioxide ($SiO_2$), amorphous silicon, and amorphous silicon nitride ($a-Si_3N_4:H$). The thickness of a given dielectric layer deposited onto the array surface during fabrication can range from ~1 nm to several µm. Typically, multiple metal, passivation and dielectric layers are used to fabricate the various circuit elements in an array.

The semiconductor material for the TFTs (and diode switches) is most commonly hydrogenated amorphous silicon (a-Si), but can also be microcrystalline silicon, polycrystalline silicon (poly-Si), a chalcogenide, or cadmium selenide (CdSe), all of which are suited to large area processing, allowing the manufacture of large area arrays. In this case, the substrates can be made of materials such as glass (such as Corning 7059, 1737F, 1737G, ~1 mm thick) or quartz (~1 mm thick) or sheets of stainless steel (~25 to 500 µm thick). The fabrication of array circuits involves deposition of continuous layers of materials (such as semiconductors, metals, dielectrics and passivations) on the substrate, using area deposition techniques such as plasma enhanced chemical vapor deposition (PECVD), low-pressure chemical vapor deposition (LPCVD), chemical vapor deposition (CVD), physical vapor deposition (PVD), sputtering, and spin coating. In the case of poly-Si, one common method for producing this semiconductor is through crystallization of previously deposited a-Si material by means of an excimer laser. In addition, the features of the circuit (such as those of the TFTs, diodes, photodiodes, capacitors, traces, vias, address lines, and contacts to the address lines) are formed using a combination of photolithographic and etching techniques.

Alternatively, the semiconductor material for these switches can take the form of other materials suitable for large area deposition such as low-temperature a-Si, organic small molecule or polymer semiconductors. Low temperature a-Si is deposited using PECVD, LPCVD and PVD while organic small molecule and polymer semiconductors can be deposited using area deposition techniques or printing techniques. For these semiconductor materials, the substrates can be thin and flexible (made of sheets of material such as polyimide (PI) or polyethylene napthalate (PEM, ~25 to 200 µm thick). Alternatively, glass, quartz or stainless steel substrates can be used. The features of the arrays circuits can be formed using one, or a combination of photolithographic, etching, subtractive printing and additive printing techniques. Yet other semiconductor materials that can be used, both for TFTs and other devices, include carbon nanotubes and graphene. Yet other semiconductor materials that can be used, both for TFTs and other devices, include oxide semiconductors including, but not limited to ZnO, InGaZnO, InZnO, ZnSnO (and any other oxides containing Zn), $SnO_2$, $TiO_2$, $Ga_2O_3$, InGaO, $In_2O_3$, and InSnO. These oxide semiconductors are known to exist in amorphous or polycrystalline forms, and as available are suitable for the invention. For all types of semiconductors, the materials are used in their intrinsic form, as well as in doped forms to provide p-doped or n-doped semiconductor material.

TFTs have a gate, a source and a drain. The magnitude of the current flowing through the semiconductor channel of the TFT, between the source and the drain, is controlled by a variety of factors such as the width and length of the TFT channel, the mobility of the semiconductor used in the channel, the magnitude and polarity of the voltage applied between the gate and the source, and the voltage difference between the source and drain. Manipulation of the voltage applied to the gate allows the transistor to be made highly conducting (described as being "on") or highly non-conducting (described as being "off").

FIGS. 1 to 4 show examples of a-Si and poly-Si TFTs. FIG. 1 is a schematic drawing illustrating the structure of one form of an a-Si TFT. FIG. 2 is a schematic, cross sectional view, corresponding to the position of the plane indicated by the wire frame in FIG. 1. The symmetry of the structure of this a-Si TFT is such that this cross sectional view would remain largely unchanged for any position of the wire frame along the width of transistor. FIG. 3 is a schematic drawing illustrating the structure of one form of a poly-Si TFT. The version shown has a single gate but two or more gates are also possible. FIG. 4 is a schematic, cross sectional view corresponding to the position of the plane indicated by the wire frame in FIG. 3. Compared to the a-Si TFT illustrated in FIGS. 1 and 2, the poly-Si TFT illustrated in FIGS. 3 and 4 has a lower degree of symmetry by virtue of the presence of the vias, so that a cross sectional view of the transistor would vary considerably for other positions of the wire frame along the width of the transistor.

An active matrix imager typically includes: (a) an active matrix imaging array; (b) a layer of material overlying the array which serves as an x-ray converter; (c) external electronics connected to the array by way of contact pads located at the ends of the data and gate address lines. Some of these electronics are located in close proximity to the perimeter of the array and provide digital logic that serves to assist in the control of the voltages and timings necessary to operate the array, as well as to amplify, multiplex, and digitize the analog signals extracted from the pixels along the data address lines. These electronics also include voltage supplies required to operate the array and the peripheral electronics, as well as a digital electronic interface to allow communication between the electronics and one or more computers; (d) one or more computers to send control information to the electronics, to receive digital pixel information from the electronics, to synchronize the operation of the array with the delivery of radiation from the x-ray source, and to process, display and store this imaging information; and (e) the software, firmware and other coded instructions used in the computers and in the digital logic of the electronics.

The array substrate, thin-film electronics and x-ray converter are all relatively thin, with a combined thickness of less than 1 cm. This allows these elements, along with peripheral electronics, to be configured into a package having a thickness as compact as ~1 cm, similar to that of a standard x-ray film cassette or computed radiography (CR) cassette. Electronic x-ray imagers with such profiles, irrespective of the technology upon which the imagers are based, are often called flat-panel imagers (FPIs). In order to distinguish from flat-panel imagers created from other technologies (such as tiled CMOS sensors), a descriptive term that pertains broadly to imagers based on thin-film electronics is thin-film flat panel imagers. In the specific case of imagers employing active matrix arrays, the term active matrix flat-panel imagers (AMFPIs) is appropriate.

The pixels for an active matrix imaging array are arranged in rows and columns. For an array using TFT switches, and for a given row of pixels, the gates of all of the addressing TFTs along that row are connected to a common gate address line, with one gate line per pixel row. External manipulation of the voltage applied to each gate address line therefore allows control of the conductivity of all the addressing TFTs along that row. For a given column of pixels, the drains of all of the addressing TFTs along that column are connected to a common data address line, with one data address line per pixel column.

During operation of an AMFPI, all the addressing TFTs are kept non-conducting during delivery of the x-rays in order to allow collection of imaging signals in the pixel storage capacitors. The imaging signals stored in these capacitors are read out, typically one row of pixels at a time, by making the addressing TFTs in that row conducting. This allows the imaging signals to be sampled from the corresponding data address lines at the full spatial resolution of the array. For a given data address line, each sampled signal is amplified by a preamplifier and digitized by an analog-to-digital converter, both located external to the array. Of course, the imaging signals can be sampled from two or more consecutive rows at a time, which decreases the read-out time, but at the cost of reduced spatial resolution.

Active matrix imagers are most commonly operated in conjunction with an x-ray source, although they can be operated with sources of other forms of ionizing radiation such as gamma rays, electrons, protons, neutrons, alpha particles, and heavy ions. The pixel pitch (which is equal to the width of one pixel) and size of the array, the frame rate capabilities of the array and imager, and the beam energy, filtration and temporal characteristics of the x-ray source are all chosen to match the needs of the imaging application. Diagnostic and interventional medical imaging can be performed with arrays having pixel pitches of ~25 µm up to ~200 µm and with ~15 to 40 kVp x-ray beams for many forms of breast imaging applications (including mammography, breast tomosynthesis, breast computed tomography, and image-guided biopsies). Diagnostic and interventional medical imaging can also be performed with arrays having pixel pitches of ~75 μm up to ~1000 μm and with ~50 to 150 kVp x-ray beams for many forms of radiographic, fluoroscopic, and tomographic applications (including chest imaging, chest tomosynthesis, dual-energy imaging, angiographic procedures, interventional procedures, biopsy procedures, imaging of extremities, pediatric imaging, cardiac imaging, cone beam computed tomography of abdomen, chest, head, neck, teeth, as well as for simulation, localization, verification and quality assurance in radiation therapy). In addition, medical imaging can be performed with pixel pitches of ~300 μm up to ~1000 μm with the treatment beams used for external beam radiation therapy. In this case, the radiation source can be a Co-60 source (with an average energy of ~1.25 MeV), or the output from a linear accelerator or any other type of accelerator that produces megavoltage radiation ranging from ~3 up to 50 MV. Medical imaging using active matrix imagers can also be performed with a brachytherapy source, such as cesium-137 ($^{137}$Cs), iodine-125 ($^{125}$I), iridium-192 ($^{192}$Ir), palladium-103 ($^{103}$Pd), strontium-90 ($^{90}$Sr) and yttrium-90 ($^{90}$Y). In addition, non-medical applications (such as industrial radiography) use active matrix imagers in conjunction with all of the radiation sources described above, as well as with sources providing x-ray energies ranging from a few kVp up to ~15 kVp. The design and capabilities of the x-ray converters and of the associated electronics for flat panel imagers are matched to the design of the arrays, the manner of operation, and the needs of the various non-medical applications.

Imagers based on active matrix arrays may be generally divided into two categories, based upon the manner in which x-rays are detected by the converter, referred to as indirect detection and direct detection. For indirect detection imagers, some of the energy of incident x-rays that interact with the converter is first converted into optical photons and a fraction of these photons are subsequently converted into electrical signal that is stored in the pixel storage capacitors of the array. For direct detection imagers, some of the energy of the incident x-rays that interact with the converter is directly converted into electrical signal that is stored in the pixel storage capacitors.

For indirect detection imagers, the converter takes the form of a scintillator. For many applications, cesium iodide doped with thallium (written as CsI:Tl or CsI:Te), typically grown so as to form a structure with aligned, needle-like crystals) or gadolinium oxysulfide doped with terbium (written as $Gd_2O_2S:Tb$ or $Gd_2O_2S:Tb^{3+}$, also called GOS, typically in the form of a powder phosphor screen) is used. However, other scintillators are also possible such as cesium iodide doped with sodium (written as CsI:Na or CsI:Na$^+$), sodium iodide doped with thallium (written as NaI:Tl or NaI:Tl$^+$), calcium tungstate ($CaWO_4$), zinc tungstate ($ZnWO_4$), cadmium tungstate ($CdWO_4$), bismuth germanate ($Bi_4Ge_3O_{12}$, also called BGO), lutetium yttrium orthosilicate doped with cerium (written as $Lu_{1.8}Yb_{0.2}SiO_5:Ce$ or $Lu_{1.8}Yb_{0.2}SiO_5:Ce^{3+}$, also known as LYSO), and gadolinium silicate doped with cerium (written as $Gd_2SiO_5:Ce$ or $Gd_2SiO_5:Ce^{3+}$, also known as GSO). Yet other scintillators are possible such as $BaFCl:Eu^{2+}$, $BaSO_4:Eu^{2+}$, $BaFBr:Eu^{2+}$, $LaOBr:Tb^{3+}$, $LaOBr:Tm^{3+}$, $La_2O_2S:Tb^+$, $Y_2O_2S:Tb^{3+}$, $YTaO_4$, $YTaO_4:Nb$, ZnS:Ag, (Zn,Cd)S:Ag, $ZnSiO_4:Mn^{2+}$, CsI, $LiI:Eu^{2+}$, $PbWO_4$, $Bi_4Si_3O_{12}$, $Lu_2SiO_5:Ce^{3+}$, $YAlO_3:Ce^{3+}$, CsF, $CaF_2:Eu^{2+}$, $BaF_2$, $CeF_3$, $Y_{1.34}Gd_{0.6}O_3:Eu^{3+}$, Pr, $Gd_2O_2S:Pr^{3+}$, Ce, SCGl, HFG:Ce$^{3+}$ (5%) and $C_{14}H_{10}$. For many types of scintillator material (such as CsI:Tl, BGO and LYSO), the converter can take the form of a segmented detector in which small individual elements of scintillator material, each with a cross sectional area approximately equal to, or smaller than the pixel pitch of the imaging array (or a multiple of the pixel pitch of the array), are assembled with septal wall material separating the elements to form an area detector that provides optical isolation between elements, thereby preserving spatial resolution.

A layer of material, referred to as encapsulation or as an encapsulation layer, may be deposited to form a top layer of the scintillor in order to mechanically and chemically protect the scintillator.

For indirect detection AMFPIs, the pixel storage capacitor takes the form of an optical sensor, such as a photodiode or a metal insulated semiconductor (MIS) structure. Such optical sensors commonly incorporate a-Si semiconductor—a material that is well suited for imaging of ionizing radiation by virtue of the fact that the signal, noise and dark current properties of a-Si sensors are only very weakly affected by even extremely high doses of radiation. The properties of TFTs based on a-Si and poly-Si are also only weakly affected by extremely high doses of radiation, making such TFTs well suited for imaging of ionizing radiation.

One form for the structure of an a-Si photodiode includes a bottom electrode (which is connected to the source of the addressing TFT), a doped layer (n$^+$ doped a-Si, ~10 to 500 nm thick and preferably ~50 to 100 nm thick), a layer of intrinsic a-Si (preferably ~0.5 to 2.0 μm thick), a second doped layer (p$^+$ doped a-Si, ~10 to 500 nm thick and preferably ~5 to 20 nm thick), and a top electrode which is made of a material transparent to visible light (such as indium tin oxide, ITO). In one alternative form of such an a-Si photodiode structure, the dopings of the upper and lower a-Si layers are interchanged. Minimizing the thickness of the top doped a-Si layer reduces the fraction of optical photons that are absorbed in this layer, helping to maximize the imaging signal recorded in the pixel.

An example of a pixel circuit for an indirect detection, active matrix imaging array is schematically illustrated in FIG. 5. The circuit elements depicted in this figure include the photodiode (PD) and the pixel addressing transistor (TFT). The source, drain and gate of the TFT, surrounded by a dashed ellipse, are labelled. A second dashed ellipse emphasizes that the photodiode, which is the optical sensor for the pixel, also serves as the pixel storage capacitor, with a capacitance of $C_{PD}$. The gate address line and data address line corresponding to the row and column, respectively, of the depicted pixel are also shown. The magnitude of the reverse bias voltage applied to the top electrode of the photodiode is $V_{BIAS}$. This voltage is provided by an external voltage supply. $V_{BIAS}$ is typically set to a value in the range of ~1 V to 8 V.

FIG. 6 is a schematic, cross-sectional illustration of one structural implementation, referred to as the baseline architecture, of a pixel design corresponding to the pixel circuit in FIG. 5. In this implementation, the addressing TFT shares the surface area of the pixel with a number of other elements including a discrete a-Si photodiode having a stacked structure, address lines, and the gaps between the address lines, photodiode and TFT.

In FIG. 6, the general location of the a-Si addressing transistor (TFT), with only the drain, source and gate illustrated, is indicated by a dashed ellipse. The bottom electrode of the photodiode is formed by an extension of the metal used to form the source of the TFT. The remaining layers of the photodiode, which do not overlap with the TFT, are patterned so as to be aligned with the edges of the bottom electrode and in this way form a stacked structure. These layers include a layer of n+ doped a-Si, a layer of intrinsic a-Si, a layer of p+ doped a-Si, and a layer of ITO serving as an optically transparent top electrode. A reverse bias voltage, of magnitude $V_{BIAS}$, is applied to the top electrode of the photodiode by way of a bias line, creating an electric field, $\vec{E}$, across the photodiode. The direction of the data address line, which is connected to the drain of the TFT by way of a metal via, and of the bias line, is orthogonal to the plane of the drawing. The approximate location of passivation material is schematically indicated by shading. This includes passivation material that is deposited over the entire top surface of the array in order to encapsulate the array, protecting the array mechanically and preventing unintended electrical contact with the bias and data address lines. An x-ray converter in the form of a scintillator, which extends over the entire array, is also depicted. Incident x-rays (wavy arrows) generate optical photons (straight, faint arrows) in the scintillator. Some of the optical photons enter the intrinsic layer of the photodiode creating electrons and holes which drift toward the electrodes by virtue of the electric field, thereby creating imaging signal that is stored in, and eventually read out from, the pixel.

For direct detection, active matrix, flat-panel imagers, the converter can take the form of a layer of photoconductive material, with a thickness sufficient to stop a large fraction of the incident x-rays. One suitable photoconductive material is amorphous selenium, a-Se, which can be fabricated up to ~2000 μm thick, and is preferably fabricated with thicknesses ranging from ~200 to 1000 μm. Other photoconductive materials that are suitable as direct detection converters include single crystal and polycrystalline forms of lead iodide ($PbI_2$), mercuric iodide ($HgI_2$), lead oxide (PbO), cadmium zinc telluride (CdZnTe), cadmium telluride (CdTe), $Bi_2S_3$, $Bi_2Se_3$, $BiI_3$, $BiBr_3$, CdS, CdSe, HgS, $Cd_2P_3$, InAs, InP, $In_2S_3$, $In_2Se_3$, $Ag_2S$, $PbI_4^{-2}$ and $Pb_2I_7^{-3}$. The choice of thickness for the photoconductor increases with increasing x-ray energy, so as to achieve conversion of a reasonably large fraction of the x-rays, which can be anywhere from ~10% to 90% at diagnostic energies and from ~1% to 10% at radiotherapy energies.

In the case of imaging using megavoltage radiation, for example for external beam radiation therapy imaging or for industrial radiography, including scanning for security applications, a thin (~1 mm) metal plate is typically positioned over the converter (directly on the scintillator, for indirect detection, or directly on the encapsulation over the top electrode covering the photoconductor for direct detection). The composition of this plate can take many forms including copper, steel, tungsten and lead. An example of a pixel circuit for a direct detection, active matrix imaging array is schematically illustrated in FIG. 7. The circuit elements depicted in this figure include the photoconductor (PC), the pixel addressing transistor (TFT), and (as indicated by a dashed ellipse) a pixel storage capacitor with capacitance $C_{STORAGE}$. The source, drain and gate of the TFT, surrounded by another dashed ellipse, are labelled. A third dashed ellipse emphasizes that the photoconductor has capacitance $C_{PC}$ and also acts like a large resistor, of resistance $R_{PC}$, in the circuit. The gate address line and data address line corresponding to the row and column of the depicted pixel are also shown. The magnitude of the bias voltage applied to the top electrode of the photoconductor is $V_{BIAS}$. This voltage is provided by an external voltage supply. The value of $V_{BIAS}$ used depends upon the type of photoconductor material and generally increases in proportion to the layer thickness of that material. For a-Se, $V_{BIAS}$ is typically ~10 V per micron of thickness. Thus, for a 1000 μm layer of a-Se, $V_{BIAS}$ will be ~10,000 V.

For $HgI_2$, $V_{BIAS}$ is typically in the range of ~0.5 to 2.0 V per micron. Thus, for a 500 μm layer of $HgI_2$, $V_{BIAS}$ will be ~250 to 1,000 V. The photoconductive layer can also be operated in avalanche mode, with the value of $V_{BIAS}$ across that layer typically higher—in the range of ~50 V to 100 V per micron for the example of a-Se. In this case, the avalanche layer may be made sufficiently thick to stop a large fraction of x-rays itself, or it may be made thin, with a layer of photoconductor or scintillator (such as a-Se or CsI:Tl, respectively, of sufficient thickness to stop a large fraction of the incident x-rays) deposited over it. In this case, the purpose of the avalanche layer is to amplify the signal from the overlying converter.

FIG. 8 is a schematic, cross sectional illustration of one structural implementation of a pixel design corresponding to the pixel circuit in FIG. 7. In this implementation, the addressing TFT shares the surface area of the pixel with the pixel storage capacitor, with the address lines, and with gaps between the address lines, storage capacitor and TFT. The photoconductor structure (including a bottom electrode, a layer of photoconductive material, and a top electrode) resides above the plane (i.e., above the level) of the addressing TFT.

In FIG. 8, the general location of the a-Si addressing transistor (TFT), with only the drain, source and gate illustrated, is indicated by a dashed ellipse. For the pixel storage capacitor, the location of which is indicated by a second dashed ellipse, only the top and bottom electrodes are illustrated. The top electrode of the pixel storage capacitor is formed by a back contact, which is an extension of the metal used to form the source of the TFT. The bottom electrode for the photoconductor is connected to the TFT by way of a via (indicated by a third ellipse) to the back contact, and does not extend over the TFT. A thick, continuous layer of photoconductor material (which acts as an x-ray converter) is deposited across the entire array, putting that material in contact with the bottom electrode. A continuous top electrode is deposited over the entire photoconductor surface. A bias voltage, of magnitude $V_{BIAS}$, is applied to the top electrode so as to establish an electric field across the photoconductor. A layer of material, referred to as encapsulation or as an encapsulation layer, is deposited over the entire top electrode in order to encapsulate the array, protecting the array mechanically and chemically, and preventing unintended electrical contact with the top electrode. The direction of the data address line, which is connected to the drain of the TFT by way of a metal via, is orthogonal to the plane of the drawing. The location of passivation material is approximately indicated by shading. Note that in alternate configurations of direct detection pixels and arrays, a thin layer of material (typically ~1 to 10 microns thick, acting as a barrier, dielectric or doped layer) may be deposited between the bottom electrode and the photoconductor, or between the top electrode and the photoconductor. Alternatively, such a thin layer of material may be deposited in both locations, and may be different in type and thickness in each location.

For indirect detection active matrix imaging arrays having the baseline architecture illustrated in FIG. 6, the addressing TFT and the photodiode are in direct competition with each other, and with other pixel elements, for area in the pixel. This is apparent in FIG. 6 as well as in a corresponding schematic rendering of four pixels appearing in FIG. 9. It is further apparent in FIG. 10 in which photomicrographs of pixels obtained from a pair of indirect detection active matrix arrays are shown. Generally, indirect detection active matrix arrays are designed so as to make the area of the photodiode as large as possible. In addition, for array designs in which the bias line extends over the top surface of the photodiode, the area of these lines and of associated vias (both of which are optically opaque and block light from reaching the photodiode) are made as small as possible. For a given array design, the fraction of the pixel area that is occupied by photodiode surface that is open to incident light from above is referred to as the optical fill factor.

Maximization of optical fill factor is motivated by the fact that more efficient use of the incident light from the overlying scintillator increases pixel signal size, and thus the signal-to-noise ratio of the imager, leading to improved image quality. Maximizing optical fill factor is particularly important for array designs that serve applications requiring small pixel pitches (for example, under ~100 μm), or applications in which the imager is operated at low exposures (such as the low exposure region of fluoroscopy, where the exposure per frame is less than ~1 μR).

A high optical fill factor encourages minimization of the size of the addressing TFT, the widths of the address lines, the width of the bias line, and the gaps between the photodiode, the TFT and the address lines. However, the fabrication process imposes a minimum feature size on every element of the design. Furthermore, the address and bias lines must be sufficiently wide to limit the electrical resistance along these lines (since high resistance would negatively affect the temporal and/or electrical operation of the array, as well as possibly decrease signal-to-noise performance). In addition, the gaps must not be so narrow as to lead to unintended contact (and thus electrical shorting) between pixel elements or to high levels of parasitic capacitance (which can degrade the signal-to-noise ratio and the temporal performance). Finally, the ratio of the width to length of the TFT channel (called the aspect ratio) must be sufficiently large so as to provide the magnitude of TFT-on current required for the desired array readout speed (since TFTs with higher aspect ratios provide higher levels of current in their conducting mode). FIG. 10 illustrates a practical example of these considerations in which the optical fill factor of an early array design, shown in FIG. 10(*a*), has been significantly increased in a later design, shown in FIG. 10(*b*), through decreases in the sizes of gaps, address lines and the TFT, assisted by a decrease in the minimum feature size. The challenge of maintaining a large optical fill factor becomes more difficult as pixel pitch decreases, since the area occupied by the address lines, gaps, and addressing TFT consumes an ever-greater fraction of the pixel area.

A highly effective method to circumvent the aforementioned restrictions on optical fill factor is to implement pixel architectures in which the photodiode structure is positioned above the plane (i.e., above the level) of the addressing TFT. A variety of such out-of-plane architectures are possible, and two such architectures are shown in FIGS. 11 and 12. In these illustrations, the out-of-plane photodiode structure overlaps a portion, or all, of the addressing TFT, in order to maximize optical fill factor.

The photodiode in FIG. 11 includes a discrete, stacked structure aligned with the bottom electrode. As in FIG. 6, a single addressing TFT is connected to a discrete a-Si photodiode with three a-Si layers and with top and bottom electrodes. However, in this pixel architecture, the bottom electrode of the photodiode is located above the plane of the addressing TFT. The bottom electrode is connected to the TFT by way of a via (the location of which is indicated by a dashed ellipse) to the back contact, which is an extension of the metal used to form the source of the TFT. The a-Si layers and the top electrode of the photodiode are patterned to form a stack aligned with the bottom electrode. The direction of both the data address line (the location of which is indicated by the solid ellipse), and the bias line is orthogonal to the plane of the drawing.

The photodiode in FIG. 12 has a structure in which some of the layers are continuous. As in FIG. 11, a single addressing TFT is connected to an a-Si photodiode located above the plane of the TFT. However, in this pixel architecture, the p$^+$ doped and intrinsic layers are not patterned, but rather are continuous across the array to assist in maximizing the optical fill factor. The doped a-Si layer is patterned to align with the bottom electrode of the photodiode to inhibit charge sharing between neighboring pixels. The bottom electrode is connected to the TFT by way of a via (the location of which is indicated by a dashed ellipse) to the back contact, which is an extension of the metal used to form the source of the TFT. The direction of the data address line (the location of which is indicated by the solid ellipse) is orthogonal to the plane of the drawing.

FIGS. 13 and 14 correspond to an actual realization of an indirect detection active matrix array design having the pixel architecture portrayed in FIG. 12. FIG. 13 is a schematic rendering of four pixels while FIG. 14 is a photomicrograph of a pixel from an array.

SUMMARY OF THE INVENTION

In one embodiment of the present invention, there is provided a radiation sensor including a scintillation layer configured to emit photons upon interaction with ionizing radiation and a photodetector including in order a first electrode, a photosensitive layer, and a photon-transmissive second electrode disposed in proximity to the scintillation layer. The photosensitive layer is configured to generate electron-hole pairs upon interaction with a part of the photons. The radiation sensor includes pixel circuitry electrically connected to the first electrode and configured to measure an imaging signal indicative of the electron-hole pairs generated in the photosensitive layer and a planarization layer disposed on the pixel circuitry between the first electrode and the pixel circuitry such that the first electrode is above a plane including the pixel circuitry. A surface of at least one of the first electrode and the second electrode at least partially overlaps the pixel circuitry and has a surface inflection above features of the pixel circuitry. The surface inflection has a radius of curvature greater than one half micron.

In another embodiment of the present invention, there is provided a radiation sensor including a photoconductor detector including in order a first electrode, a photoconductive layer, and an ionizing radiation transmissive second electrode. The photoconductive layer is configured to generate electron-hole pairs upon interaction with ionizing radiation. The radiation sensor includes pixel circuitry electrically connected to the first electrode and configured to measure an imaging signal indicative of the electron-hole pairs generated in the photoconductive layer and a planarization layer disposed on the pixel circuitry between the first electrode and the pixel circuitry such that the first electrode is above a plane including the pixel circuitry. A surface of at least one of the first electrode and the second electrode at least partially overlaps the pixel circuitry and has a surface inflection above features of the pixel circuitry. The surface inflection has a radius of curvature greater than one half micron.

In yet another embodiment of the present invention, there is provided a method for fabricating a radiation sensor. The method includes forming pixel circuitry elements on a base substrate, forming a planarization layer over the pixel circuitry elements, forming a hole in the planarization layer to expose a connection to the pixel circuitry elements, metallizing the patterned hole, forming a first electrode in electrical contact to the metallized hole, and forming on the first electrode a layer sensitive to light or ionizing radiation. Forming the planarization layer provides, on a surface of the first electrode at least partially overlapping the pixel circuitry, a surface inflection, above features of the pixel circuitry, having a radius of curvature greater than one half micron.

It is to be understood that both the foregoing general description of the invention and the following detailed description are exemplary, but are not restrictive of the invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 22($b$) corresponds to a portion of FIG. 22($a$);

FIG. 23($b$) is a photomicrograph, obtained from FIG. 17, shown for purposes of comparison with the calculated top view in FIG. 23($a$);

FIG. 24($b$) is a photomicrograph, obtained from FIG. 20, shown for purposes of comparison with the calculated top view in FIG. 24($a$);

FIG. 26($b$) is a calculated cross sectional view of an indirect detection array, corresponding to FIG. 21, but with a more uniform topology achieved through partial planarization of passivation #2;

FIG. 27($b$) corresponds to a portion of FIG. 27($a$);

DETAILED DESCRIPTION OF THE EMBODIMENTS

The incorporation of out-of-plane photodiode structures into the pixel design of indirect detection active matrix arrays provides a mechanism for significantly improving optical fill factor. In the case of the implementation of continuous photodiode structures, optical fill factors as large as unity, corresponding to the entire area of the pixel, are possible. Such optical fill factor improvements result from eliminating the competition for pixel area between the photodiode and other pixel elements such as the addressing TFT, address lines and gaps.

Out-of-plane photodiode structures also make it possible to introduce additional elements to the pixels (such as TFTs, diodes, capacitors and resistors, as well as vias, traces, control lines, address lines and ground planes), thereby making more complex pixel circuits possible. As in the case of active matrix arrays, these additional elements would reside in a separate plane from that of the photodiode and therefore would not compete with the photodiode for pixel area. Through introduction of more complex circuits, both in the pixel design and elsewhere in the array design, considerable improvements in performance can be achieved compared to that of active matrix flat panel imaging arrays in which each pixel has only a single TFT (acting as the pixel addressing switch). While the type of semiconductor material used for these additional TFTs and diodes can be any of those described above, the examples of more complex circuits described below involve poly-Si TFTs. In addition, while the following examples pertain to indirect detection array designs in which the imaging signal is collected and stored in a pixel storage capacitor prior to readout, out-of-plane photodiode structures also make it possible to create pixel circuits that allow the detection and counting of individual x-rays, a capability commonly referred to as single photon counting, without these circuits competing for area with the photodiode. Such single photon counting pixels would include a detector (such as an out-of-plane photodiode structure) as well as circuits for an amplifier, a discriminator (optionally with a pulse-shaping circuit), and an event counter (e.g., in the form of a linear feed-back shift register), as well as for addressing and pixel reset. Single photon counting arrays offer many advantages such as the ability to create high contrast images based on a selected portion of the x-ray spectrum, a technique referred to as energy discrimination or energy windowing.

Increased complexity can improve the signal-to-noise ratio of the imager, both for array designs based on indirect detection as well as direct detection of the incident radiation. In the case of indirect detection, greater complexity can also help to limit undesirable effects associated with trapping and release of charge in the metastable electronic states (also called the trapping states) of the a-Si in the photodiodes.

Figure 5:
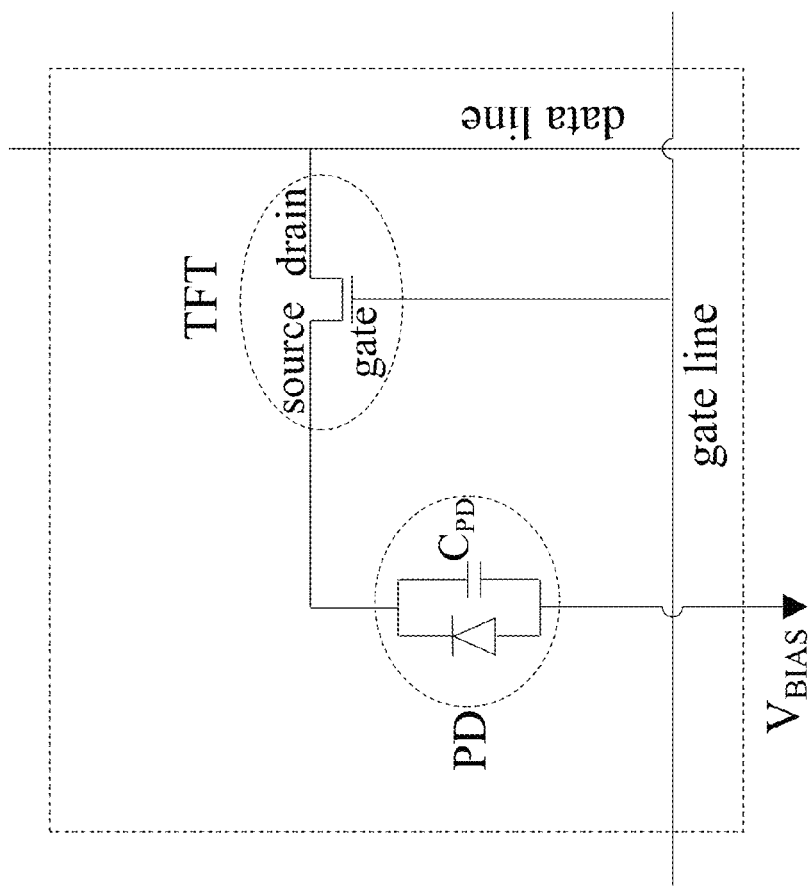
FIG. 5 is a schematic circuit diagram for a pixel from an active matrix imaging array employing indirect detection of the incident radiation.

Referring now to the drawings, wherein like reference numerals designate identical or corresponding parts throughout the several views and, more particularly, to FIG. 5, for active matrix array pixel circuits having the general form shown in FIG. 5, during readout of a given row of pixels, the electric field across the corresponding photodiodes increases back to the maximum value defined by the magnitude of $V_{BIAS}$ and by the thickness of the a-Si in the photodiode. Thus, pixel readout results in the imaging signals being sampled as well as the pixels being initialized. During collection of imaging signal in each pixel storage capacitor, the electric field decreases. For a given pixel, if the imaging signal is sufficiently large, the magnitude of the electric field will decrease almost to zero, the storage capacitor will be able to store no further charge, and the pixel is saturated. The probability of charge trapping in the photodiode typically increases with decreasing electric field strength, and becomes very high near conditions of pixel saturation. In radiographic imaging (which typically involves large x-ray exposures), high levels of trapped charge result in substantial loss of imaging signal. This reduces the signal-to-noise ratio for the imager and can degrade image quality. In fluoroscopic imaging, charge trapped during acquisition of early images will be released in later images. This can result in image information from earlier images appearing in later images—a generally undesirable effect which is referred to as lag or image lag. In addition, if an imager is used to generate a radiographic image with a large x-ray exposure, and if that imager is used to generate fluoroscopic images a short time later, image information from the radiographic image may appear in the fluoroscopic images—an undesirable effect which is referred to as ghosting. Lag and ghosting are responsible for image artifacts that can obscure important information in an image, thus degrading the usefulness of the image, and such artifacts are commonly encountered with imagers based on active matrix arrays. However, array designs incorporating circuits of greater complexity than those of active matrix arrays can overcome signal-to-noise limitations and reduce image artifacts, while preserving the important advantages of compactness, large area, and radiation damage resistance.

Figure 15:
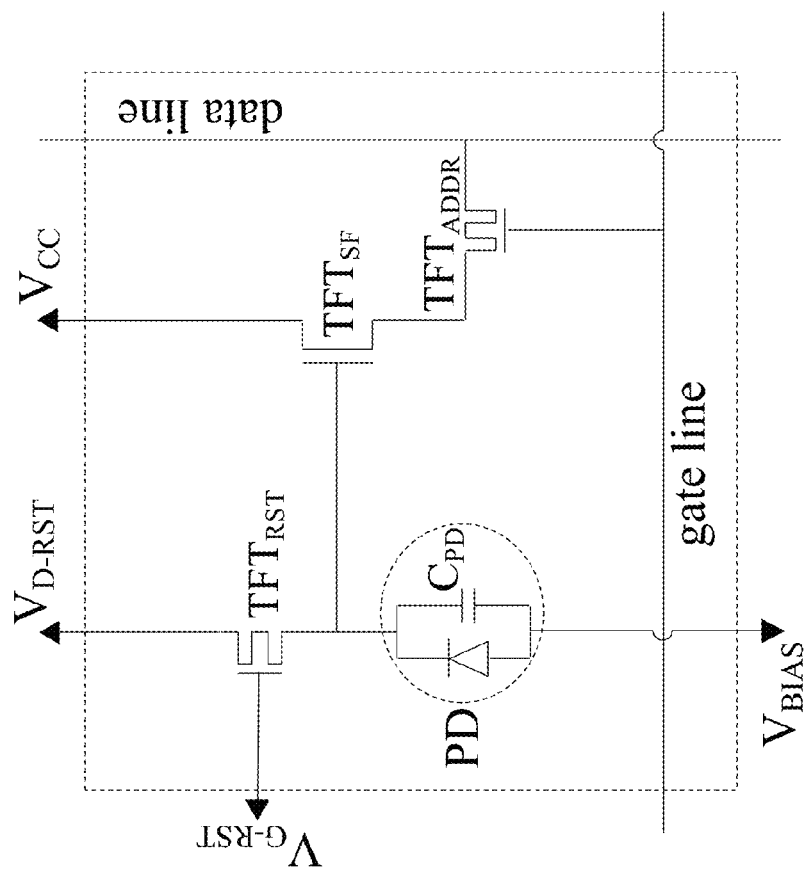
FIG. 15 is a schematic circuit diagram for a pixel from an indirect detection array based on an active pixel design with a one-stage, in-pixel amplifier.
Figure 16:
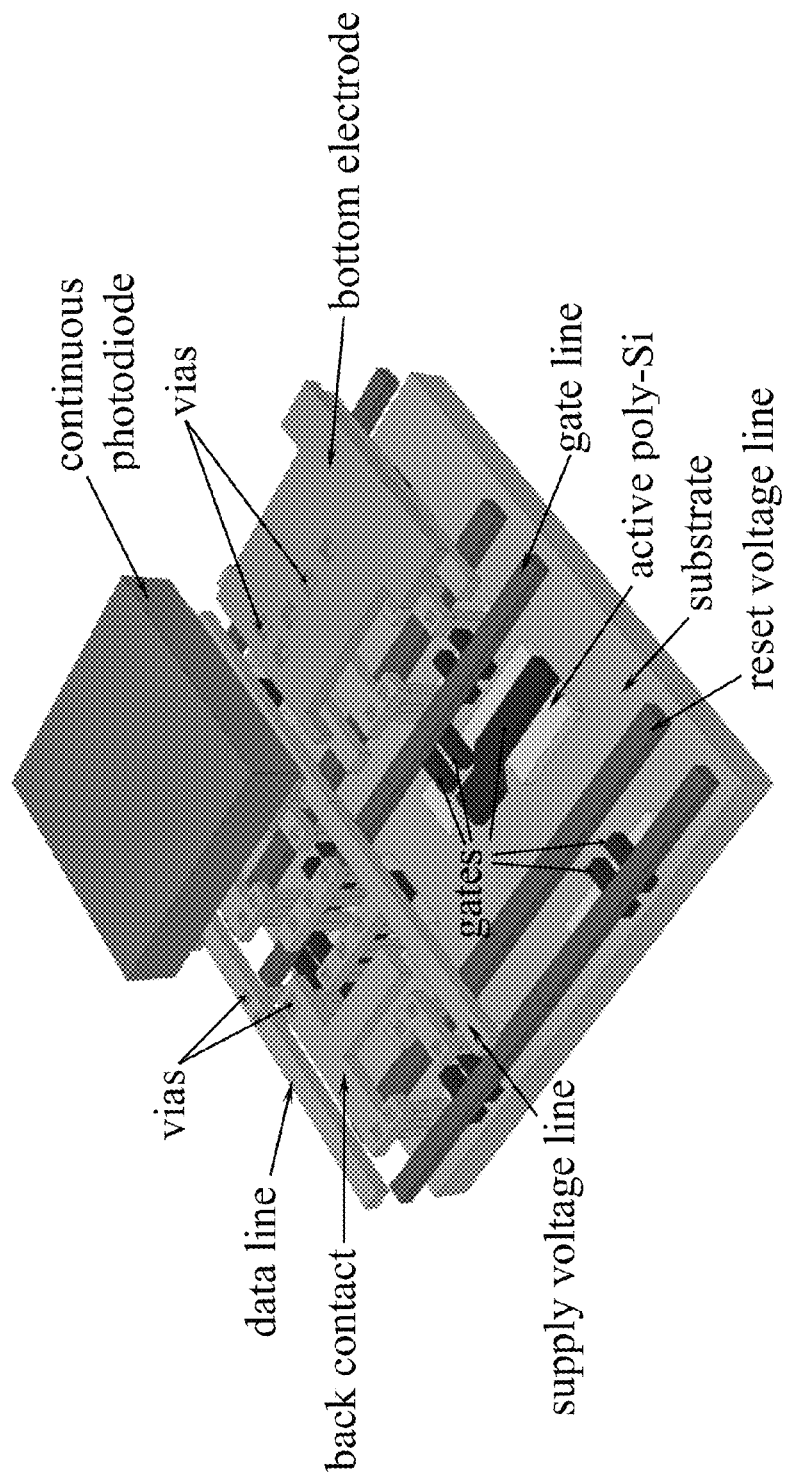
FIG. 16 is a schematic rendering of four adjacent pixels of an indirect detection array based on an active pixel design employing poly-Si TFTs, corresponding to an implementation of the pixel circuit in FIG. 15 and a photodiode structure similar to that in FIG. 12.
Figure 17:
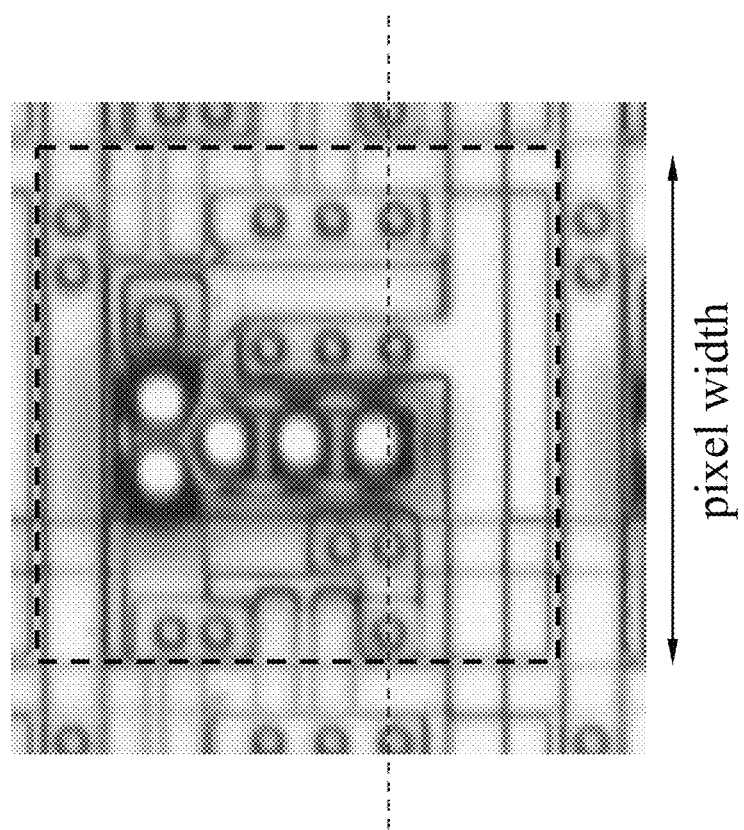
FIG. 17 is a photomicrograph of the top surface of an indirect detection array in the region of a single pixel, corresponding to an implementation of the pixel circuit in FIG. 15 and to the rendering in FIG. 16.

An example of a more complex pixel circuit for an indirect detection array is schematically illustrated in FIG. 15. This circuit design includes three TFTs that are configured to provide a one-stage, in-pixel amplifier, an addressing TFT and a reset TFT. By virtue of the presence of the in-pixel amplifier, this design is referred to as an active pixel design. During operation of an array incorporating this design, imaging signal is collected and stored in the photodiode, which acts as the pixel storage capacitor. As in the case of active matrix arrays, readout can be performed one row of pixels at a time (if maximum spatial resolution is desired), but sampling of the pixel signals and pixel initialization are no longer concurrent. When the imaging signal in a given pixel storage capacitor is sampled through use of the addressing TFT, the in-pixel amplifier magnifies the signal by an amount equal to the ratio of the capacitance of the data address line to the capacitance of the photodiode, $C_{PD}$. Since this amplification occurs at a point in the imager circuit prior to contributions of noise from the addressing TFT and from the external preamplifier (which are two of the major noise sources in active matrix imagers), this pixel circuit design can provide a substantial increase in the signal-to-noise ratio of the imager. In addition, for this pixel circuit, sampling the imaging signal does not initialize the pixel. Rather, the imaging signal continues to reside in the pixel storage capacitor until the pixel is initialized through use of the reset TFT. As a consequence, the imaging signals can be sampled multiple times and then averaged, leading to further improvement in the signal-to-noise ratio of the imager. FIGS. 16 and 17 correspond to an actual realization of an indirect detection array with a one-stage, in-pixel amplifier design, representing an implementation of the pixel circuit of FIG. 15. FIG. 16 is a schematic rendering of four pixels, while FIG. 17 is a photomicrograph of a pixel from an actual array.

Figure 18:
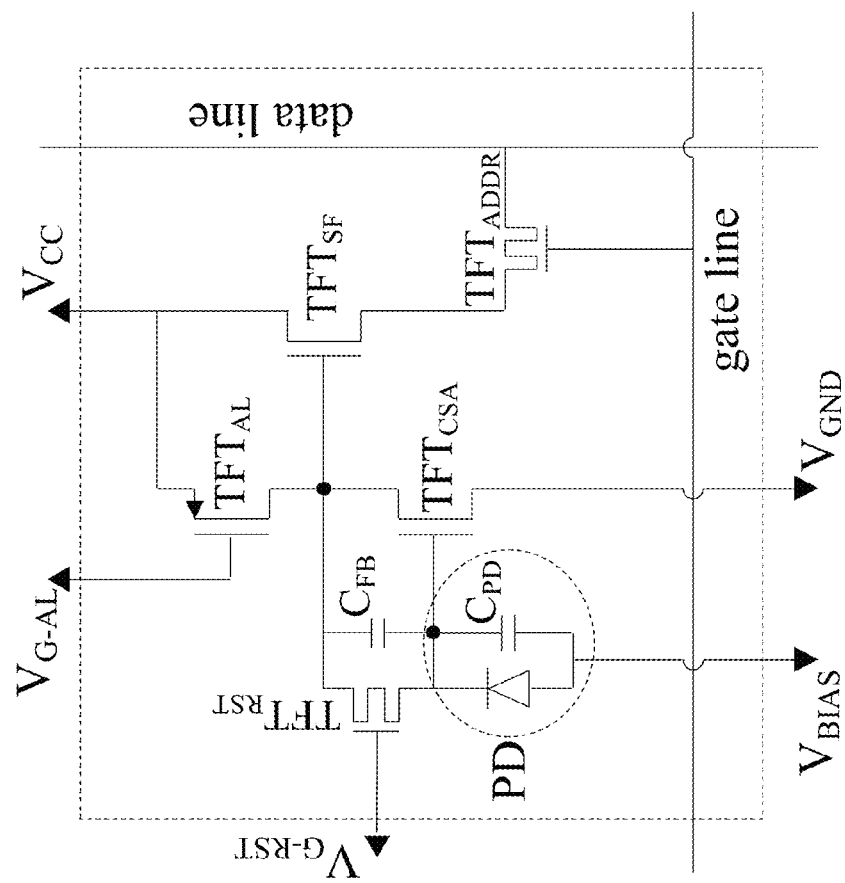
FIG. 18 is a schematic circuit diagram for a pixel from an indirect detection array based on an active pixel design with a two-stage, in-pixel amplifier.

Another example of an even more complex pixel circuit for an indirect detection array is schematically illustrated in FIG. 18. This circuit design includes five TFTs and a feed-back capacitor that are configured to provide a two-stage, in-pixel amplifier, an addressing TFT and a reset TFT. This is another example of an active pixel design. During operation of an array incorporating this design, imaging signal is collected and stored in the feed-back capacitor, which acts as the pixel storage capacitor. The operation and advantages of this design are similar to that of the one-stage, in-pixel amplifier design described above—providing a substantial increase in the signal-to-noise ratio of the imager by virtue of in-pixel amplification of the imaging signal, as well as by virtue of multiple sampling and averaging of the imaging signal. In addition, during collection and storage of the imaging signal, the electric field across the photodiode decreases only very slightly in this design—in marked contrast to the situation for an active matrix pixel design or the previously described one-stage in-pixel amplifier design.

Figure 19:
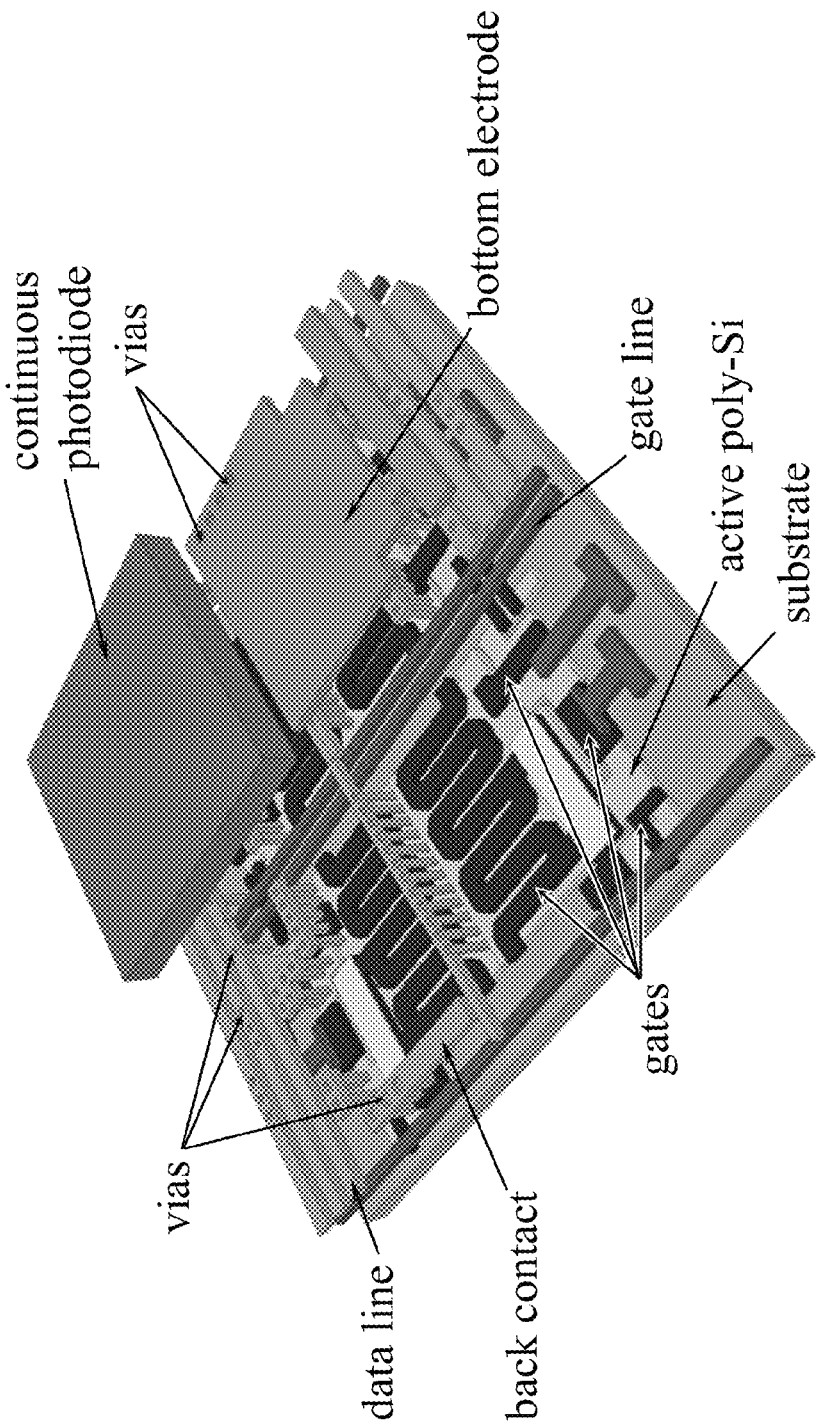
FIG. 19 is a schematic rendering of four adjacent pixels of an indirect detection array based on an active pixel design employing poly-Si TFTs, corresponding to an implementation of the pixel circuit in FIG. 18 and a photodiode structure similar to that in FIG. 12.
Figure 20:
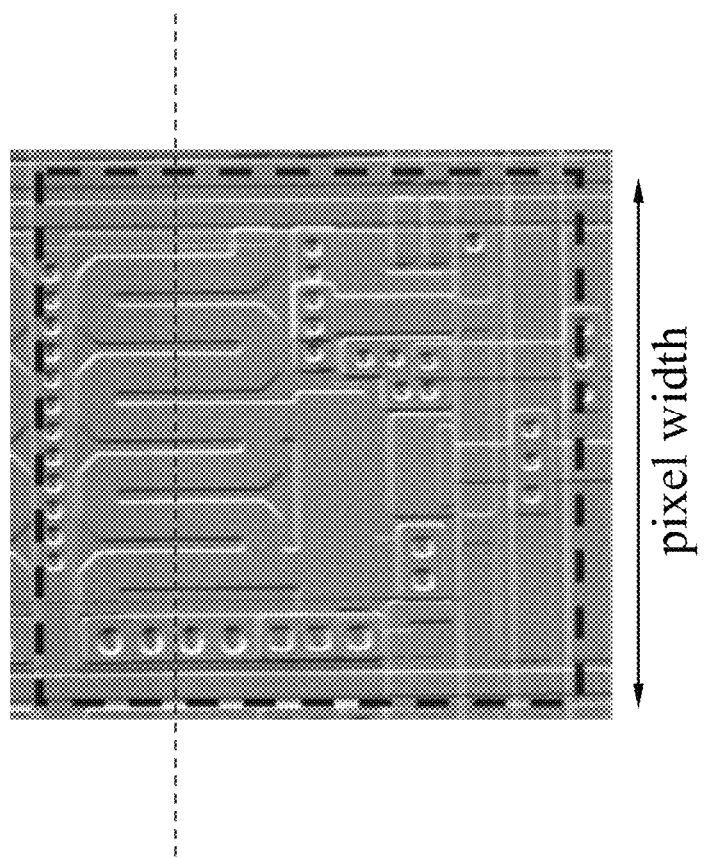
FIG. 20 is a photomicrograph of the top surface of an indirect detection array in the region of a single pixel, corresponding to an implementation of the pixel circuit in FIG. 18 and to the rendering in FIG. 19.

Consequently, the amount of charge trapping in the photodiode is reduced and lag and ghosting artifacts are lessened, even at very high x-ray exposures. A further advantage of this two-stage in-pixel amplifier design is that it allows a greater measure of control over the gain of the amplifier (defined as the multiplicative factor by which the amplifier increases the imaging signal) compared to that of the one-stage design. In the two-stage design, the in-pixel amplifier magnifies the imaging signal by an amount equal to the ratio of the capacitance of the data address line to the capacitance of the pixel feed-back capacitor, $C_{FB}$. Thus, for a given pixel pitch and pixel storage capacitor capacitance, the magnitude of the in-pixel amplifier gain increases with increasing data line capacitance, both for the one-stage and two-stage design. As a consequence, if larger arrays (i.e., arrays with greater numbers of pixels along the data line direction) are manufactured based on a given pixel design, the amount of amplification will increase. This is a result of the fact that data line capacitance will increase in proportion to the number of pixels along a data address line. In the case of the one-stage design, this dependence (which is generally undesirable) of in-pixel amplifier gain on array size cannot be offset without altering the thickness or area of the photodiode (whose specifications need to be independently optimized for maximum light detection efficiency). However, for the two-stage design, the magnitude of $C_{FB}$ can be adjusted (for example, by adjusting the thickness of the capacitor dielectric or area of the capacitor) to offset changes in data line capacitance. This allows a given two-stage design to be implemented for various array sizes without changing the range of the magnitude of imaging signals extracted from the array—thus simplifying the design of the external preamplification electronics required for imager operation. FIGS. 19 and 20 correspond to an actual realization of an indirect detection array with a two-stage, in-pixel amplifier, representing an implementation of the pixel circuit of FIG. 18. FIG. 19 is a schematic rendering of four pixels while FIG. 20 is a photomicrograph of a pixel from an actual array.

As described above, out-of-plane photodiode structures make substantial performance improvements possible. These improvements are a direct result of increased optical fill factor, as well as a result of increased pixel circuit complexity facilitated by such photodiode structures. For the practical realization of these benefits, however, the out-of-plane photodiode structures should not introduce other factors that degrade performance. In this regard, the inventor has discovered a significant problem that degrades performance, as explained below.

Figure 21:
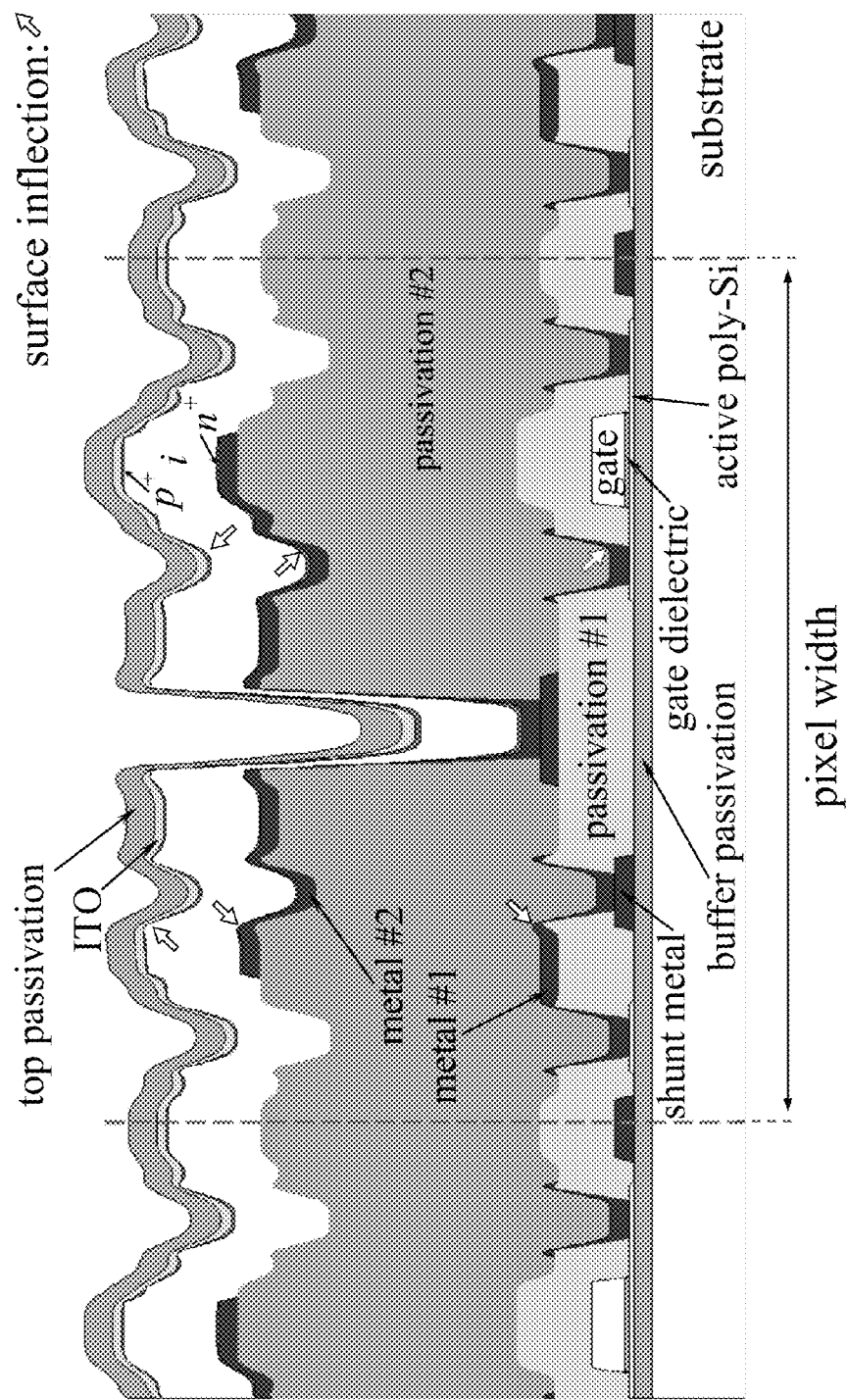
FIG. 21 is a calculated cross sectional view of an indirect detection array based on a one-stage, in-pixel amplifier design employing poly-Si TFTs, corresponding to FIGS. 16 and 17 and showing the native topology of various features and materials.
Figure 22:
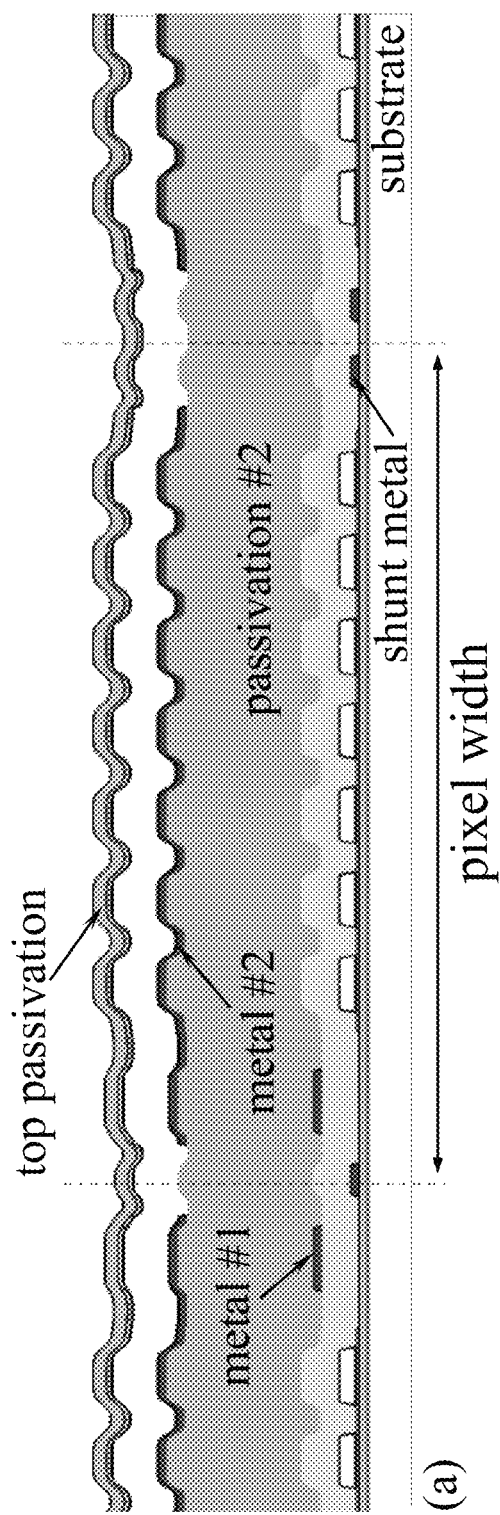
FIG. 22($a$) is a calculated cross sectional view of an indirect detection array based on a two-stage, in-pixel amplifier design employing poly-Si TFTs, corresponding to FIGS. 19 and 20 and showing the native topology of various features and materials.
Figure 22:
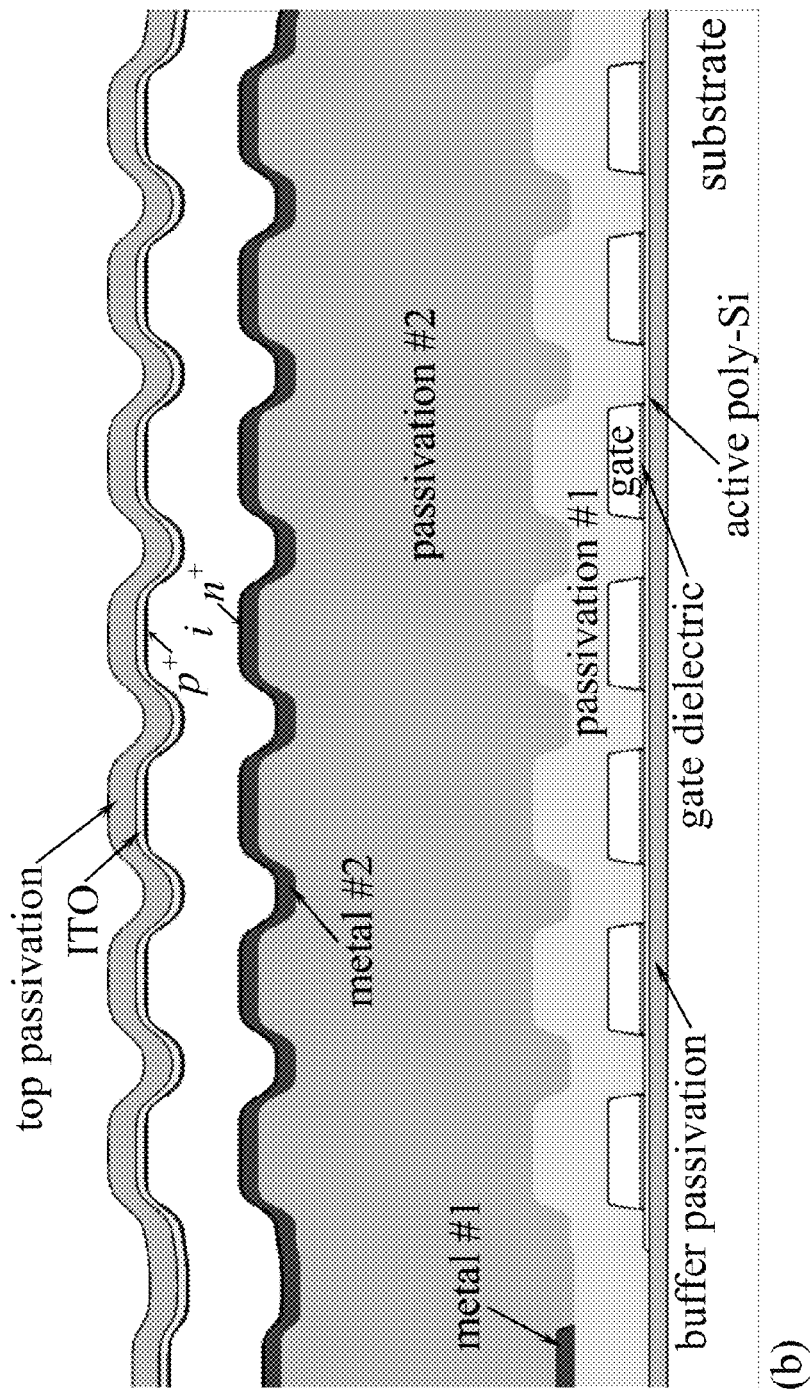

FIGS. 21 and 22 are calculated cross sectional views of the one-stage and two-stage in-pixel amplifier designs corresponding to the microphotographs in FIGS. 17 and 20, respectively. These cross sectional views illustrate various features and materials present in the pixel designs. For example, there are four passivation layers: a buffer passivation, passivation #1, passivation #2 and a top passivation. In addition, there are four metal layers: shunt metal (used for such elements as the reset voltage lines and the gate address lines); metal #1 (used for such elements as the back contacts, data address lines and vias); metal #2 (used for such elements as the bottom electrode of the photodiode); and ITO (used for the top electrode of the photodiode). Other layers and features shown in FIGS. 21 and 22 include: the poly-Si used for the TFT channels (labeled as active poly-Si); TFT gates (formed from poly-Si); and $n^+$ doped, intrinsic and $p^+$ doped a-Si used for the photodiode. The topological non-uniformity of the photodiode structures that is apparent in these cross sections is representative of that in the corresponding fabricated arrays, from which the photomicrographs in FIGS. 17 and 20 were obtained. For example, in FIGS. 23 and 24, the close correspondence between top views of the pixels (obtained from the same calculations used to generate the cross sectional views in FIGS. 21 and 22), and photomicrographs of actual realizations of the corresponding arrays, is apparent.

The photodiode structures illustrated in FIGS. 21 to 24 demonstrate a very high degree of non-uniformity in their topology. This topological non-uniformity results from the presence of features in the pixel design which are located below, or are part of, the photodiode. For the examples of the pixel design shown, these features include TFTs, capacitors, address lines, traces and vias, including the vias that connect the bottom electrode of the photodiode to the back contact. Such features create non-uniformity in an out-of-plane photodiode structure whether the structure is continuous (as in these examples) or discrete (i.e., having the photodiode structure shown in FIG. 11). Note that, in the case of a direct detection array, the presence of features (such as TFTs, capacitors, address lines, traces and vias) that are below, or are part of, the photoconductor structure creates a similar degree of topological non-uniformity in that structure as well. For an indirect detection array with a continuous out-of-plane photodiode structure, as well as for a direct detection array, a topological non-uniformity is created along the entire perimeter of the bottom electrode and in the region of the via connecting the bottom electrode to the back contact, as is apparent in FIGS. 14, 21 and 22(a).

By comparison, for indirect detection arrays employing the baseline architecture, the discrete photodiode structures demonstrate a very high degree of uniformity in their topology. This topological uniformity results from the absence of any features in the pixel design which are located below, or are part of, the photodiode, as is apparent in FIGS. 6 and 9. In this case, when the processing steps used to fabricate the various layers of the photodiode structure are performed over the smooth, flat surface of the array substrate, a smooth and planar surface, as well as a uniformity of thickness, is achieved for each layer. Consequently, the top of the photodiode structure will be smooth and planar, as observed in FIG. 10. This smoothness and planarity is limited only by random, local variations (on the order of several hundred angstroms) that originate from processing steps used in the fabrication of arrays. Note that, during fabrication, other processing variations can create a systematic variation (e.g., an increase or a decrease) in the thickness of a given layer of material of up to several tens of percent across an array.

In the case of indirect detection arrays employing the baseline architecture, the photodiodes exhibit excellent properties, including high efficiency for the sensing of optical photons and the collection of the resulting signal, and favorably low levels of dark current, charge trapping, charge release and lag—with neither random local variations in smoothness and planarity nor systematic variations in material thickness due to the fabrication process interfering with these excellent properties. Photodiode structures that exhibit such excellent properties, whether comprising a discrete, baseline architecture design, or a continuous or discrete out-of-plane design, are referred to as being of high quality. For a given imaging array, each of these properties can be obtained through measurements of the signal properties of individual pixels and the results from an individual pixel, or from the average of results from many pixels, can be expressed in the following manner. The magnitude of this favorable level of dark current per pixel, normalized to unit photodiode area, is less than ~1 pA per square mm. The magnitude of this favorable level of charge trapping per pixel, quantified by the amount of imaging signal lost to trapping during a single radiographic frame, and expressed as a percentage of the imaging signal obtained under conditions where charge trapping and charge release are in equilibrium, is less than ~20%. The magnitude of this favorable level of charge release per pixel, quantified by the amount of imaging signal released from trapping states during the first frame acquired in the absence of radiation following a series of frames acquired with radiation and under conditions where charge trapping and charge release are in equilibrium, and expressed as a percentage of the imaging signal obtained under conditions where charge trapping and release are in equilibrium, is less than ~15%. The magnitude of this favorable level of lag per pixel, quantified by the amount of imaging signal (that originates from charge trapped in one or more previous frames) released from trapping states during the first frame acquired in the absence of radiation following one, or a series of frames acquired with radiation, and expressed as a percentage of the imaging signal from the previous frame, is less than ~15%. The results of such measurements are also commonly referred to as first field lag or, alternatively, as first frame lag. For direct detection active matrix arrays employing a photoconductive material for the converter, the magnitude of the favorable level of dark current, normalized to unit photoconductor area, charge trapping, charge release and lag is similar to the levels described above for indirect detection arrays.

For high quality photodiode structures in indirect detection arrays employing the baseline architecture, one factor contributing to the excellent properties described above is the degree of uniformity in topology. Within the limits of surface smoothness, surface planarity, and uniformity of thickness previously described, each of the individual $n^+$ doped, intrinsic and $p^+$ doped a-Si layers in the photodiode has a uniform thickness, the top and bottom electrodes are both planar, and these electrodes are parallel to each other. As a consequence, the manner in which the electric field strength varies as a function of distance across the thickness of the intrinsic layer remains relatively unchanged across the area of the photodiode, and this is responsible for the favorable levels of dark current, charge trapping, charge release and lag in a high quality photodiode.

Conversely, in photodiode structures that have a non-uniform topology, regions of very high and very low electric field strength are created in the a-Si material of the photodiode. In regions of a photodiode where either a top or bottom electrode exhibits a sharp (i.e., abrupt) departure from planarity, the electric field in the intrinsic a-Si will be significantly larger than the electric field in regions where the top and bottom electrodes are parallel. In the vicinity of such regions of high electric field, the electric field strength will be significantly lower than the electric field in regions where the top and bottom electrodes are parallel. The sharper (i.e., more abrupt) the change in planarity, the larger the deviations in electric field strength will be. Since dark current increases as a function of increasing electric field strength, regions of significantly increased electric field strength will result in unfavorable levels of dark current. Similarly, since charge trapping increases as a function of decreasing electric field strength, regions of significantly reduced electric field strength will result in unfavorable levels of charge trapping, charge release and lag.

For the three examples of pixel design with a continuous out-of-plane photodiode structure described above (i.e., with an active matrix design, FIG. 14, with a one-stage in-pixel amplifier design, FIGS. 21 and 23, and with a two-stage in-pixel amplifier design, FIGS. 22 and 24), the extensive topological non-uniformity of the photodiode in each design results in extensive regions of significantly increased electric field strength, as well as extensive regions of significantly decreased electric field strength. Sharp changes in electrode planarity can also substantially decrease the minimum distance between the top and bottom electrode, as is apparent in the region of the deep via in FIG. 21, further contributing toward significant increases in electric field strength. The presence of such regions as the inventor has discovered leads to unfavorably high levels of dark current, charge trapping, charge release and lag and thus prevents the realization of high quality photodiodes.

High photodiode dark current is undesirable for several reasons. Since dark signal (created by dark current) is stored in the pixel storage capacitor during imaging, high dark current significantly reduces the range of exposure over which the pixel can operate before saturating. In addition, since dark current creates a source of noise referred to as shot noise, high dark current leads to high shot noise. Since this contribution of shot noise in the imager occurs prior to the effect of gain from an in-pixel amplifier (such as in the pixel circuit designs of FIGS. 15 and 18), the improvement in the signal-to-noise ratio of the imager is reduced compared to expectations. Similarly, high shot noise reduces the intended improvement in the signal-to-noise ratio of an imager incorporating an AMFPI array with an out-of-plane photodiode structure (such as in the pixel designs illustrated in FIGS. 11 and 12). High levels of charge trapping are undesirable for several reasons. In radiographic imaging, loss of signal to trapping states reduces the imaging signal sampled from the pixel, thereby reducing the signal-to-noise ratio of the imager. In addition, high levels of charge trapping lead to high levels of charge release and lag, increasing the undesirable consequences of image artifacts.

Figure 23:
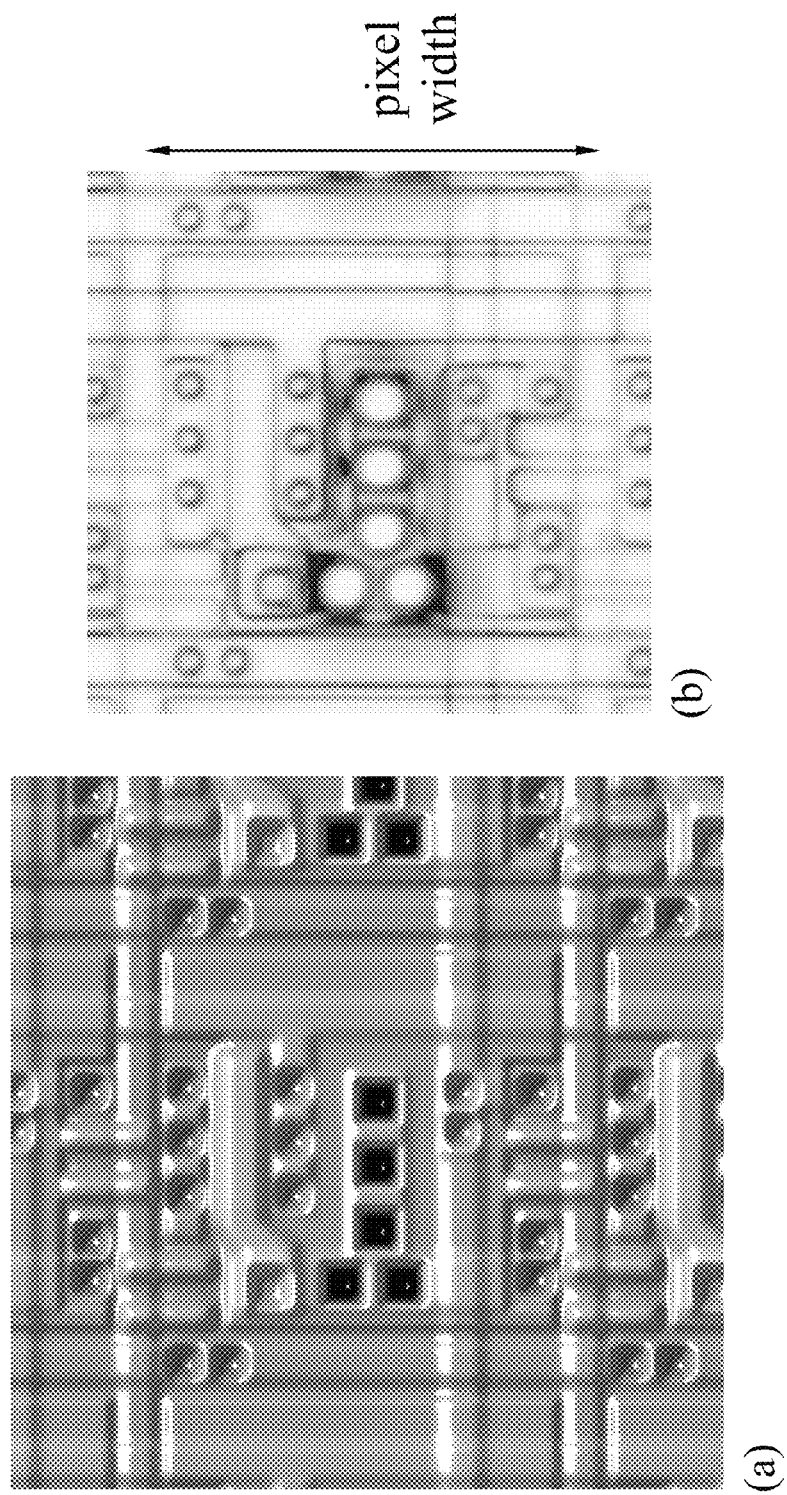
FIG. 23($a$), obtained from the same calculations used for FIG. 21, is a top view of a one-stage, in-pixel amplifier array in the region of a single pixel, corresponding to FIGS. 16 and 17 and showing the native topology of the top of the continuous photodiode structure.
Figure 24:
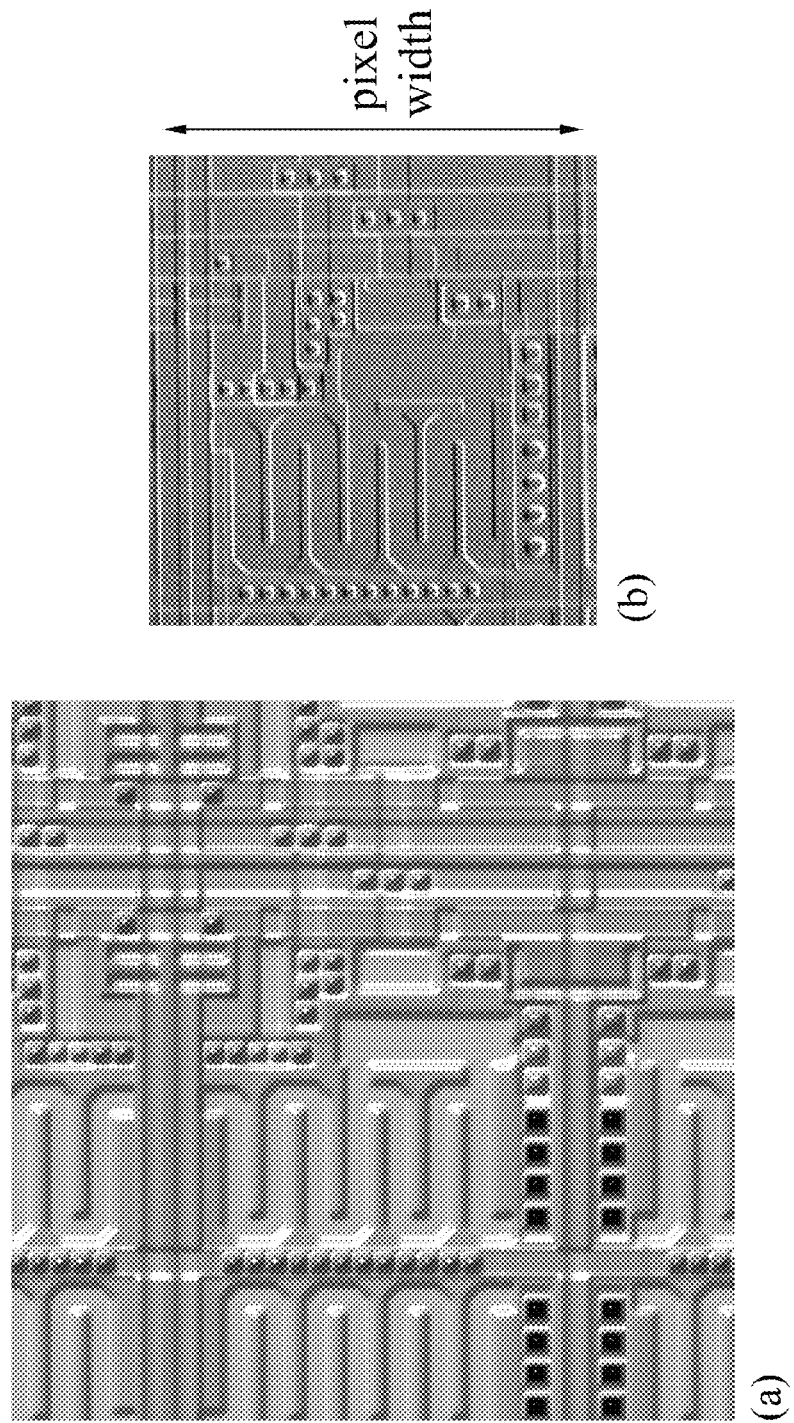
FIG. 24($a$), obtained from the same calculations used for FIG. 22, is a top view of a two-stage, in-pixel amplifier array in the region of a single pixel, corresponding to FIGS. 19 and 20, and showing the native topology of the top of the continuous photodiode structure.
Figure 25:
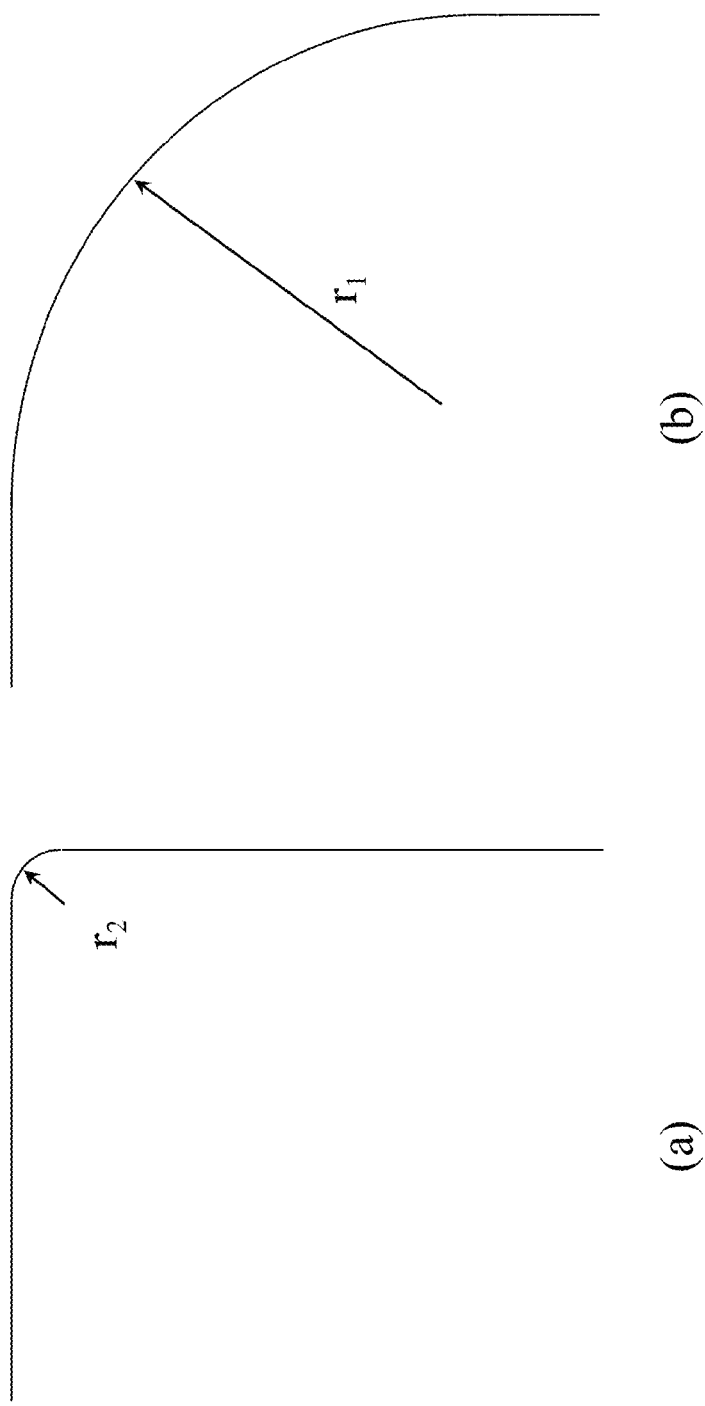
FIG. 25 is a pair of drawings illustrating the general concept of radius of curvature, which can be applied to the characterization of changes in the planarity of a surface.

The sharpness (i.e., abruptness) of changes in the planarity of a surface (such as the topology of the electrodes in a photodiode as shown in FIGS. 21 to 24) can be quantified by the radius of curvature, r, as illustrated in FIG. 25. Sharper changes in planarity are therefore represented by smaller values of r. Calculational determinations of the effect of sharp changes in electrode planarity (as parameterized by r) on electric field strength in the intrinsic a-Si layer of photodiode structures representative of those in continuous and discrete out-of-plane designs indicates the importance of reducing such sharp changes in the photodiode structure.

In regions near changes of planarity characterized by a value for r of 0.1 µm or less, the maximum deviations in electric field can be very large, more than 300 percent higher (in those regions nearest to the change in planarity) and more than 60 percent lower (in the vicinity of those regions) than the magnitude of the electric field for a pair of parallel electrodes. In regions near changes of planarity characterized by a value for r of ~0.5 µm, deviations in electric field can be up to ~300 percent higher (in those regions nearest to the change in planarity) and up to ~60 percent lower (in the vicinity of those regions) than the magnitude of the electric field for a pair of parallel electrodes.

In regions near changes of planarity characterized by a value for r of ~1 µm, deviations in electric field can be up to ~200 percent higher (in those regions nearest to the change in planarity) and up to ~50 percent lower (in the vicinity of those regions) than the magnitude of the electric field for a pair of parallel electrodes. In regions near changes of planarity characterized by a value for r of ~2 µm, deviations in electric field can be up to ~50 percent higher (in those regions nearest to the change in planarity) and up to ~30 percent lower (in the vicinity of those regions) than the magnitude of the electric field for a pair of parallel electrodes. In regions near changes of planarity characterized by a value for r of ~5 µm, deviations in electric field can be up to ~20 percent higher (in those regions nearest to the change in planarity) and up to ~15 percent lower (in the vicinity of those regions) than the magnitude of the electric field for a pair of parallel electrodes. In regions near changes of planarity characterized by a value for r of ~10 µm, deviations in electric field can be to up ~10 percent higher (in those regions nearest to the change in planarity) and up to ~10 percent lower (in the vicinity of those regions) than the magnitude of the electric field for a pair of parallel electrodes.

The above considerations make it clear that, if out-of-plane photodiode structures are fabricated without regard to the topological uniformity of the photodiode, the resulting topology (which will be referred to as the native topology, such as appears in the examples shown in FIGS. 21 to 24) can prevent realization of high quality photodiodes and degrade the performance of imagers that incorporate arrays with such photodiodes. In general, the magnitudes of dark current, charge trapping, charge release and lag will increase as the extent (i.e., the number and area) of regions with sharp changes in the planarity of the electrodes of the photodiodes increases. These magnitudes will also increase as the sharpness of the changes in the planarity of the electrodes increases. However, high quality out-of-plane photodiode structures are realized according to one embodiment of the invention where the photodiodes are designed and fabricated so that the extent of such regions, as well as the sharpness of changes in planarity of the electrodes, are sufficiently reduced so that the photodiodes exhibit favorable levels of dark current, charge trapping, charge release and lag.

FIGS. 26 to 34 show examples of the result of applying various methods to improve the topological uniformity of out-of-plane photodiode structures. One method for improving topological uniformity is to completely planarize a layer of material that is below the photodiode structure. Illustrations of the application of this method appear in FIGS. 26(a) and 31(b) for the case of the one-stage in-pixel amplifier design, and in FIGS. 27 and 32(b) for the case of the two-stage in-pixel amplifier design. In each case, the top surface of passivation #2 has been made planar.

This can be achieved, for example in one embodiment of the invention, through the application of chemical-mechanical polishing (CMP, also called chemical-mechanical planarization) and/or spin coating. In applying this method, the thickness of the passivation layer could initially be made thicker than in the native topology case, so as to ensure a minimum thickness following the application of CMP. This would help to ensure that the parasitic capacitance between the photodiode electrodes and circuit elements below the photodiode structure is kept below a desired limit. FIGS. 26(a) and 27 provide cross sectional views of the resulting improvement in topological uniformity of the photodiode compared to that in the case of the native topologies illustrated in FIGS. 21 and 22, respectively. FIGS. 31(b) and 32(b) provide top views of the resulting improvement in topological uniformity of the photodiode compared to the native topology illustrated in FIGS. 31(a) and 32(a), respectively. The effectiveness of this method in significantly improving topological uniformity is apparent. Another method for improving topological uniformity of out-of-plane photodiode structures is to partially planarize a layer of material that is below the photodiode structure, as illustrated in FIG. 26(b). This can be achieved through use of various known techniques, such as those described above.

Figure 27:
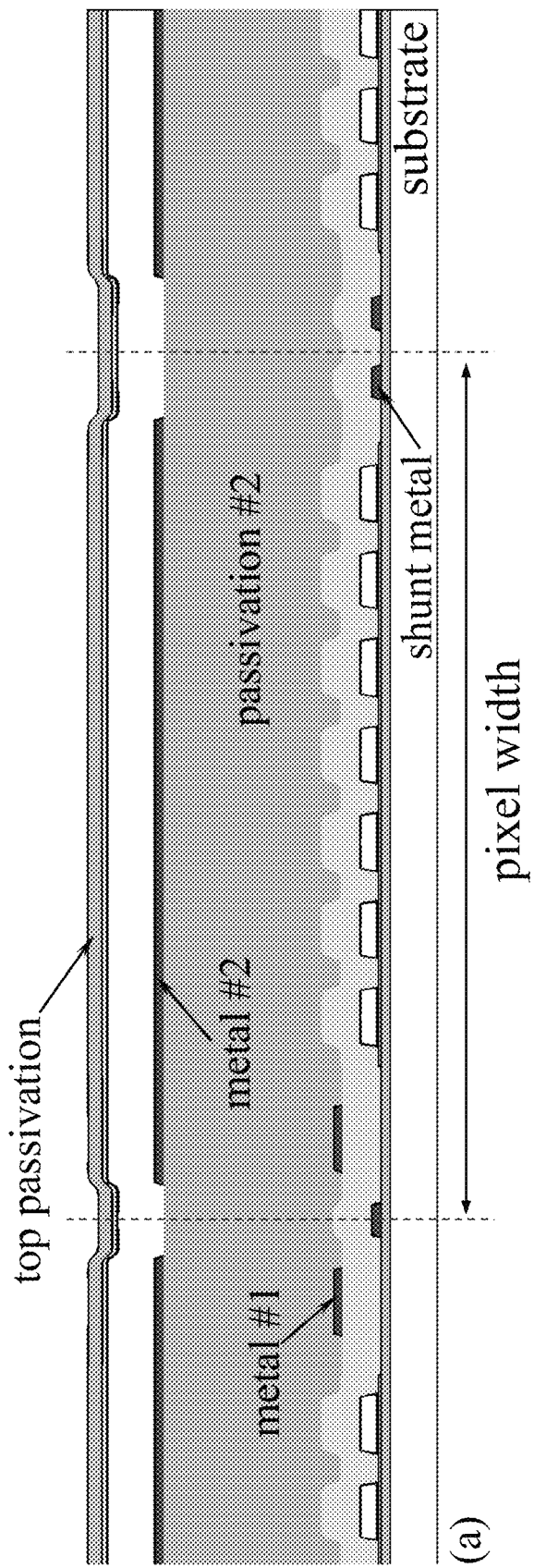
FIG. 27($a$) is a calculated cross sectional view of an indirect detection array, corresponding to FIG. 22($a$), but with a more uniform topology achieved through complete planarization of passivation #2.
Figure 27:
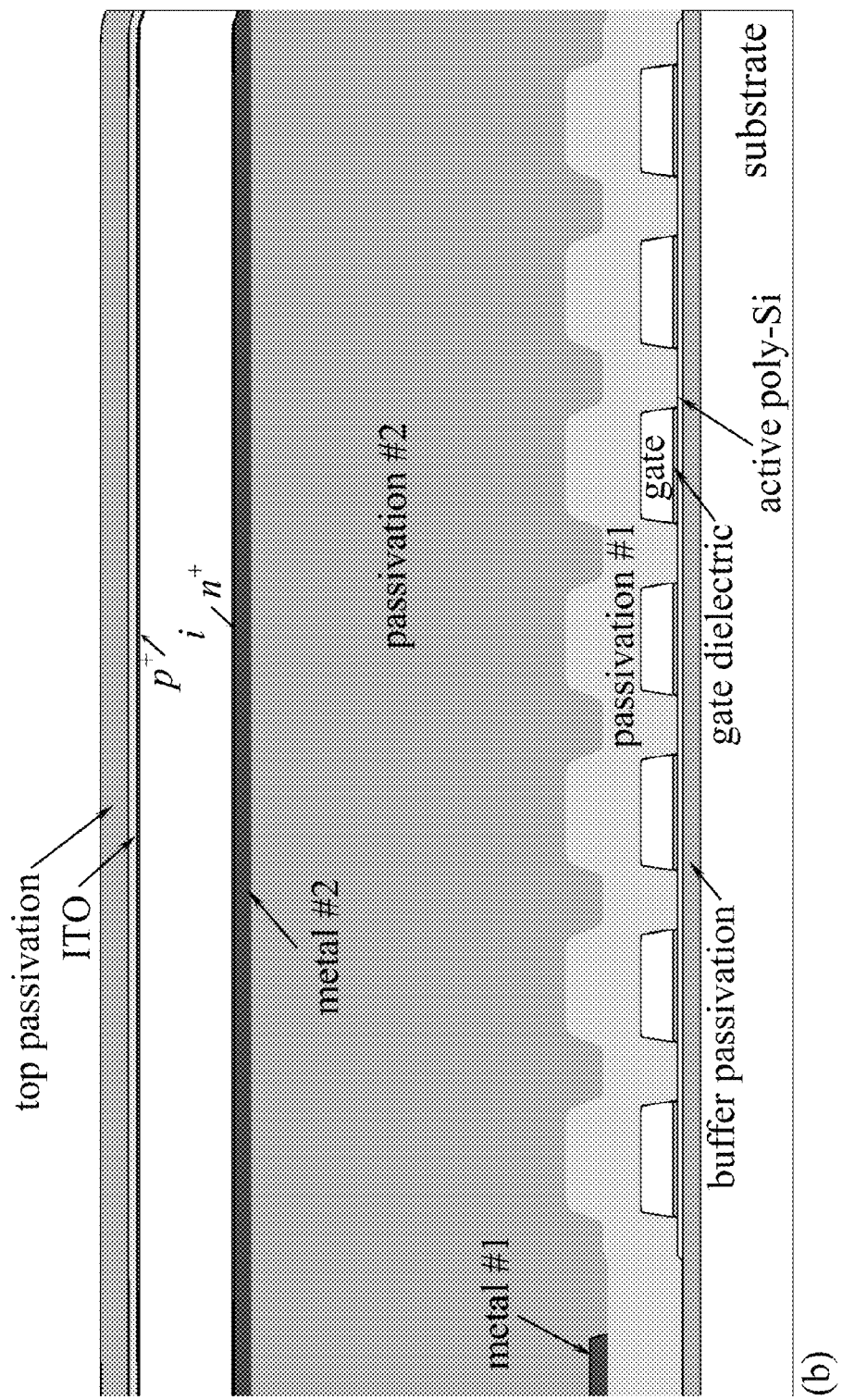
Figure 28:
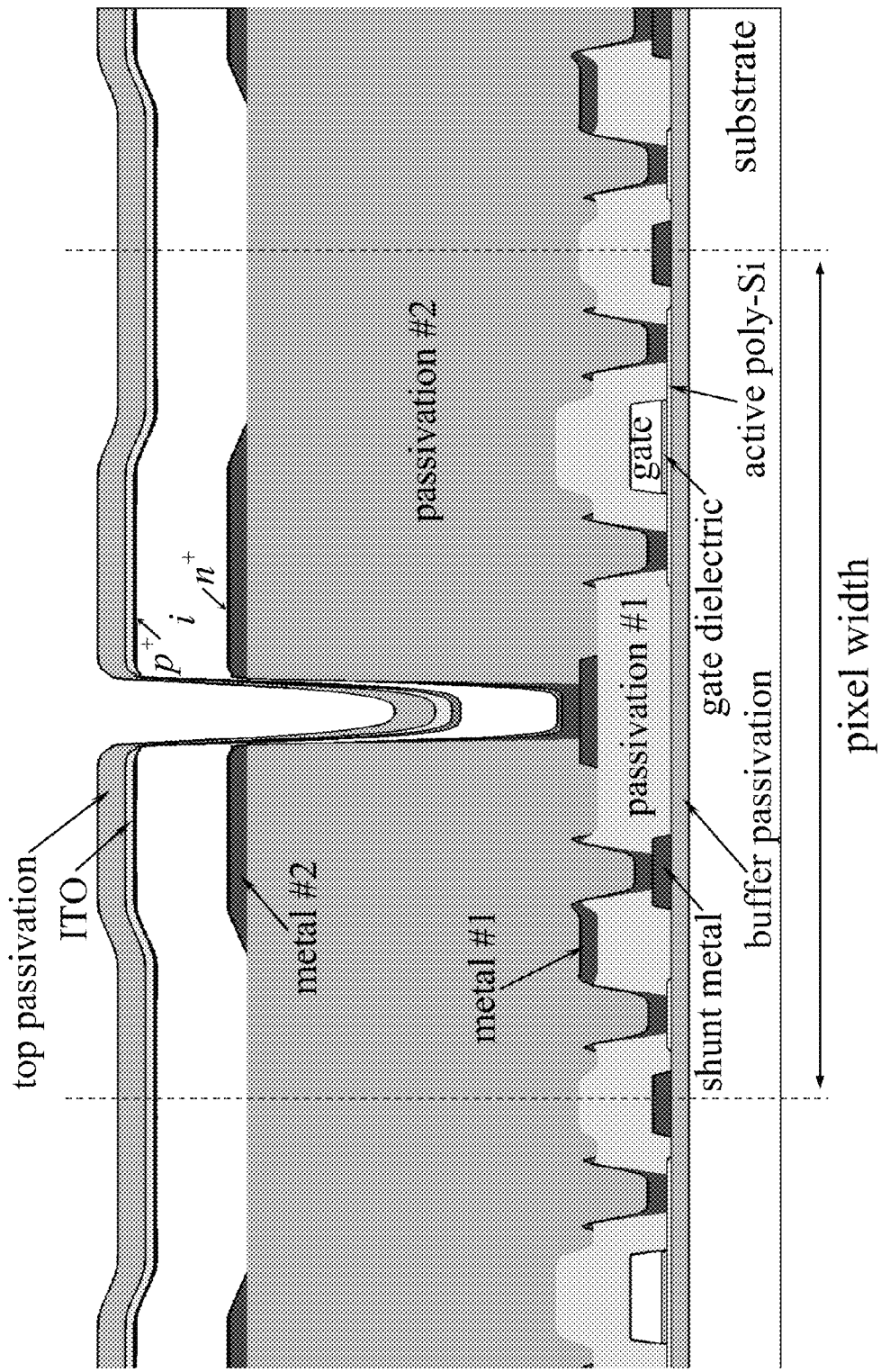
FIG. 28 is a calculated cross sectional view of an indirect detection array, corresponding to FIG. 26(a), but with a more uniform topology achieved through smoothing of the peripheral edges of the bottom electrode of the photodiode.
Figure 29:
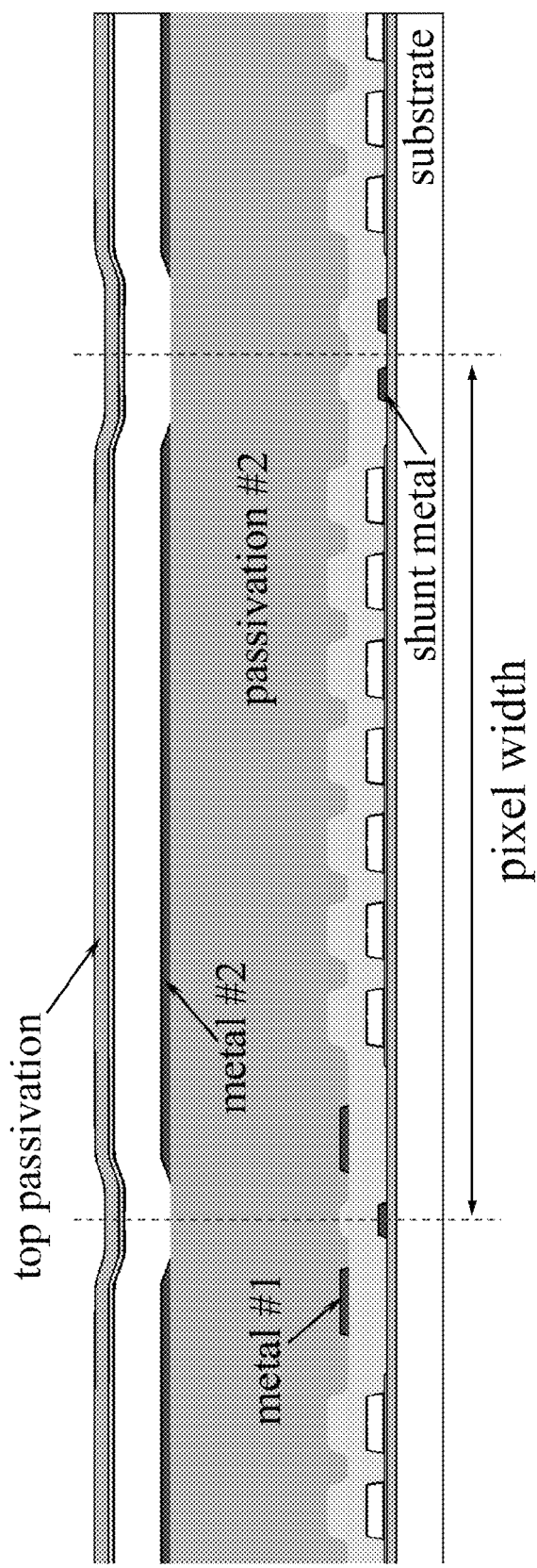
FIG. 29 is a calculated cross sectional view of an indirect detection array, corresponding to FIG. 27(a), but with a more uniform topology achieved through smoothing of the peripheral edges of the bottom electrode of the photodiode.

In continuous out-of-plane photodiode structures, the edges of the bottom electrode (formed from the metal #2 layer) create sharp changes in planarity in the top electrode, as is apparent in FIGS. 26(a) and 27(a). In one embodiment of the invention, it is desirable to smooth these edges. One method according to the invention to achieve this smoothing is through adjustment of the etching technique used to define the edges of the bottom electrode so as to achieve a beveled or rounded shape having a larger radius of curvature than that in the native topology. FIGS. 28 and 29 provide cross sectional views of the resulting improvement in topological uniformity of the photodiode compared to that shown in FIGS. 26(a) and 27(a), respectively. FIGS. 31(c) and 32(c) provide top views of the resulting improvement in topological uniformity of the photodiode compared to that shown in FIGS. 31(b) and 32(b), respectively. The effectiveness of this method in further improving topological uniformity is apparent.

Figure 30:
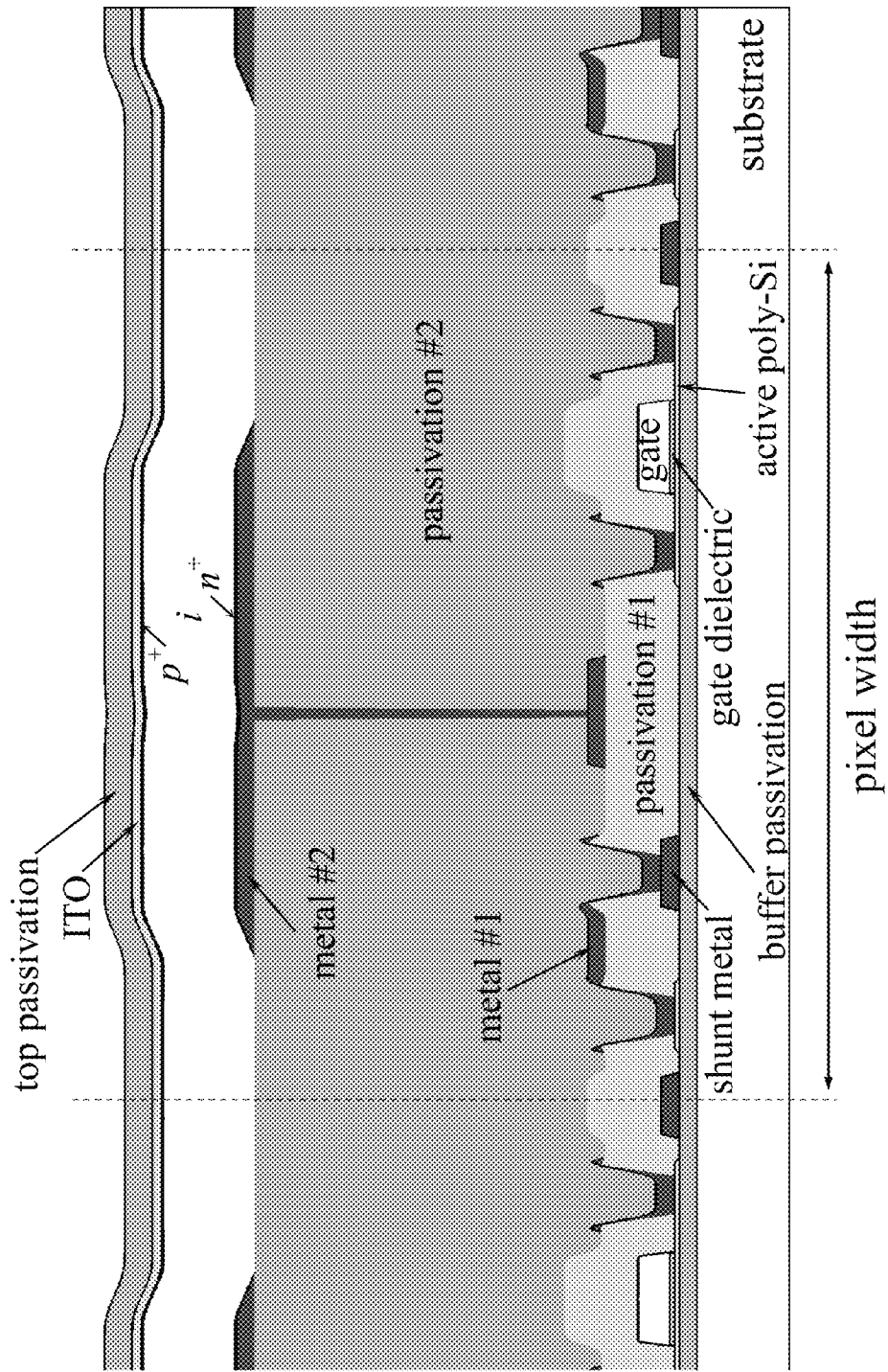
FIG. 30 is a calculated cross sectional view of an indirect detection array, corresponding to FIG. 28, but with a more uniform topology achieved through narrowing of the vias that connect the bottom electrode of the photodiode with the back contact and filling those vias with metal.

In continuous out-of-plane photodiode structures, the one or more vias connecting the bottom electrode of the photodiode to the back contact also create sharp changes in the planarity of the top and bottom electrodes. One method according to the invention for reducing the sharpness of these changes in planarity is to reduce the area of each via by narrowing its lateral dimensions (i.e., the dimensions along the surface of the photodiode), for example, to the limits allowed by the design rules. The metal used for the bottom electrode can also be deposited so as to fill the via. FIG. 30 is a cross sectional view of the resulting improvement in topological uniformity of the photodiode compared to that shown in FIG. 28. (No corresponding cross-sectional illustration is shown for the two-stage in-pixel amplifier design given the absence of vias within the field of view of FIG. 29.) FIGS. 31(d) and 32(d) are top views of the resulting improvement in topological uniformity of the photodiode compared to that shown in FIGS. 31(c) and 32(c), respectively. The effectiveness of this method of the invention in further improving topological uniformity is apparent.

Another method for improving the topological uniformity of out-of-plane photodiode structures is to planarize the top surface of the layer of intrinsic a-Si in the photodiode. Illustrations of the application of this method appear in FIGS. 33, 34(b) and 34(c) for the case of the one-stage in-pixel amplifier design.

Complete planarization of the layer of intrinsic a-Si in the photodiode can be achieved, for example in one embodiment of the invention, through application of CMP. In applying this method, the thickness of the intrinsic a-Si layer can initially be made thicker than the preferred thickness, so as to ensure that the final thickness achieved after application of CMP corresponds to that preferred thickness. This would help to ensure that the photodiode exhibits excellent properties. FIG. 33(a) provides a cross sectional view of the resulting improvement compared to the case of the native topology illustrated in FIG. 21. FIG. 34(c) provides a top view of the resulting improvement in topological uniformity of the photodiode compared to the native topology illustrated in FIG. 34(a). The effectiveness of this method in significantly improving the uniformity of the top electrode of the photodiode is apparent. The uniformity of the bottom electrode remains unchanged compared to the native topology. Another embodiment of this method for improving topological uniformity of out-of-plane photodiode structures is to partially planarize the layer of intrinsic a-Si in the photodiode, as illustrated in FIGS. 33(b) and 34(b). This can be achieved through the use of various known techniques, such as those described above.

Methods for improving the topological uniformity of out-of-plane photodiode structures, as described herein, including planarization of one or more layers of material below the photodiode structure, such as a passivation layer, smoothing the edges of the bottom electrode of the photodiode structure, narrowing the lateral dimensions of vias connecting the bottom electrode of the photodiode to the back contact and/or depositing the metal used for the bottom electrode so as to fill the vias, and planarization of the intrinsic a-Si in the photodiode, can be used in combination to achieve the desired results of this invention.

Figure 31:
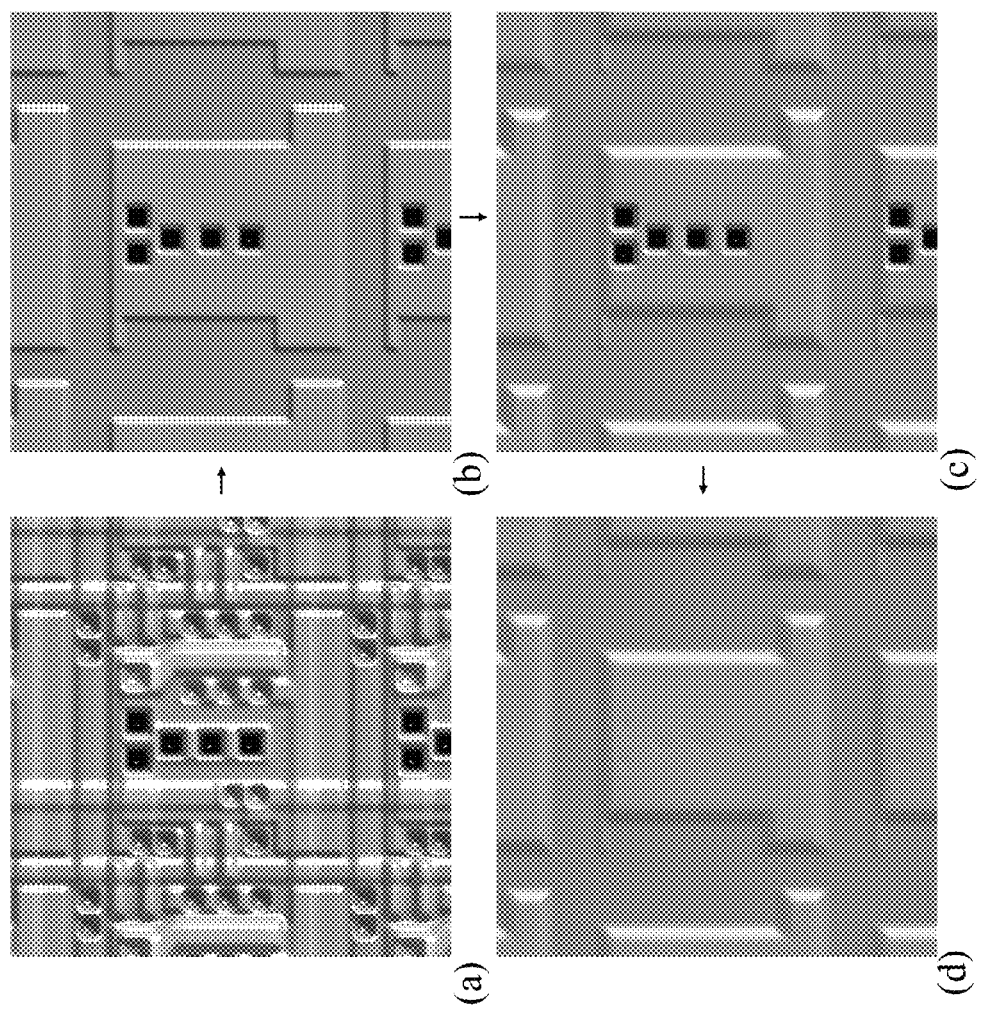
FIG. 31(a), obtained from calculations and corresponding exactly to FIG. 23(a), is a top view of a one-stage, in-pixel amplifier array in the region of a single pixel, showing the native topology of the top continuous photodiode structure, and included for purposes of comparisons with the remaining views in this figure.
FIG. 31(b), obtained from the same calculations used for FIG. 26(a), shows the improvement in surface topology, relative to FIG. 31(a), achieved through complete planarization of passivation #2.
FIG. 31(c), obtained from the same calculations used for FIG. 28, shows the improvement in surface topology, relative to FIG. 31(b), achieved through smoothing of the peripheral edges of the bottom electrode of the photodiode.
FIG. 31(d), obtained from the same calculations used for FIG. 30, shows the improvement in surface topology, relative to FIG. 31(c), achieved through narrowing of the vias that connect the bottom electrode of the photodiode with the back contact and filling those vias with metal.
Figure 32:
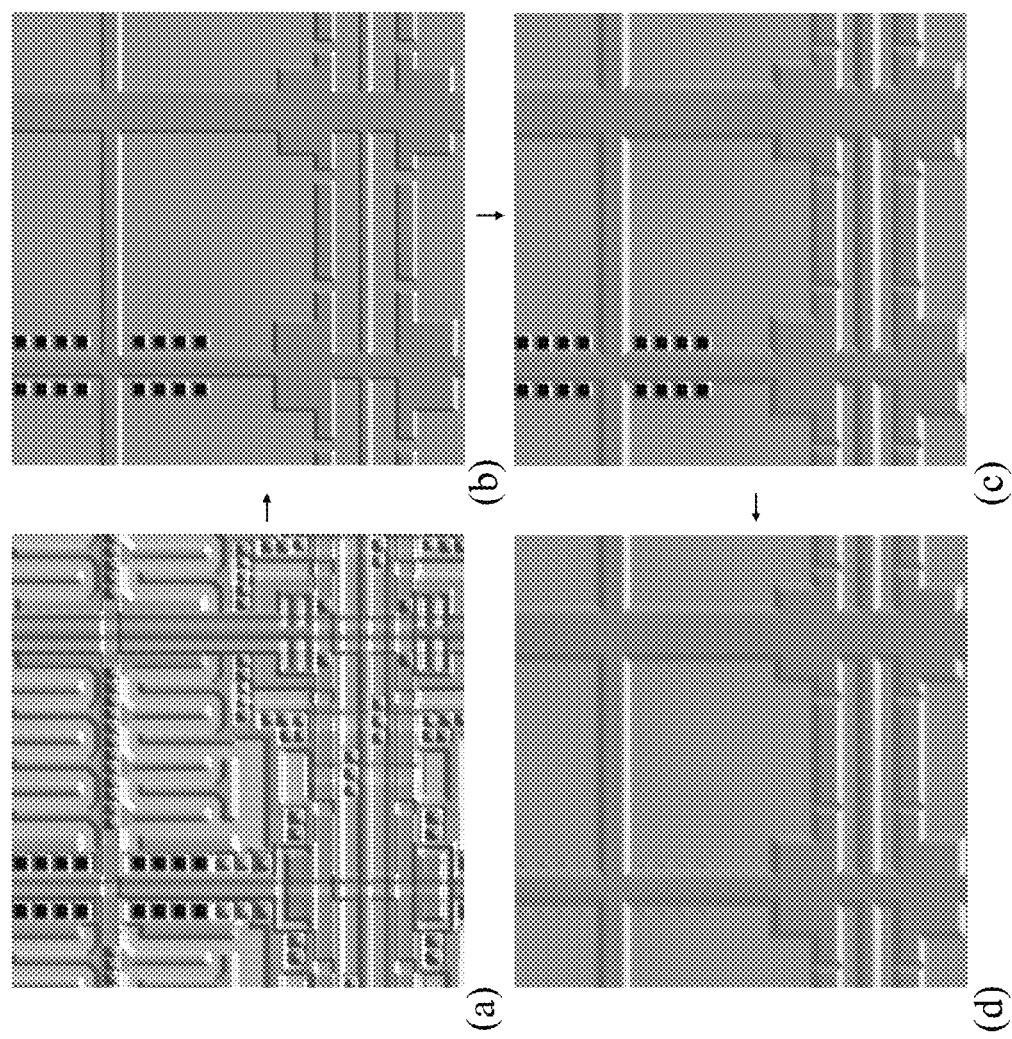
FIG. 32(a), obtained from calculations and corresponding exactly to FIG. 24(a), is a top view of a two-stage, in-pixel amplifier array in the region of a single pixel, showing the native topology of the top continuous photodiode structure, and included for purposes of comparisons with the remaining views in this figure.
FIG. 32(b), obtained from the same calculations used for FIG. 27, shows the improvement in surface topology, relative to FIG. 32(a), achieved through complete planarization of passivation #2.
FIG. 32(c), obtained from the same calculations used for FIG. 29, shows the improvement in surface topology, relative to FIG. 32(b), achieved through smoothing of the peripheral edges of the bottom electrode of the photodiode.
FIG. 32(d), obtained from calculations, shows the improvement in surface topology, relative to FIG. 32(c), achieved through narrowing of the vias that connect the bottom electrode of the photodiode with the back contact and filling those vias with metal.
Figure 33:
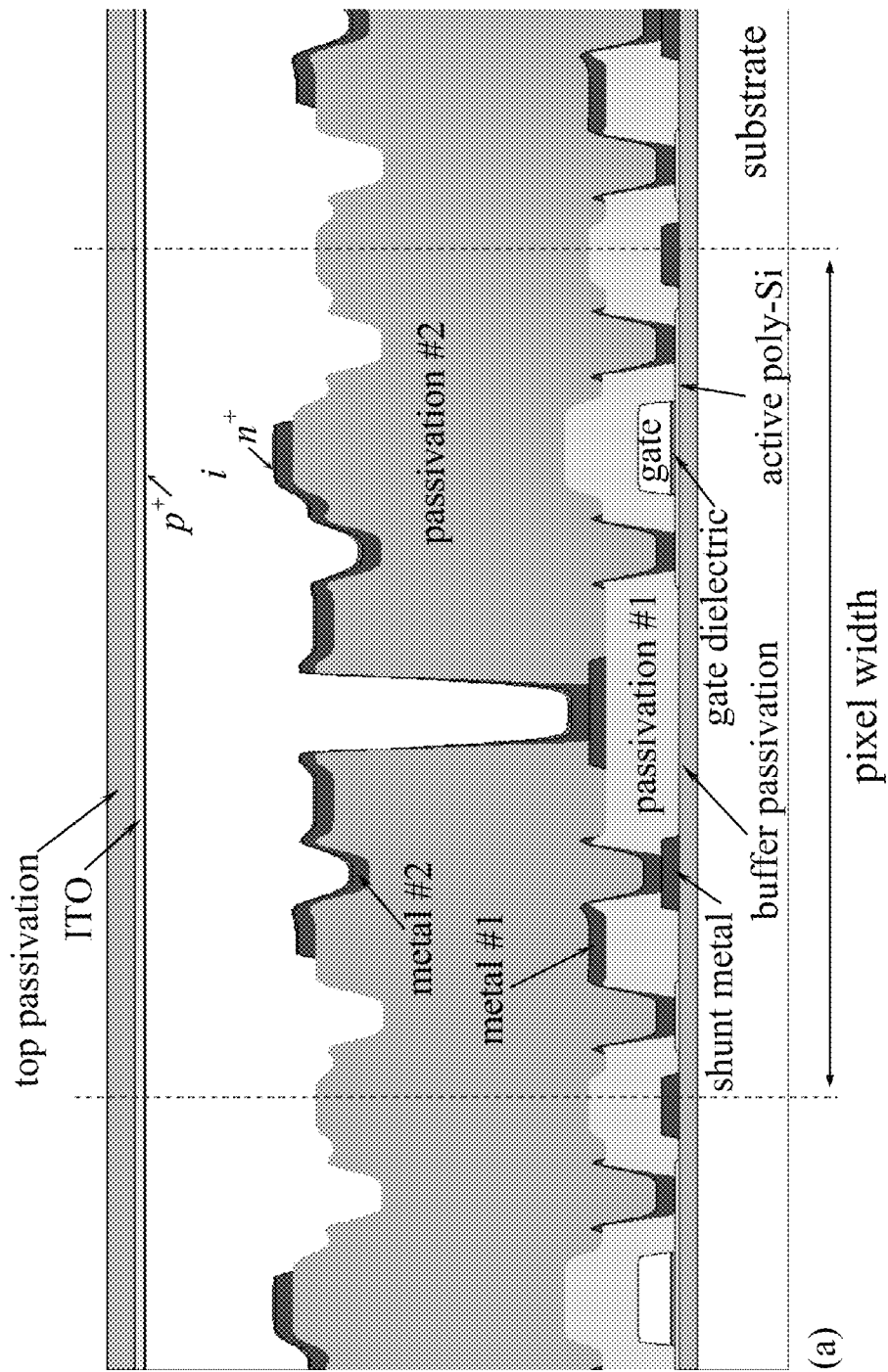
FIG. 33(a) is a calculated cross sectional view of an indirect detection array, corresponding to FIG. 21, but with a more uniform topology achieved through complete planarization of the layer of intrinsic a-Si in the photodiode.
FIG. 33(b) is a calculated cross sectional view of an indirect detection array, corresponding to FIG. 21, but with a more uniform topology achieved through partial planarization of the layer of intrinsic a-Si in the photodiode.
Figure 33:
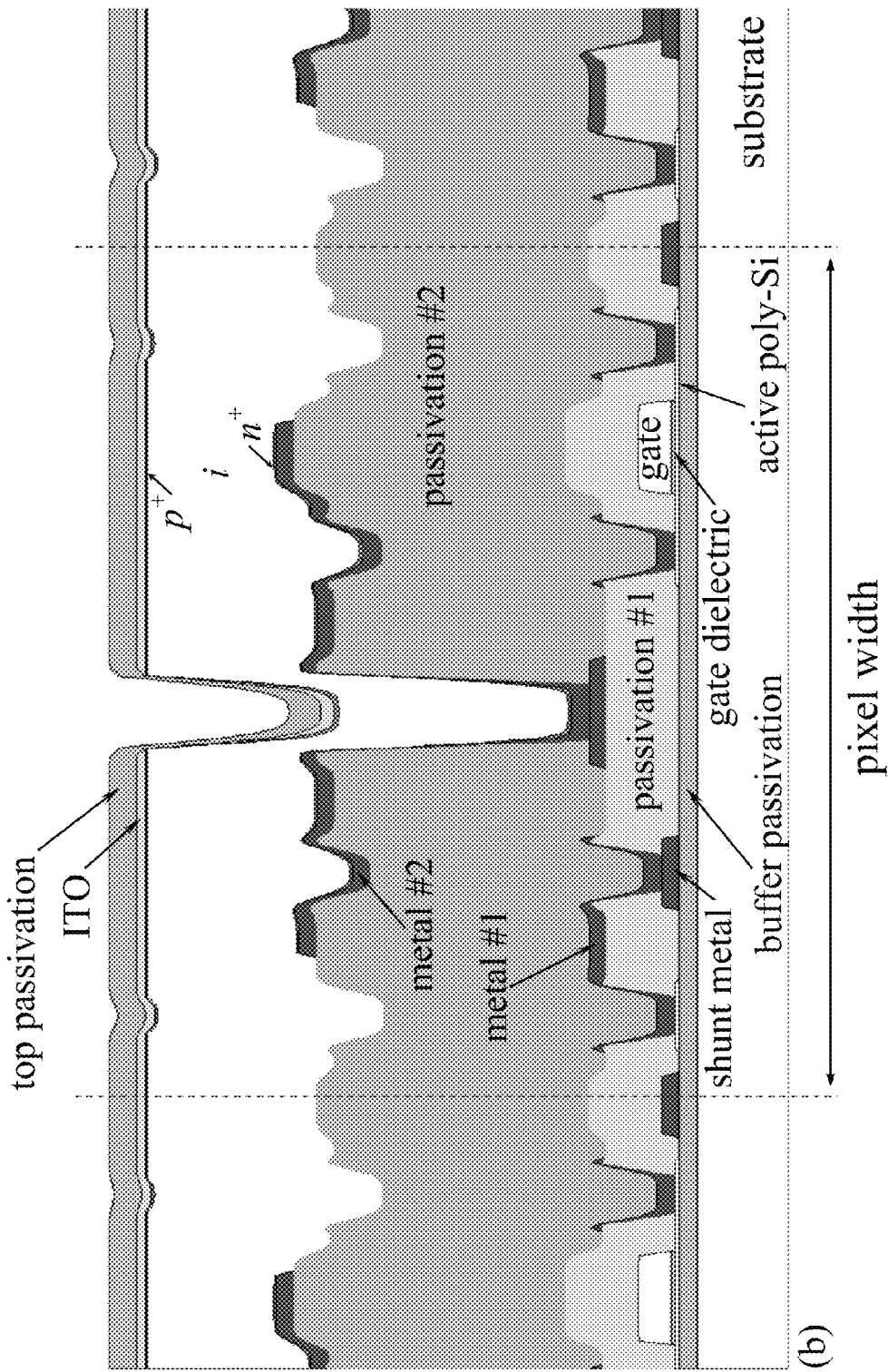
Figure 34:
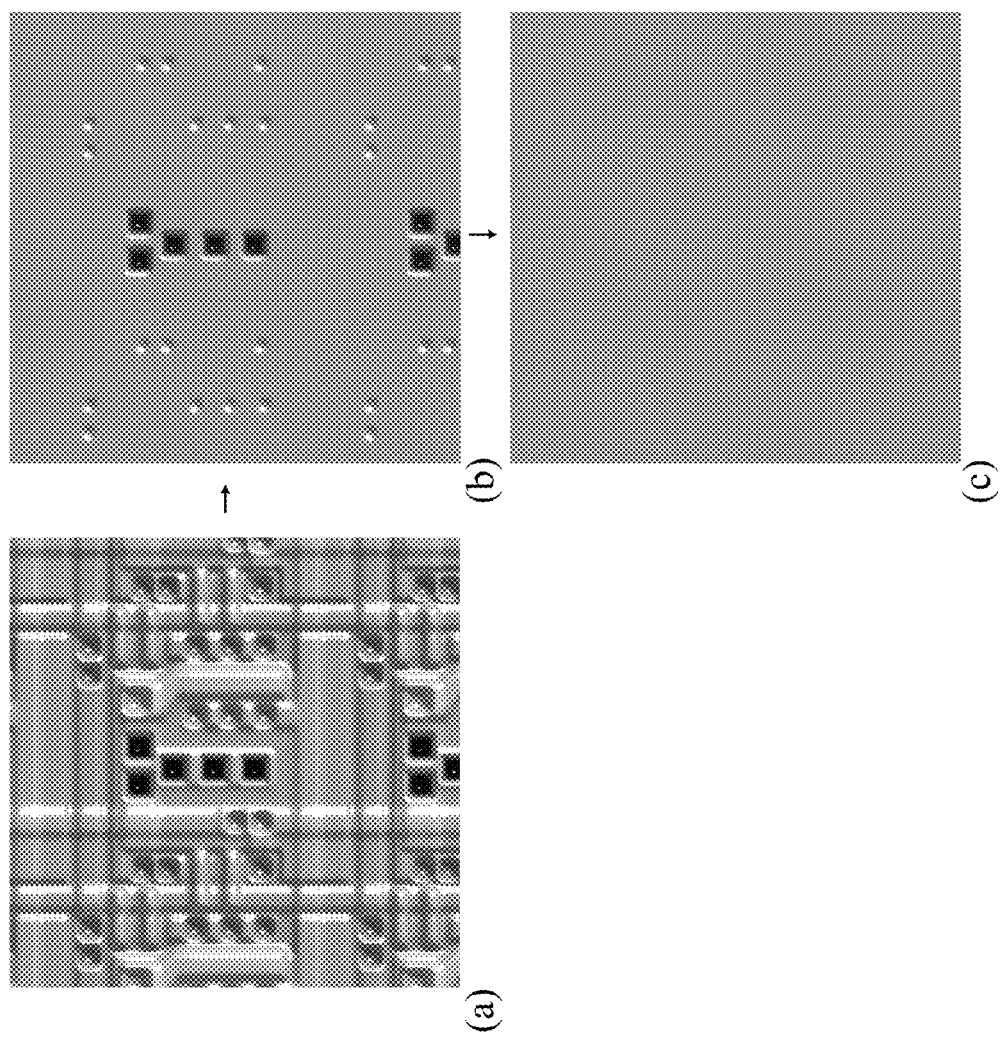
FIG. 34(a), obtained from calculations and corresponding exactly to FIG. 23(a), is a top view of a one-stage, in-pixel amplifier array in the region of a single pixel, showing the native topology of the top continuous photodiode structure, and included for purposes of comparisons with the remaining views in this figure.
FIG. 34(b), obtained from the same calculations used for FIG. 33(b), shows improvement in surface topology, relative to 34(a), achieved through partial planarization of the layer of intrinsic a-Si in the photodiode.
FIG. 34(c), obtained from the same calculations used for FIG. 33(a), shows improvement in surface topology, relative to 34(a), achieved through complete planarization of the layer of intrinsic a-Si in the photodiode.

As is clear from the dramatic results shown in FIGS. 31, 32, and 34, the invention provides a capability to remove topological non-uniformities associated with edges of pixel circuitry elements. The planarization techniques (as described above) planarize layers covering pixel circuitry elements or array features such as the TFTs (including the source, drain and gate of TFTs), diodes, capacitors and resistors, as well as vias, traces, control lines, address lines, ground planes, electrode surfaces, light blocking surfaces, bias lines, back contacts and bottom electrodes of the photodiode (all of which are fabricated from multiple metal, passivation, or dielectric layers), discussed above and such as shown in the sectional views of FIGS. 26-30 and 33. In this manner, the invention is not limited to planarization over thin film transistor elements. For example, even the effects of non-uniformities associated with all the TFT pixel circuitry elements or array features (including but not limited to control and address lines) can be mitigated by planarization of subsequent layers deposited over these structures, including for example the electrical via interconnects through the lower passivation layer #1 (as shown for example in FIG. 26). Even the non-uniformity effects introduced by either one-stage in-pixel amplifier designs (as in FIGS. 17, 21, and 23) or two-stage in-pixel amplifier designs (as in FIGS. 20, 22, and 24) can be mitigated by planarization of subsequent layers deposited over these structures.

In light of the detailed description above, various elements of the different embodiments of the invention, but not otherwise limiting the invention, are described below in more general terms in order to illustrate the features of the present invention.

In a first illustrated embodiment, a radiation sensor includes a scintillation layer configured to emit photons upon interaction with ionizing radiation and a photodetector including in order a first electrode, a photosensitive layer, and a photon-transmissive second electrode disposed in proximity to the scintillation layer. The photosensitive layer is configured to generate electron-hole pairs upon interaction with a part of the photons. The radiation sensor includes pixel circuitry electrically connected to the first electrode and configured to measure an imaging signal indicative of the electron-hole pairs generated in the photosensitive layer and a planarization layer disposed on the pixel circuitry between the first electrode and the pixel circuitry such that the first electrode is above a plane including the pixel circuitry. A surface of at least one of the first electrode and the second electrode at least partially overlaps the pixel circuitry and has a surface inflection above features of the pixel circuitry. The surface inflection has a radius of curvature greater than one half micron.

The surface inflection can have a radius of curvature greater than one micron, greater than five microns, greater than ten microns, or greater than one hundred microns, for example depending on the degree of planarization desired or achieved. The planarization layer can then completely or partially planarize over the features of the pixel circuitry, over array features, over electrical via interconnects connecting to the source or drain of TFTs, over one-stage in-pixel amplifier elements, and/or over two-stage in-pixel amplifier elements. The planarization layer can be at least one of a passivation layer, a dielectric layer, or an insulation layer.

In one aspect of this embodiment, the radiation sensor can include address and data lines disposed underneath the photodetector, and the planarization layer is disposed on the address and data lines and on vias of the address and data lines. Further, an electrical via interconnect can extend through the planarization layer and connect the first electrode to the pixel circuitry. A surface inflection of the electrical via interconnect in contact with the photosensitive layer can have a radius of curvature greater than one half micron, greater than one micron, greater than five microns, greater than ten microns, and greater than one hundred microns.

In one aspect of this embodiment, the photosensitive layer can be one of a p-i-n semiconductor stack, a n-i-p semiconductor stack, or a metal insulator semiconductor stack. The pixel circuitry can include one of thin film transistors, diodes, capacitors, resistors, traces, vias, control lines, address lines, and ground planes. The pixel circuitry can be one of an amorphous semiconductor transistor or a polycrystalline semiconductor transistor or a microcrystalline semiconductor transistor. The pixel circuitry can include at least one of an addressing transistor, an amplifier transistor, and a reset transistor. The pixel circuitry can be at least one of amorphous silicon, low temperature amorphous silicon, and microcrystalline silicon. The pixel circuitry can be at least one of a silicon semiconductor, an oxide semiconductor, a chalcogenide semiconductor, a cadmium selenide semiconductor, an organic semiconductor, an organic small molecule or polymer semiconductor, carbon nanotubes, or graphene, or other semiconducting materials.

In one aspect of this embodiment, the photosensitive layer can be at least one of 1) a continuous photosensitive layer extending across plural photodetector pixels or 2) discrete photosensitive layers associated with respective ones of the plural photodetector pixels. The scintillation layer can be at least one of CsI:Tl, $Gd_2O_2S$:Tb, CsI:Na, NaI:Tl, $CaWO_4$, $ZnWO_4$, $CdWO_4$, $Bi_4Ge_3O_{12}$, $Lu_{1.8}Yb_{0.2}SiO_5$:Ce, $Gd_2SiO_5$:Ce, $BaFCl$:$Eu^{2+}$, $BaSO_4$:$Eu^{2+}$, $BaFBr$:$Eu^{2+}$, $LaOBr$:$Tb^{3+}$, $LaOBr$:$Tm^{3+}$, $La_2O_2S$:$Tb^{3+}$, $Y_2O_2S$:$Tb^{3+}$, $YTaO_4$, $YTaO_4$:Nb, ZnS:Ag, (Zn,Cd)S:Ag, $ZnSiO_4$:$Mn^{2+}$, CsI, LiI:$Eu^{2+}$, $PbWO_4$, $Bi_4Si_3O_{12}$, $Lu_2SiO_5$:$Ce^{3+}$, $YAlO_3$:$Ce^{3+}$, CsF, $CaF_2$:$Eu^{2+}$, $BaF_2$, $CeF_3$, $Y_{1.34}Gd_{0.6}O_3$:$Eu^{3+}$, Pr, $Gd_2O_2S$:$Pr^{3+}$, Ce, SCGI, HFG:$Ce^{3+}$ (5%) and $C_{14}H_{10}$, or other scintillator materials.

In one aspect of this embodiment, the radiation sensor can include a base substrate supporting the pixel circuitry, the photodetector, and the scintillation layer, and can include a plurality of photodetector pixels arranged in a regular pattern on the base substrate. In one aspect of this embodiment, the photon-transmissive second electrode can form a bias plane for the plurality of the photodetector pixels. A part of the pixel circuitry can be disposed on the base substrate in a gap region between adjacent photodetector pixels. This part can include one of thin film transistors, diodes, capacitors, resistors, vias, traces, control lines, address lines, and ground planes. In one aspect of this embodiment, the first electrode can have beveled ends terminating near the gap region.

In one aspect of this embodiment, a dark current, normalized to unit photodetector area, between the first electrode and the photon-transmissive second electrode can be less than 10 $pA/mm^2$, or less than 5 $pA/mm^2$, or less than 1 $pA/mm^2$, or less than 0.5 $pA/mm^2$. The level of dark current to some degree being coupled to the degree of planarization and the radius of curvature of the surface inflection(s) discussed above. In one aspect of this embodiment, an electric field in regions in the photosensitive layer proximate the surface inflection can be greater than 60 percent and less than 300 percent of an electric field in the photosensitive layer between a pair of parallel first and second electrodes. The variation of the electric field to some degree being coupled to the degree of planarization and the radius of curvature of the surface inflection(s) discussed above.

In one aspect of this embodiment, the sensor can include a metal plate disposed on the scintillation layer or disposed on an encapsulation on the scintillation layer.

In a second illustrated embodiment, a radiation sensor includes a scintillation layer configured to emit photons upon interaction with ionizing radiation, a photodetector including in order a first electrode, a photosensitive layer, and a photon-transmissive second electrode disposed in proximity to the scintillation layer. The photosensitive layer is configured to generate electron-hole pairs upon interaction with a part of the photons. The radiation sensor includes pixel circuitry electrically connected to the first electrode and configured to measure an imaging signal indicative of the electron-hole pairs generated in the photosensitive layer, and includes a planarization layer disposed on the pixel circuitry between the first electrode and the pixel circuitry such that the first electrode is above a plane including the pixel circuitry. The planarization layer has a first surface inflection along a peripheral edge of features of the pixel circuitry elements, the first electrode has a second surface inflection above the first surface inflection and on a surface of the planarization layer opposite the base substrate, and the second surface inflection has a radius of curvature greater than one-half micron.

In one aspect of this embodiment, the second surface inflection can have a radius of curvature greater than one micron, greater than five microns, greater than ten microns, or greater than one hundred microns, for example depending on the degree of planarization desired or achieved. The planarization layer can then completely or partially planarize over the features of the pixel circuitry, over array features, over electrical via interconnects connecting to the source or drain of TFTs, over one-stage in-pixel amplifier elements, and/or over two-stage in-pixel amplifier elements. The planarization layer can be at least one of a passivation layer, a dielectric layer, or an insulation layer.

In one aspect of this embodiment, the radiation sensor can include address and data lines disposed underneath the photodetector, and the planarization layer is disposed on the address and data lines and on vias of the address and data lines. Further, an electrical via interconnect can extend through the planarization layer and connect the first electrode to the pixel circuitry. A surface inflection of the electrical via interconnect in contact with the photosensitive layer can have a radius of curvature greater than one half micron, greater than one micron, greater than five microns, greater than ten microns, or greater than one hundred microns.

In one aspect of this embodiment, the photosensitive layer can be one of a p-i-n semiconductor stack, a n-i-p semiconductor stack, or a metal insulator semiconductor stack. The pixel circuitry can include one of thin film transistors, diodes, capacitors, resistors, traces, vias, control lines, address lines, and ground planes. The pixel circuitry can be one of an amorphous semiconductor transistor or a polycrystalline semiconductor transistor or a microcrystalline semiconductor transistor. The pixel circuitry can include at least one of an addressing transistor, an amplifier transistor, and a reset transistor. The pixel circuitry can be at least one of amorphous silicon, low temperature amorphous silicon, and microcrystalline silicon. The pixel circuitry can be at least one of a silicon semiconductor, an oxide semiconductor, a chalcogenide semiconductor, a cadmium selenide semiconductor, an organic semiconductor, an organic small molecule or polymer semiconductor, carbon nanotubes, or graphene, or other semiconducting materials.

In one aspect of this embodiment, the photosensitive layer can be at least one of 1) a continuous photosensitive layer extending across plural photodetector pixels or 2) discrete photosensitive layers associated with respective ones of the plural photodetector pixels. The scintillation layer can be at least one of CsI:Tl, $Gd_2O_2S$:Tb, CsI:Na, NaI:Tl, $CaWO_4$, $ZnWO_4$, $CdWO_4$, $Bi_4Ge_3O_{12}$, $Lu_{1.8}Yb_{0.2}SiO_5$:Ce, $Gd_2SiO_5$:Ce, $BaFCl$:$Eu^{2+}$, $BaSO_4$:$Eu^{2+}$, $BaFBr$:$Eu^{2+}$, $LaOBr$:$Tb^{3+}$, $LaOBr$:$Tm^{3+}$, $La_2O_2S$:$Tb^{3+}$, $Y_2O_2S$:$Tb^{3+}$, $YTaO_4$, $YTaO_4$:Nb, ZnS:Ag, (Zn,Cd)S:Ag, $ZnSiO_4$:$Mn^{2+}$, CsI, LiI:$Eu^{2+}$, $PbWO_4$, $Bi_4Si_3O_{12}$, $Lu_2SiO_5$:$Ce^{3+}$, $YAlO_3$:$Ce^{3+}$, CsF, $CaF_2$:$Eu^{2+}$, $BaF_2$, $CeF_3$, $Y_{1.34}Gd_{0.6}O_3$:$Eu^{3+}$, Pr, $Gd_2O_2S$:$Pr^{3+}$, Ce, SCGI, HFG:$Ce^{3+}$ (5%) and $C_{14}H_{10}$, or other scintillator materials.

In one aspect of this embodiment, the radiation sensor can include a base substrate supporting the pixel circuitry, the photodetector, and the scintillation layer. The radiation sensor can include a plurality of photodetector pixels arranged in a regular pattern on the base substrate. In one aspect of this embodiment, the photon-transmissive second electrode can form a bias plane for the plurality of the photodetector pixels. A part of the pixel circuitry can be disposed on the base substrate in a gap region between adjacent photodetector pixels. This part can include one of thin film transistors, diodes, capacitors, resistors, vias, traces, control lines, address lines, and ground planes. In one aspect of this embodiment, the first electrode can have beveled ends terminating near the gap region. The beveled edge can have a radius of curvature greater than one half micron, or greater than one micron, or greater than five microns, or greater than ten microns, or greater than one hundred microns.

In one aspect of this embodiment, a dark current, normalized to unit photodetector area, between the first electrode and the photon-transmissive second electrode can be less than 10 $pA/mm^2$, or less than 5 $pA/mm^2$, or less than 1 $pA/mm^2$, or less than 0.5 $pA/mm^2$. The level of dark current to some degree being coupled to the degree of planarization and the radius of curvature of the surface inflection(s) discussed above. In one aspect of this embodiment, an electric field in regions in the photosensitive layer proximate the surface inflection can be greater than 60 percent and less than 300 percent of an electric field in the photosensitive layer between a pair of parallel first and second electrodes. The variation of the electric field to some degree being coupled to the degree of planarization and the radius of curvature of the surface inflection(s) discussed above.

In one aspect of this embodiment, the sensor can include a metal plate disposed on the scintillation layer.

In a third illustrated embodiment, a radiation sensor includes a scintillation layer configured to emit photons upon interaction with ionizing radiation, a photodetector including in order a first electrode, a photosensitive layer, and a photon-transmissive second electrode disposed in proximity to the scintillation layer. The photosensitive layer is configured to generate electron-hole pairs upon interaction with a part of the photons. The radiation sensor includes pixel circuitry electrically connected to the first electrode and configured to measure an imaging signal indicative of the electron-hole pairs generated in the photosensitive layer, and includes a planarization layer disposed on the pixel circuitry between the first electrode and the pixel circuitry such that the first electrode is above a plane including the pixel circuitry. The photodetector has a dark current, normalized to unit photodetector area, between the first electrode and the photon-transmissive second electrode that is less than 10 $pA/mm^2$.

In one aspect of this embodiment, the planarization layer can be at least one of a passivation layer, a dielectric layer, or an insulation layer. In one aspect of this embodiment, a surface inflection of the first electrode above the pixel circuitry has a radius of curvature greater than one half micron, greater than one micron, greater than five microns, greater than ten microns, or greater than one hundred microns.

In one aspect of this embodiment, the dark current, normalized to unit photodetector area, can be less than 5 $pA/mm^2$, or less than 1 $pA/mm^2$, or less than 0.5 $pA/mm^2$. The level of dark current to some degree being coupled to the degree of planarization and the radius of curvature of the surface inflection(s) discussed above.

In a fourth illustrated embodiment, a radiation sensor includes a scintillation layer configured to emit photons upon interaction with ionizing radiation, a photodetector including in order a first electrode, a photosensitive layer, and a photon-transmissive second electrode disposed in proximity to the scintillation layer. The photosensitive layer is configured to generate electron-hole pairs upon interaction with a part of the photons. The radiation sensor includes pixel circuitry electrically connected to the first electrode and configured to measure an imaging signal indicative of the electron-hole pairs generated in the photosensitive layer, and includes a planarization layer disposed on the pixel circuitry between the first electrode and the pixel circuitry such that the first electrode is above a plane including the pixel circuitry. The photodetector has a level of charge trapping per photodetector pixel, quantified by the amount of imaging signal (indicative of the electron-hole pairs generated in the photosensitive layer) lost to trapping during a single radiographic frame, and expressed as a percentage of the imaging signal obtained under conditions where charge trapping and charge release are in equilibrium, that is less than ~20%.

In one aspect of this embodiment, the planarization layer can be at least one of a passivation layer, a dielectric layer, or an insulation layer. In one aspect of this embodiment, a surface inflection of the first electrode above the pixel circuitry has a radius of curvature greater than one half micron, greater than one micron, greater than five microns, greater than ten microns, or greater than one hundred microns.

In one aspect of this embodiment, the level of charge trapping per photodetector pixel can be less than 15%, less than 10%, or less than 5%, for example depending on the degree of planarization desired or achieved.

In a fifth illustrated embodiment, a radiation sensor includes a scintillation layer configured to emit photons upon interaction with ionizing radiation, a photodetector including in order a first electrode, a photosensitive layer, and a photon-transmissive second electrode disposed in proximity to the scintillation layer. The photosensitive layer is configured to generate electron-hole pairs upon interaction with a part of the photons. The radiation sensor includes pixel circuitry electrically connected to the first electrode and configured to measure an imaging signal indicative of the electron-hole pairs generated in the photosensitive layer, and includes a planarization layer disposed on the pixel circuitry between the first electrode and the pixel circuitry such that the first electrode is above a plane including the pixel circuitry. The photodetector has a charge release per photodetector pixel, quantified by the amount of imaging signal (indicative of the electron-hole pairs generated in the photosensitive layer) released from trapping states during the first frame acquired in the absence of radiation following a series of frames acquired with radiation and under conditions where charge trapping and charge release are in equilibrium, and expressed as a percentage of the imaging signal obtained under conditions where charge trapping and release are in equilibrium, that is less than ~15%.

In one aspect of this embodiment, the planarization layer can be at least one of a passivation layer, a dielectric layer, or an insulation layer. In one aspect of this embodiment, a surface inflection of the first electrode above the pixel circuitry has a radius of curvature greater than one half micron, greater than one micron, greater than five microns, greater than ten microns, or greater than one hundred microns.

In one aspect of this embodiment, the charge release per photodetector pixel can be less than 10%, less than 5%, or less than 3%, for example depending on the degree of planarization desired or achieved.

In a sixth illustrated embodiment, a radiation sensor includes a scintillation layer configured to emit photons upon interaction with ionizing radiation, a photodetector including in order a first electrode, a photosensitive layer, and a photon-transmissive second electrode disposed in proximity to the scintillation layer. The photosensitive layer is configured to generate electron-hole pairs upon interaction with a part of the photons. The radiation sensor includes pixel circuitry electrically connected to the first electrode and configured to measure an imaging signal indicative of the electron-hole pairs generated in the photosensitive layer, and includes a planarization layer disposed on the pixel circuitry between the first electrode and the pixel circuitry such that the first electrode is above a plane including the pixel circuitry. The photodetector has a lag per photodetector pixel, quantified by the amount of imaging signal (indicative of the electron-hole pairs generated in the photosensitive layer, and that originates from charge trapped in one or more previous frames) released from trapping states during the first frame acquired in the absence of radiation following one, or a series of frames acquired with radiation, and expressed as a percentage of the imaging signal from the previous frame, that is less than ~15%.

In one aspect of this embodiment, the planarization layer can be at least one of a passivation layer, a dielectric layer, or an insulation layer. In one aspect of this embodiment, a surface inflection of the first electrode above the pixel circuitry has a radius of curvature greater than one half micron, greater than one micron, greater than five microns, greater than ten microns, or greater than one hundred microns.

In one aspect of this embodiment, the lag per photodetector pixel can be less than 10%, less than 5%, or less than 3%, for example depending on the degree of planarization desired or achieved.

In a seventh illustrated embodiment, a radiation sensor includes a scintillation layer configured to emit photons upon interaction with ionizing radiation, a photodetector including in order a first electrode, a photosensitive layer, and a photon-transmissive second electrode disposed in proximity to the scintillation layer. The photosensitive layer is configured to generate electron-hole pairs upon interaction with a part of the photons. The radiation sensor includes pixel circuitry electrically connected to the first electrode and configured to measure an imaging signal indicative of the electron-hole pairs generated in the photosensitive layer, and includes a planarization layer disposed on the pixel circuitry between the first electrode and the pixel circuitry such that the first electrode is above a plane including the pixel circuitry. The first electrode can extend over a part of the pixel circuitry and can have a lateral edge, a longitudinal edge, and a corner at the intersection of the lateral and longitudinal edges. At least one of the lateral edge and the longitudinal edge can be a beveled edge.

In one aspect of this embodiment, the corner can be a rounded corner connecting the lateral edge to the longitudinal edge. The beveled edge can have a radius of curvature greater than one half micron, or greater than one micron, or greater than five microns, or greater than ten microns, or greater than one hundred microns. In one aspect of this embodiment, the planarization layer can be at least one of a passivation layer, a dielectric layer, or an insulation layer.

In an eighth illustrated embodiment, a radiation sensor includes a scintillation layer configured to emit photons upon interaction with ionizing radiation, a photodetector pixel including in order a first electrode, a photosensitive layer, and a photon-transmissive second electrode disposed in proximity to the scintillation layer. The photosensitive layer is configured to generate electron-hole pairs upon interaction with a part of the photons. The radiation sensor includes pixel circuitry electrically connected to the first electrode and configured to measure an imaging signal indicative of the electron-hole pairs generated in the photosensitive layer, and includes a passivation layer disposed on the pixel circuitry between the first electrode and the pixel circuitry such that the first electrode is above a plane including the pixel circuitry. The passivation layer has a first surface inflection above the pixel circuitry elements. The second electrode has a second surface inflection above the first surface inflection. The second surface inflection has a radius of curvature greater than one-half a micron.

The second surface inflection can have a radius of curvature greater than one micron, or greater than five microns, or greater than ten microns, or greater than one hundred microns. The passivation layer can be a planarized passivation layer. The photosensitive layer can be a planarized photosensitive layer.

In a ninth illustrated embodiment, a radiation sensor includes a scintillation layer configured to emit photons upon interaction with ionizing radiation, a photodetector including in order a first electrode, a photosensitive layer, and a photon-transmissive second electrode disposed in proximity to the scintillation layer. The photosensitive layer is configured to generate electron-hole pairs upon interaction with a part of the photons. The radiation sensor includes pixel circuitry electrically connected to the first electrode and configured to measure an imaging signal indicative of the electron-hole pairs generated in the photosensitive layer, and includes a planarization layer disposed on the pixel circuitry between the first electrode and the pixel circuitry such that the first electrode is above a plane including the pixel circuitry. A surface of at least one of the first electrode and the second electrode can at least partially overlap the pixel circuitry and can exhibit no surface features indicative of the underlying pixel circuitry.

In the above first through ninth illustrated embodiments and in those embodiments discussed below, the planarization layer can then completely or partially planarize over some of the features of the pixel circuitry. The planarization layer can be at least one of a passivation layer, a dielectric layer, or an insulation layer. A surface inflection of the first electrode above the pixel circuitry can have a radius of curvature greater than one half micron, greater than one micron, greater than five microns, greater than ten microns, or greater than one hundred microns, for example depending on the degree of planarization desired or achieved. A metal plate can be disposed on the scintillation layer. Further, in the above first through ninth illustrated embodiments and in those embodiments discussed below, an electrical via interconnect can extend through the planarization layer and connect the first electrode to the pixel circuitry. A surface inflection of the electrical via interconnect in contact with the photosensitive layer can have a radius of curvature greater than one half micron, greater than one micron, greater than five microns, greater than ten microns, and greater than one hundred microns.

In the above first through ninth illustrated embodiments and in those embodiments discussed below, the photosensitive layer can be one of a p-i-n semiconductor stack, a n-i-p semiconductor stack, or a metal insulator semiconductor stack. The pixel circuitry can include one of thin film transistors, diodes, capacitors, resistors, traces, vias, control lines, address lines, and ground planes. The pixel circuitry can be one of an amorphous semiconductor transistor or a polycrystalline semiconductor transistor or a microcrystalline semiconductor transistor. The pixel circuitry can include at least one of an addressing transistor, an amplifier transistor, and a reset transistor. The pixel circuitry can be at least one of amorphous silicon, low temperature amorphous silicon, and microcrystalline silicon. The pixel circuitry can be at least one of a silicon semiconductor, an oxide semiconductor, a chalcogenide semiconductor, a cadmium selenide semiconductor, an organic semiconductor, an organic small molecule or polymer semiconductor, carbon nanotubes, or graphene, or other semiconducting materials.

In the above first through ninth illustrated embodiments and in those embodiments discussed below, the photosensitive layer can be at least one of 1) a continuous photosensitive layer extending across plural photodetector pixels or 2) discrete photosensitive layers associated with respective ones of the plural photodetector pixels. The scintillation layer can be at least one of CsI:Tl, $Gd_2O_2S$:Tb, CsI:Na, NaI:Tl, $CaWO_4$, $ZnWO_4$, $CdWO_4$, $Bi_4Ge_3O_{12}$, $Lu_{1.8}Yb_{0.2}SiO_5$:Ce, $Gd_2SiO_5$:Ce, $BaFCl$:$Eu^{2+}$, $BaSO_4$:$Eu^{2+}$, $BaFBr$:$Eu^{2+}$, LaOBr:$Tb^{3+}$, LaOBr:$Tm^{3+}$, $La_2O_2S$:$Tb^{3+}$, $Y_2O_2S$:$Tb^{3+}$, $YTaO_4$, $YTaO_4$:Nb, ZnS:Ag, (Zn,Cd)S:Ag, $ZnSiO_4$:$Mn^{2+}$, CsI, LiI:$Eu^{2+}$, $PbWO_4$, $Bi_4Si_3O_{12}$, $Lu_2SiO_5$:$Ce^{3+}$, $YAlO_3$:$Ce^{3+}$, CsF, $CaF_2$:$Eu^{2+}$, $BaF_2$, $CeF_3$, $Y_{1.34}Gd_{0.6}O_3$:$Eu^{3+}$, Pr, $Gd_2O_2S$:$Pr^{3+}$, Ce, SCGI, HFG:$Ce^{3+}$ (5%) and $C_{14}H_{10}$, or other scintillator materials.

In the above first through ninth illustrated embodiments and in those embodiments discussed below, the radiation sensor can include a base substrate supporting the pixel circuitry, the photodetector, and the scintillation layer. The radiation sensor can include a plurality of photodetector pixels arranged in a regular pattern on the base substrate. In one aspect of this embodiment, the photon-transmissive second electrode can form a bias plane for the plurality of the photodetector pixels. A part of the pixel circuitry can be disposed on the base substrate in a gap region between adjacent photodetector pixels. This part can include one of thin film transistors, diodes, capacitors, resistors, vias, traces, control lines, address lines, and ground planes. The first electrode can have beveled ends terminating near the gap region. Examples of preferred combinations of these features are provided below.

In the above first through ninth illustrated embodiments and in those embodiments discussed below, a metal plate can be disposed on the ionizing radiation transmissive second electrode or can be disposed on an encapsulation layer on the ionizing radiation transmissive second electrode. Further, the planarization layer can at least partially planarize over array features, over electrical via interconnects connecting to the source or drain of TFTs, over one-stage in-pixel amplifier elements, or over two-stage in-pixel amplifier elements.

In a tenth illustrated embodiment, a radiation sensor includes a photoconductor detector including in order a first electrode, a photoconductive layer, and an ionizing radiation transmissive second electrode. The photoconductive layer is configured to generate electron-hole pairs upon interaction with ionizing radiation. The radiation sensor includes pixel circuitry electrically connected to the first electrode and configured to measure an imaging signal indicative of the electron-hole pairs generated in the photoconductive layer and a planarization layer disposed on the pixel circuitry between the first electrode and the pixel circuitry such that the first electrode is above a plane including the pixel circuitry. A surface of at least one of the first electrode and the second electrode at least partially overlaps the pixel circuitry and has a surface inflection above features of the pixel circuitry. The surface inflection has a radius of curvature greater than one half micron.

In one aspect of this embodiment, the planarization layer can be at least one of a passivation layer, a dielectric layer, or an insulation layer. In one aspect of this embodiment, a surface inflection of the first electrode above the pixel circuitry has a radius of curvature greater than one half micron, greater than one micron, greater than five microns, greater than ten microns, or greater than one hundred microns. Further, an electrical via interconnect can extend through the planarization layer and connect the first electrode to the pixel circuitry. A surface inflection of the electrical via interconnect in contact with the photosensitive layer can have a radius of curvature greater than one half micron, greater than one micron, greater than five microns, greater than ten microns, and greater than one hundred microns.

In one aspect of this embodiment, the pixel circuitry can include one of thin film transistors, diodes, capacitors, resistors, traces, vias, control lines, address lines, and ground planes. The pixel circuitry can be one of an amorphous semiconductor transistor or a polycrystalline semiconductor transistor or a microcrystalline semiconductor transistor. The pixel circuitry can include at least one of an addressing transistor, an amplifier transistor, and a reset transistor. The pixel circuitry can be at least one of amorphous silicon, low temperature amorphous silicon, and microcrystalline silicon. The pixel circuitry can be at least one of a silicon semiconductor, an oxide semiconductor, a chalcogenide semiconductor, a cadmium selenide semiconductor, an organic semiconductor, an organic small molecule or polymer semiconductor, carbon nanotubes, or graphene, or other semiconducting materials.

In one aspect of this embodiment, a metal plate can be disposed on the ionizing radiation transmissive second electrode or can be disposed on an encapsulation layer on the ionizing radiation transmissive second electrode. Further, the planarization layer can at least partially planarize over array features, over electrical via interconnects connecting to the source or drain of TFTs, over one-stage in-pixel amplifier elements, or over two-stage in-pixel amplifier elements.

In one aspect of this embodiment, the photoconductive layer can be at least one of 1) a continuous photoconductive layer extending across plural photoconductor detector pixels or 2) discrete photoconductive layers associated with respective ones of the plural photoconductor detector pixels. The radiation sensor can include a base substrate supporting the pixel circuitry and the photoconductive layer. The radiation sensor can include a plurality of photoconductor detector pixels arranged in a regular pattern on the base substrate. In one aspect of this embodiment, the ionizing radiation transmissive second electrode can form a bias plane for the plurality of the photoconductor detector pixels. A part of the pixel circuitry can be disposed on the base substrate in a gap region between adjacent photoconductor detector pixels. This part can include one of thin film transistors, diodes, capacitors, resistors, vias, traces, control lines, address lines, and ground planes. The first electrode can have beveled ends terminating near the gap region.

Accordingly, the tenth illustrated embodiment includes similar features as the first illustrated embodiment above, but has no need for the scintillator layer and the photosensitive layers in the first illustrated embodiment. Here, in the tenth illustrated embodiment, the photoconductive layer generates electron-hole pairs upon interaction with x-rays or other ionizing radiation. The photoconductive layer can include at least one of VB-VIB, VB-VIIB, IIB-VIB, IIB-VB, IIIB-VB, IIIB-VIB, IB-VIB, and IVB-VIIB semiconductors, and more specifically can include at least one of a-Se, $PbI_2$, $HgI_2$, PbO, CdZnTe, CdTe, $Bi_2S_3$, $Bi_2$, $Se_3$, $BiI_3$, $BiBr_3$, CdS, CdSe, HgS, $Cd_2P_3$, InAs, InP, $In_2S_3$, $In_2Se_3$, $Ag_2S$, $PbI_4^{-2}$ and $Pb_2I_7^{-3}$.

Otherwise, the features described above with regard to the first embodiment can be included in the tenth illustrated embodiment. This same generalization applies with regard to the remaining embodiments below, and will be selectively repeated below for clarity. Further, values and ranges of radius of curvature, dark current, level of charge trapping, charge release, and lag described above suitably apply here. Examples of preferred combinations of such parameters are provided below.

In an eleventh illustrated embodiment, a radiation sensor includes a photoconductor detector including in order a first electrode, a photoconductive layer, and an ionizing radiation transmissive second electrode. The photoconductive layer is configured to generate electron-hole pairs upon interaction with ionizing radiation. The radiation sensor includes pixel circuitry electrically connected to the first electrode and configured to measure an imaging signal indicative of the electron-hole pairs generated in the photoconductive layer and a planarization layer disposed on the pixel circuitry between the first electrode and the pixel circuitry such that the first electrode is above a plane including the pixel circuitry. The planarization layer has a first surface inflection along a peripheral edge of features of the pixel circuitry elements. The first electrode has a second surface inflection above the first surface inflection and on a surface of the planarization layer opposite the base substrate. The second surface inflection has a radius of curvature greater than one-half micron.

In a twelfth illustrated embodiment, a radiation sensor includes a photoconductor detector including in order a first electrode, a photoconductive layer, and an ionizing radiation transmissive second electrode. The photoconductive layer is configured to generate electron-hole pairs upon interaction with ionizing radiation. The radiation sensor includes pixel circuitry electrically connected to the first electrode and configured to measure an imaging signal indicative of the electron-hole pairs generated in the photoconductive layer and a planarization layer disposed on the pixel circuitry between the first electrode and the pixel circuitry such that the first electrode is above a plane including the pixel circuitry. The photoconductor detector has a dark current, normalized to unit photoconductor detector area, between the first electrode and the second electrode that is less than 10 $pA/mm^2$.

In one aspect of this embodiment, the dark current, normalized to unit photoconductor detector area, can be less than 5 $pA/mm^2$, or less than 1 $pA/mm^2$, or less than 0.5 $pA/mm^2$. The level of dark current to some degree being coupled to the degree of planarization and the radius of curvature of the surface inflection(s) discussed above.

In a thirteenth illustrated embodiment, a radiation sensor includes a photoconductor detector including in order a first electrode, a photoconductive layer, and an ionizing radiation transmissive second electrode. The photoconductive layer is configured to generate electron-hole pairs upon interaction with ionizing radiation. The radiation sensor includes pixel circuitry electrically connected to the first electrode and configured to measure an imaging signal indicative of the electron-hole pairs generated in the photoconductive layer and a planarization layer disposed on the pixel circuitry between the first electrode and the pixel circuitry such that the first electrode is above a plane including the pixel circuitry. The photoconductor detector has a level of charge trapping per photoconductor detector pixel, quantified by the amount of imaging signal (indicative of the electron-hole pairs generated in the photoconductive layer) lost to trapping during a single radiographic frame, and expressed as a percentage of the imaging signal obtained under conditions where charge trapping and charge release are in equilibrium, that is less than ~20%.

In one aspect of this embodiment, the level of charge trapping per photoconductor detector pixel can be less than 15%, less than 10%, or less than 5%, for example depending on the degree of planarization desired or achieved.

In a fourteenth illustrated embodiment, a radiation sensor includes a photoconductor detector including in order a first electrode, a photoconductive layer, and an ionizing radiation transmissive second electrode. The photoconductive layer is configured to generate electron-hole pairs upon interaction with ionizing radiation. The radiation sensor includes pixel circuitry electrically connected to the first electrode and configured to measure an imaging signal indicative of the electron-hole pairs generated in the photoconductive layer and a planarization layer disposed on the pixel circuitry between the first electrode and the pixel circuitry such that the first electrode is above a plane including the pixel circuitry. The photoconductor detector has a charge release per photoconductor detector pixel, quantified by the amount of imaging signal (indicative of the electron-hole pairs generated in the photoconductive layer) released from trapping states during the first frame acquired in the absence of radiation following a series of frames acquired with radiation and under conditions where charge trapping and charge release are in equilibrium, and expressed as a percentage of the imaging signal obtained under conditions where charge trapping and release are in equilibrium, that is less than ~15%.

In one aspect of this embodiment, the charge release per photoconductor detector pixel can be less than 10%, less than 5%, or less than 3%, for example depending on the degree of planarization desired or achieved.

In a fifteenth illustrated embodiment, a radiation sensor includes a photoconductor detector including in order a first electrode, a photoconductive layer, and an ionizing radiation transmissive second electrode. The photoconductive layer is configured to generate electron-hole pairs upon interaction with ionizing radiation. The radiation sensor includes pixel circuitry electrically connected to the first electrode and configured to measure an imaging signal indicative of the electron-hole pairs generated in the photoconductive layer and a planarization layer disposed on the pixel circuitry between the first electrode and the pixel circuitry such that the first electrode is above a plane including the pixel circuitry. The photoconductor detector has a lag per photoconductor detector pixel, quantified by the amount of imaging signal (indicative of the electron-hole pairs generated in the photoconductive layer, and that originates from charge trapped in one or more previous frames) released from trapping states during the first frame acquired in the absence of radiation following one, or a series of frames acquired with radiation, and expressed as a percentage of the imaging signal from the previous frame, that is less than ~15%.

In one aspect of this embodiment, the lag per photoconductor detector pixel can be less than 10%, less than 5%, or less than 3%, for example depending on the degree of planarization desired or achieved.

In a sixteenth illustrated embodiment, a radiation sensor includes a photoconductor detector including in order a first electrode, a photoconductive layer, and an ionizing radiation transmissive second electrode. The photoconductive layer is configured to generate electron-hole pairs upon interaction with ionizing radiation. The radiation sensor includes pixel circuitry electrically connected to the first electrode and configured to measure an imaging signal indicative of the electron-hole pairs generated in the photoconductive layer and a planarization layer disposed on the pixel circuitry between the first electrode and the pixel circuitry such that the first electrode is above a plane including the pixel circuitry. The first electrode extends over the pixel circuitry and has a lateral edge, a longitudinal edge, and a corner at the intersection of the lateral and longitudinal edges. At least one of the lateral edge and the longitudinal edge includes a beveled edge.

In a seventeenth illustrated embodiment, a radiation sensor includes a photoconductor detector including in order a first electrode, a photoconductive layer, and an ionizing radiation transmissive second electrode. The photoconductive layer is configured to generate electron-hole pairs upon interaction with ionizing radiation. The radiation sensor includes pixel circuitry electrically connected to the first electrode and configured to measure an imaging signal indicative of the electron-hole pairs generated in the photoconductive layer and a passivation layer disposed on the pixel circuitry between the first electrode and the pixel circuitry such that the first electrode is above a plane including the pixel circuitry. The passivation layer has a first surface inflection above the pixel circuitry elements. The second electrode has a second surface inflection above the first surface inflection. The second surface inflection has a radius of curvature greater than one-half a micron.

The second surface inflection can have a radius of curvature greater than one micron, or greater than five microns, or greater than ten microns, or greater than one hundred microns. The passivation layer can be a planarized passivation layer. The photosensitive layer can be a planarized photoconductive layer.

In an eighteenth illustrated embodiment, a radiation sensor includes a photoconductor detector including in order a first electrode, a photoconductive layer, and an ionizing radiation transmissive second electrode. The photoconductive layer is configured to generate electron-hole pairs upon interaction with ionizing radiation. The radiation sensor includes pixel circuitry electrically connected to the first electrode and configured to measure an imaging signal indicative of the electron-hole pairs generated in the photoconductive layer and a planarization layer disposed on the pixel circuitry between the first electrode and the pixel circuitry such that the first electrode is above a plane including the pixel circuitry. A surface of at least one of the first electrode and the second electrode can at least partially overlap the pixel circuitry and can exhibit no surface features indicative of the underlying pixel circuitry.

In a nineteenth illustrated embodiment, a method for fabricating a radiation sensor includes forming pixel circuitry elements on a base substrate, forming a planarization layer over the pixel circuitry elements, forming a hole in the planarization layer to expose a connection to the pixel circuitry elements, metallizing the patterned hole, forming a first electrode in electrical contact to the metallized hole, and forming on the first electrode a layer sensitive to light or ionizing radiation. Forming the planarization layer provides, on a surface of the first electrode at least partially overlapping the pixel circuitry, a surface inflection, above features of the pixel circuitry, having a radius of curvature greater than one half micron.

In one aspect of this embodiment, a photosensitive layer and a photon-transmissive second electrode are formed on the first electrode, and a passivation layer is formed on the photon-transmissive second electrode, and a scintillation layer is formed on this passivation layer, the scintillation layer configured to emit photons upon interaction with ionizing radiation. In this instance, the photosensitive layer can be planarized or made planarized before forming the photon-transmissive second electrode.

In a different aspect of this embodiment, a photoconductive layer is formed on the first electrode (the photoconductive layer configured to generate electron-hole pairs upon interaction with x-rays or other ionizing radiation), and an ionizing radiation transmissive second electrode is formed on the photoconductive layer.

In these two aspects, a second electrode can be disposed on the passivation layer on the scintillation layer or on the encapsulation layer on the photoconductive layer. In these two aspects, a metal plate can be disposed on the scintillation layer or on the encapsulation on the scintillation layer, or on the encapsulation layer on the ionizing radiation transmissive second electrode).

In one aspect of this embodiment, the planarization layer can be formed to have a radius of curvature greater than one micron, greater than five microns, greater than ten microns, or greater than one hundred microns, for example depending on the degree of planarization desired or achieved. The planarization layer can be formed by chemical mechanical polishing of the deposited passivation layer. Alternatively, the planarization layer can be formed by spin coating a passivation layer and then chemical mechanical polishing of that passivation layer. Alternatively, the planarization layer can be formed by depositing on top of one (or a first) passivation layer another passivation layer using spin coating and then chemical mechanical polishing of the other (or second) passivation layer. The planarization layer can at least partially planarize over array features, over electrical via interconnects connecting to the source or drain of TFTs, over one-stage in-pixel amplifier elements, or over two-stage in-pixel amplifier elements.

In one aspect of this embodiment, ends of the first electrode near a gap region between adjacent pixels of the radiation sensor can be beveled. In one aspect of this embodiment, the metallized hole can be tapered to have a radius of curvature greater than one half micron, or greater than one micron, greater than five microns, greater than ten microns, or greater than one hundred microns, for example depending on the degree of planarization desired or achieved.

In one aspect of this nineteenth embodiment, the features listed in the aspects of the first illustrated embodiment for the pixel circuitry elements and the photosensitive layer can be formed on the base substrate. For instance, when forming a scintillation layer, at least one of CsI:Tl, $Gd_2O_2S$:Tb, CsI:Na, NaI:Tl, $CaWO_4$, $ZnWO_4$, $CdWO_4$, $Bi_4Ge_3O_{12}$, $Lu_{1.8}Yb_{0.2}SiO_5$:Ce, $Gd_2SiO_5$:Ce, $BaFCl$:$Eu^{2+}$, $BaSO_4$:$Eu^{2+}$, $BaFBr$:$Eu^{2+}$, LaOBr:$Tb^{3+}$, LaOBr:$Tm^{3+}$, $La_2O_2S$:$Tb^{3+}$, $Y_2O_2S$:$Tb^{3+}$, $YTaO_4$, $YTaO_4$:Nb, ZnS:Ag, (Zn,Cd)S:Ag, $ZnSiO_4$:$Mn^{2+}$, CsI, LiI:$Eu^{2+}$, $PbWO_4$, $Bi_4Si_3O_{12}$, $Lu_2SiO_5$:$Ce^{3+}$, $YAlO_3$:$Ce^{3+}$, CsF, $CaF_2$:$Eu^{2+}$, $BaF_2$, $CeF_3$, $Y_{1.34}Gd_{0.6}O_3$:$Eu^{3+}$, Pr, $Gd_2O_2S$:$Pr^{3+}$, Ce, SCGI, HFG:$Ce^{3+}$ (5%) and $C_{14}H_{10}$ can be formed on the photon transmissive second electrode. A passivation layer can be formed on the second electrode before providing the scintillation layer. For instance, when forming a photosensitive layer, at least one of 1) a continuous photosensitive layer extending across plural photodetector pixels or 2) discrete photosensitive layers associated with one of the plural photodetector pixels is formed.

For instance, when forming a photoconductive layer, at least one of VB-VIB, VB-VIIB, IIB-VIB, IIB-VB, IIIB-VB, IIIB-VIB, IB-VIB, and IVB-VIIB semiconductors or more specifically at least one of a-Se, $PbI_2$, $HgI_2$, PbO, CdZnTe, CdTe, $Bi_2S_3$, $Bi_2Se_3$, $BiI_3$, $BiBr_3$, CdS, CdSe, HgS, $Cd_2P_3$, InAs, InP, $In_2S_3$, $In_2Se_3$, $Ag_2S$, $PbI_4^{-2}$ and $Pb_2I_7^{-3}$ can be formed on the first electrode. For instance, when forming a photoconductive layer, at least one of 1) a continuous photoconductive layer extending across plural photoconductor detector pixels or 2) discrete photoconductive layers associated with one of the plural photoconductor detector pixels is formed.

For instance, when forming pixel circuitry elements, at least one of an amorphous semiconductor transistor or a microcrystalline semiconductor transistor or a polycrystalline semiconductor transistor can be formed on the base substrate. When forming pixel circuitry elements, at least one of an addressing transistor, an amplifier transistor, and a reset transistor can be formed on the base substrate. When forming pixel circuitry elements, at least one of a silicon semiconductor, an oxide semiconductor, a chalcogenide semiconductor, a cadmium selenide semiconductor, an organic semiconductor, an organic small molecule or polymer semiconductor, carbon nanotubes, or graphene can be formed on the base substrate. When forming pixel circuitry elements, at least one of thin film transistors, diodes, capacitors, resistors, traces, vias, control lines, address lines, and ground planes can be formed on the base substrate.

Further, in the nineteenth illustrated embodiment, a second electrode can be formed on the layer sensitive to light or ionizing radiation. A metal plate can be formed on the photon-transmissive second electrode or can be formed on an encapsulation on the scintillation layer. In the nineteenth illustrated embodiment, a metal plate can be formed on the ionizing radiation transmissive second electrode or can be formed on an encapsulation layer on the ionizing radiation transmissive second electrode.

In a twentieth illustrated embodiment, a method for fabricating a radiation sensor includes forming pixel circuitry elements on a base substrate, forming above the pixel circuitry a first electrode and a photosensitive layer, planarizing the photosensitive layer, forming on the planarized photosensitive layer a photon-transmissive second electrode, and forming a scintillator layer on the photon-transmissive second electrode. At least one of the first electrode and the second electrode has a surface inflection, above features of the pixel circuitry, which has a radius of curvature greater than one half micron, or greater than one micron, greater than five microns, greater than ten microns, or greater than one hundred microns, for example depending on the degree of planarization desired or achieved.

In a twenty-first illustrated embodiment, a method for fabricating a radiation sensor includes forming pixel circuitry elements on a base substrate, forming above the pixel circuitry a first electrode and a photoconductive layer, planarizing the photoconductive layer, and forming on the planarized photoconductive layer an ionizing radiation transmissive second electrode. The ionizing radiation transmissive second electrode has a surface inflection, above features of the pixel circuitry, which has a radius of curvature greater than one half micron, or greater than one micron, greater than five microns, greater than ten microns, or greater than one hundred microns, for example depending on the degree of planarization desired or achieved.

In a twenty-second illustrated embodiment, a method for fabricating a radiation sensor includes forming pixel circuitry elements on a base substrate, forming a planarization layer over the pixel circuitry elements, forming a hole in the planarization layer to expose a connection to the pixel circuitry elements, metallizing the patterned hole, forming a first electrode in electrical contact to the metallized hole, and forming on the first electrode a layer sensitive to light or ionizing radiation. Forming the planarization layer provides a surface of the first electrode, at least partially overlapping the pixel circuitry, that exhibits no surface features indicative of the underlying pixel circuitry.

In a twenty-third illustrated embodiment, a method for fabricating a radiation sensor includes forming pixel circuitry elements on a base substrate, forming above the pixel circuitry a first electrode and a photosensitive layer, planarizing the photosensitive layer, forming on the planarized photosensitive layer a photon-transmissive second electrode, and forming a scintillator layer on the photon-transmissive second electrode. Planarizing the photosensitive layer provides a surface of the second electrode, at least partially overlapping the pixel circuitry, that exhibits no surface features indicative of the underlying pixel circuitry.

In a twenty-fourth illustrated embodiment, a radiation sensor includes a scintillation layer configured to emit photons upon interaction with ionizing radiation, a photodetector including in order a first electrode, a photosensitive layer, and a photon-transmissive second electrode disposed in proximity to the scintillation layer. The photosensitive layer is configured to generate electron-hole pairs upon interaction with a part of the photons. The radiation sensor includes pixel circuitry electrically connected to the first electrode and configured to measure an imaging signal indicative of the electron-hole pairs generated in the photosensitive layer, and the pixel circuitry includes oxide semiconductors. The radiation sensor includes a planarization layer disposed on the pixel circuitry between the first electrode and the pixel circuitry such that the first electrode is above a plane including the pixel circuitry. A surface of at least one of the first electrode and the second electrode at least partially overlaps the pixel circuitry and has a surface inflection above features of the pixel circuitry. The surface inflection has a radius of curvature greater than one half micron.

In one aspect of this embodiment, the oxide semiconductor includes at least one of a zinc-containing oxide, $SnO_2$, $TiO_2$, $Ga_2O_3$, InGaO, $In_2O_3$, and InSnO. The zinc-containing oxide can include at least one of ZnO, InGaZnO, InZnO, ZnSnO. The oxide semiconductor can include at least one of an amorphous semiconductor or a polycrystalline semiconductor.

The twenty fourth embodiment is thus similar in scope to the first embodiment and includes aspects of the first embodiment discussed above, with examples of preferred combinations described next.

The surface inflection can have a radius of curvature greater than one micron, greater than five microns, greater than ten microns, or greater than one hundred microns, for example depending on the degree of planarization desired or achieved. In a further aspect, the surface of at least one of the first electrode and the second electrode can at least partially overlap the pixel circuitry and can exhibit no surface features indicative of the underlying pixel circuitry.

In one aspect of this embodiment, address and data lines are disposed underneath the photodetector; and the planarization layer is disposed on the address and data lines and on vias of the address and data lines. The planarization layer can then completely or partially planarize over the features of the pixel circuitry, over array features, over electrical via interconnects connecting to the source or drain of TFTs, over one-stage in-pixel amplifier elements, and/or over two-stage in-pixel amplifier elements. The planarization layer can be at least one of a passivation layer, a dielectric layer, or an insulation layer.

In one aspect of this embodiment, the radiation sensor can include address and data lines disposed underneath the photodetector, and the planarization layer is disposed on the address and data lines and on vias of the address and data lines. Further, an electrical via interconnect can extend through the planarization layer and connect the first electrode to the pixel circuitry. A surface inflection of the electrical via interconnect in contact with the photosensitive layer can have a radius of curvature greater than one half micron, greater than one micron, greater than five microns, greater than ten microns, and greater than one hundred microns.

In one aspect of this embodiment, the photosensitive layer can be one of a p-i-n semiconductor stack, a n-i-p semiconductor stack, or a metal insulator semiconductor stack. The pixel circuitry can include one of thin film transistors, diodes, capacitors, traces, vias, control lines, address lines, and ground planes. The pixel circuitry can further include one of an amorphous semiconductor transistor or a polycrystalline semiconductor transistor or a microcrystalline semiconductor transistor. The pixel circuitry can include at least one of an addressing transistor, an amplifier transistor, and a reset transistor. The pixel circuitry can further include elements made from at least one of amorphous silicon, low temperature amorphous silicon, and microcrystalline silicon. The pixel circuitry can further include elements made from at least one of a silicon semiconductor, a chalcogenide semiconductor, a cadmium selenide semiconductor, an organic semiconductor, an organic small molecule or polymer semiconductor, carbon nanotubes, or graphene, or other semiconducting materials.

In one aspect of this embodiment, the photosensitive layer can be at least one of 1) a continuous photosensitive layer extending across plural photodetector pixels or 2) discrete photosensitive layers associated with respective ones of the plural photodetector pixels. The scintillation layer can be at least one of CsI:Tl, $Gd_2O_2S$:Tb, CsI:Na, NaI:Tl, $CaWO_4$, $ZnWO_4$, $CdWO_4$, $Bi_4Ge_3O_{12}$, $Lu_{1.8}Yb_{0.2}SiO_5$:Ce, $Gd_2SiO_5$: Ce, BaFCl:$Eu^{2+}$, $BaSO_4$:$Eu^{2+}$, BaFBr:$Eu^{2+}$, LaOBr:$Tb^{3+}$, LaOBr:$Tm^{3+}$, $La_2O_2S$:$Tb^{3+}$, $Y_2O_2S$:$Tb^{3+}$, $YTaO_4$, $YTaO_4$:Nb, ZnS:Ag, (Zn,Cd)S:Ag, $ZnSiO_4$:$Mn^{2+}$, CsI, LiI:$Eu^{2+}$, $PbWO_4$, $Bi_4Si_3O_{12}$, $Lu_2SiO_5$:$Ce^{3+}$, $YAlO_3$:$Ce^{3+}$, CsF, $CaF_2$:$Eu^{2+}$, $BaF_2$, $CeF_3$, $Y_{1.34}Gd_{0.6}O_3$:$Eu^{3+}$, Pr, $Gd_2O_2S$:$Pr^{3+}$, Ce, SCGI, HFG:$Ce^{3+}$ (5%) and $C_{14}H_{10}$, or other scintillator materials.

In one aspect of this embodiment, the radiation sensor can include a base substrate supporting the pixel circuitry, the photodetector, and the scintillation layer, and can include a plurality of photodetector pixels arranged in a regular pattern on the base substrate. In one aspect of this embodiment, the photon-transmissive second electrode can form a bias plane for the plurality of the photodetector pixels. A part of the pixel circuitry can be disposed on the base substrate in a gap region between adjacent photodetector pixels. This part can include one of thin film transistors, diodes, capacitors, resistors, vias, traces, control lines, address lines, and ground planes. In one aspect of this embodiment, the first electrode can have beveled ends terminating near the gap region.

In one aspect of this embodiment, a dark current, normalized to unit photodetector area, between the first electrode and the photon-transmissive second electrode can be less than 10 $pA/mm^2$, or less than 5 $pA/mm^2$, or less than 1 $pA/mm^2$, or less than 0.5 $pA/mm^2$. The level of dark current to some degree being coupled to the degree of planarization and the radius of curvature of the surface inflection(s) discussed above. In one aspect of this embodiment, an electric field in regions in the photosensitive layer proximate the surface inflection can be greater than 60 percent and less than 300 percent of an electric field in the photosensitive layer between a pair of parallel first and second electrodes. The variation of the electric field to some degree being coupled to the degree of planarization and the radius of curvature of the surface inflection(s) discussed above.

In one aspect of this embodiment, the sensor can include a metal plate disposed on the scintillation layer.

In one aspect of this embodiment, the level of charge trapping per photodetector pixel, quantified by the amount of said imaging signal lost to trapping during a single radiographic frame, and expressed as a percentage of the imaging signal obtained under conditions where charge trapping and charge release are in equilibrium, can be less than 20%, can be less than 15%, less than 10%, or less than 5%, for example depending on the degree of planarization desired or achieved.

In one aspect of this embodiment, the charge release per photodetector pixel, quantified by the amount of said imaging signal released from trapping states during the first frame acquired in the absence of radiation following a series of frames acquired with radiation and under conditions where charge trapping and charge release are in equilibrium, and expressed as a percentage of the imaging signal obtained under conditions where charge trapping and release are in equilibrium, can be less than 15%, less than 10%, less than 5%, or less than 3%, for example depending on the degree of planarization desired or achieved.

The photodetector has a lag per photodetector pixel, quantified by the amount of imaging signal (indicative of the electron-hole pairs generated in the photosensitive layer, and that originates from charge trapped in one or more previous frames) released from trapping states during the first frame acquired in the absence of radiation following one, or a series of frames acquired with radiation, and expressed as a percentage of the imaging signal from the previous frame, that is less than ~15%. In one aspect of this embodiment, the lag per photodetector pixel can be less than 10%, less than 5%, or less than 3%, for example depending on the degree of planarization desired or achieved.

In a twenty-fifth illustrated embodiment, a radiation sensor includes a photoconductor detector having in order a first electrode, a photoconductive layer, and an ionizing radiation transmissive second electrode. The photoconductive layer is configured to generate electron-hole pairs upon interaction with ionizing radiation. The radiation sensor includes pixel circuitry electrically connected to the first electrode and configured to measure an imaging signal indicative of the electron-hole pairs generated in the photoconductive layer, and the pixel circuitry includes oxide semiconductors. The radiation sensor includes a planarization layer disposed on the pixel circuitry between the first electrode and the pixel circuitry such that the first electrode is above a plane including the pixel circuitry. A surface of at least one of the first electrode and the second electrode at least partially overlaps the pixel circuitry and has a surface inflection above features of the pixel circuitry.

In one aspect of this embodiment, the oxide semiconductor includes at least one of a zinc-containing oxide, $SnO_2$, $TiO_2$, $Ga_2O_3$, InGaO, $In_2O_3$, and InSnO. The zinc-containing oxide can include at least one of ZnO, InGaZnO, InZnO, ZnSnO. The oxide semiconductor can include at least one of an amorphous semiconductor or a polycrystalline semiconductor.

The twenty fifth embodiment is thus similar in scope to the tenth embodiment and includes aspects of the tenth embodiment discussed above, with examples of preferred combinations described next.

In one aspect of this embodiment, the planarization layer can be at least one of a passivation layer, a dielectric layer, or an insulation layer. In one aspect of this embodiment, a surface inflection of the first electrode or the second electrode above the pixel circuitry has a radius of curvature greater than one half micron, greater than one micron, greater than five microns, greater than ten microns, or greater than one hundred microns. In a further aspect, the surface of at least one of the first electrode and the second electrode can at least partially overlap the pixel circuitry and can exhibit no surface features indicative of the underlying pixel circuitry.

In one aspect of this embodiment, address and data lines are disposed underneath the photoconductor detector; and the planarization layer is disposed on the address and data lines and on vias of the address and data lines. Further, an electrical via interconnect can extend through the planarization layer and connect the first electrode to the pixel circuitry. A surface inflection of the electrical via interconnect in contact with the photosensitive layer can have a radius of curvature greater than one half micron, greater than one micron, greater than five microns, greater than ten microns, and greater than one hundred microns.

In one aspect of this embodiment, the pixel circuitry can include one of thin film transistors, diodes, capacitors, resistors, traces, vias, control lines, address lines, and ground planes. The pixel circuitry can further include one of an amorphous semiconductor transistor or a polycrystalline semiconductor transistor or a microcrystalline semiconductor transistor. The pixel circuitry can include at least one of an addressing transistor, an amplifier transistor, and a reset transistor. The pixel circuitry can further include elements made from at least one of amorphous silicon, low temperature amorphous silicon, and microcrystalline silicon. The pixel circuitry can further include elements made from at least one of a silicon semiconductor, a chalcogenide semiconductor, a cadmium selenide semiconductor, an organic semiconductor, an organic small molecule or polymer semiconductor, carbon nanotubes, or graphene, or other semiconducting materials.

In one aspect of this embodiment, a metal plate can be disposed on the ionizing radiation transmissive second electrode or can be disposed on an encapsulation layer on the ionizing radiation transmissive second electrode. Further, the planarization layer can at least partially planarize over array features, over electrical via interconnects connecting to the source or drain of TFTs, over one-stage in-pixel amplifier elements, or over two-stage in-pixel amplifier elements.

In one aspect of this embodiment, the photoconductive layer can be at least one of 1) a continuous photoconductive layer extending across plural photoconductor detector pixels or 2) discrete photoconductive layers associated with respective ones of the plural photoconductor detector pixels. The radiation sensor can include a base substrate supporting the pixel circuitry and the photoconductive layer. The radiation sensor can include a plurality of photoconductor detector pixels arranged in a regular pattern on the base substrate. In one aspect of this embodiment, the ionizing radiation transmissive second electrode can form a bias plane for the plurality of the photoconductor detector pixels. A part of the pixel circuitry can be disposed on the base substrate in a gap region between adjacent photoconductor detector pixels. This part can include one of thin film transistors, diodes, capacitors, resistors, vias, traces, control lines, address lines, and ground planes. The first electrode can have beveled ends terminating near the gap region.

Accordingly, in the twenty fifth illustrated embodiment, the photoconductive layer generates electron-hole pairs upon interaction with x-rays or other ionizing radiation. The photoconductive layer can include at least one of VB-VIB, VB-VIIB, IIB-VIB, IIB-VB, IIIB-VB, IIIB-VIB, IB-VIB, and IVB-VIIB semiconductors, and more specifically can include at least one of a-Se, $PbI_2$, $HgI_2$, PbO, CdZnTe, CdTe, $Bi_2S_3$, $Bi_2Se_3$, $BiI_3$, $BiBr_3$, CdS, CdSe, HgS, $Cd_2P_3$, InAs, InP, $In_2S_3$, $In_2Se_3$, $Ag_2S$, $PbI_4^{-2}$ and $Pb_2I_7^{-3}$.

In one aspect of this embodiment, a dark current, normalized to unit photoconductor detector area, between the first electrode and the second electrode can be less than 10 $pA/mm^2$, or less than 5 $pA/mm^2$, or less than 1 $pA/mm^2$, or less than 0.5 $pA/mm^2$. The level of dark current to some degree being coupled to the degree of planarization and the radius of curvature of the surface inflection(s) discussed above.

In one aspect of this embodiment, the level of charge trapping per photoconductor detector pixel, quantified by the amount of said imaging signal lost to trapping during a single radiographic frame, and expressed as a percentage of the imaging signal obtained under conditions where charge trapping and charge release are in equilibrium, can be less than 20%, can be less than 15%, less than 10%, or less than 5%, for example depending on the degree of planarization desired or achieved.

In one aspect of this embodiment, the charge release per photoconductor detector pixel, quantified by the amount of said imaging signal released from trapping states during the first frame acquired in the absence of radiation following a series of frames acquired with radiation and under conditions where charge trapping and charge release are in equilibrium, and expressed as a percentage of the imaging signal obtained under conditions where charge trapping and release are in equilibrium, can be less than 15%, can be less than 10%, less than 5%, or less than 3%, for example depending on the degree of planarization desired or achieved.

The photoconductor detector has a lag per photoconductor detector pixel, quantified by the amount of imaging signal (indicative of the electron-hole pairs generated in the photoconductive layer, and that originates from charge trapped in one or more previous frames) released from trapping states during the first frame acquired in the absence of radiation following one, or a series of frames acquired with radiation, and expressed as a percentage of the imaging signal from the previous frame, that is less than ~15%. In one aspect of this embodiment, the lag per photoconductor detector pixel can be less than 10%, less than 5%, or less than 3%, for example depending on the degree of planarization desired or achieved.

In a twenty-sixth illustrated embodiment, a method for fabricating a radiation sensor includes forming pixel circuitry elements on a base substrate with the pixel circuitry including oxide semiconductors, forming a planarization layer over the pixel circuitry elements, forming a hole in the planarization layer to expose a connection to the pixel circuitry elements, metallizing the patterned hole, forming a first electrode in electrical contact to the metallized hole, and forming on the first electrode a layer sensitive to light or ionizing radiation. The planarization layer provides, on a surface of the first electrode at least partially overlapping the pixel circuitry, a surface inflection, above features of the pixel circuitry. The surface inflection can have a radius of curvature greater than one half micron, greater than one micron, greater than five microns, greater than ten microns, or greater than one hundred microns, for example depending on the degree of planarization desired or achieved.

In one aspect of this embodiment, the oxide semiconductor includes at least one of a zinc-containing oxide, $SnO_2$, $TiO_2$, $Ga_2O_3$, InGaO, $In_2O_3$, and InSnO. The zinc-containing oxide can include at least one of ZnO, InGaZnO, InZnO, ZnSnO. The oxide semiconductor can include at least one of an amorphous semiconductor or a polycrystalline semiconductor.

In one aspect of this embodiment, a photosensitive layer and a photon-transmissive second electrode are formed on the first electrode, and a passivation layer is formed on the photon-transmissive second electrode, and a scintillation layer is formed on this passivation layer, the scintillation layer configured to emit photons upon interaction with ionizing radiation. In this instance, the photosensitive layer can be planarized or made planarized before forming the photon-transmissive second electrode.

In a different aspect of this embodiment, a photoconductive layer is formed on the first electrode (the photoconductive layer configured to generate electron-hole pairs upon interaction with x-rays or other ionizing radiation), and an ionizing radiation transmissive second electrode is formed on the photoconductive layer.

In these two aspects, a second electrode can be disposed on the passivation layer on the scintillation layer or on the encapsulation layer on the photoconductive layer. In these two aspects, a metal plate can be disposed on the scintillation layer or on the encapsulation on the scintillation layer, or on the encapsulation layer on the ionizing radiation transmissive second electrode.

In one aspect of this embodiment, the planarization layer can be formed to have a radius of curvature greater than one half micron, greater than one micron, greater than five microns, greater than ten microns, or greater than one hundred microns, for example depending on the degree of planarization desired or achieved. The planarization layer can be formed by chemical mechanical polishing of the deposited passivation layer. Alternatively, the planarization layer can be formed by spin coating a passivation layer and then chemical mechanical polishing of that passivation layer. Alternatively, the planarization layer can be formed by depositing on top of one (or a first) passivation layer another passivation layer using spin coating and then chemical mechanical polishing of the other (or second) passivation layer. The planarization layer can at least partially planarize over array features, over electrical via interconnects connecting to the source or drain of TFTs, over one-stage in-pixel amplifier elements, or over two-stage in-pixel amplifier elements.

In one aspect of this embodiment, ends of the first electrode near a gap region between adjacent pixels of the radiation sensor can be beveled. In one aspect of this embodiment, the metallized hole can be tapered to have a radius of curvature greater than one half micron, or greater than one micron, greater than five microns, greater than ten microns, or greater than one hundred microns, for example depending on the degree of planarization desired or achieved.

In one aspect of this embodiment, the features listed in the aspects of the first illustrated embodiment for the pixel circuitry elements and the photosensitive layer can be formed on the base substrate. For instance, when forming a scintillation layer, at least one of CsI:Tl, $Gd_2O_2S$:Tb, CsI:Na, NaI:Tl, $CaWO_4$, $ZnWO_4$, $CdWO_4$, $Bi_4Ge_3O_{12}$, $Lu_{1.8}Yb_{0.2}SiO_5$:Ce, $Gd_2SiO_5$:Ce, BaFCl:$Eu^{2+}$, $BaSO_4$:$Eu^{2+}$, BaFBr:$Eu^{2+}$, LaOBr:$Tb^{3+}$, LaOBr:$Tm^{3+}$, $La_2O_2S$:$Tb^{3+}$, $Y_2O_2S$:$Tb^{3+}$, $YTaO_4$, $YTaO_4$:Nb, ZnS:Ag, (Zn,Cd)S:Ag, $ZnSiO_4$:$Mn^{2+}$, CsI, LiI:$Eu^{2+}$, $PbWO_4$, $Bi_4Si_3O_{12}$, $Lu_2SiO_5$:$Ce^{3+}$, $YAlO_3$:$Ce^{3+}$, CsF, $CaF_2$:$Eu^{2+}$, $BaF_2$, $CeF_3$, $Y_{1.34}Gd_{0.6}O_3$:$Eu^{3+}$, Pr, $Gd_2O_2S$:$Pr^{3+}$, Ce, SCGI, HFG:$Ce^{3+}$ (5%) and $C_{14}H_{10}$ can be formed on the photon transmissive second electrode. For instance, when forming a photosensitive layer, at least one of 1) a continuous photosensitive layer extending across plural photodetector pixels or 2) discrete photosensitive layers associated with one of the plural photodetector pixels is formed.

For instance, when forming a photoconductive layer, at least one of VB-VIB, VB-VIIB, IIB-VIB, IIB-VB, IIIB-VB, IIIB-VIB, IB-VIB, and IVB-VIIB semiconductors or more specifically at least one of a-Se, $PbI_2$, $HgI_2$, PbO, CdZnTe, CdTe, $Bi_2S_3$, $Bi_2Se_3$, $BiI_3$, $BiBr_3$, CdS, CdSe, HgS, $Cd_2P_3$, InAs, InP, $In_2S_3$, $In_2Se_3$, $Ag_2S$, $PbI_4^{-2}$ and $Pb_2I_7^{-3}$ can be formed on the first electrode. For instance, when forming a photoconductive layer, at least one of 1) a continuous photoconductive layer extending across plural photoconductor detector pixels or 2) discrete photoconductive layers associated with one of the plural photoconductor detector pixels is formed.

Furthermore, when forming pixel circuitry elements on a base substrate, the pixel circuitry can further include one of an amorphous semiconductor transistor or a polycrystalline semiconductor transistor or a microcrystalline semiconductor transistor. The pixel circuitry can include at least one of an addressing transistor, an amplifier transistor, and a reset transistor. The pixel circuitry can further include elements made from at least one of amorphous silicon, low temperature amorphous silicon, and microcrystalline silicon. The pixel circuitry can further include elements made from at least one of a silicon semiconductor, a chalcogenide semiconductor, a cadmium selenide semiconductor, an organic semiconductor, an organic small molecule or polymer semiconductor, carbon nanotubes, or graphene, or other semiconducting materials.

Numerous modifications and variations of the present invention are possible in light of the above teachings. It is therefore to be understood that within the scope of the appended claims, the invention may be practiced otherwise than as specifically described herein.

DESCRIPTION OF DRAWINGS

Figure 1:
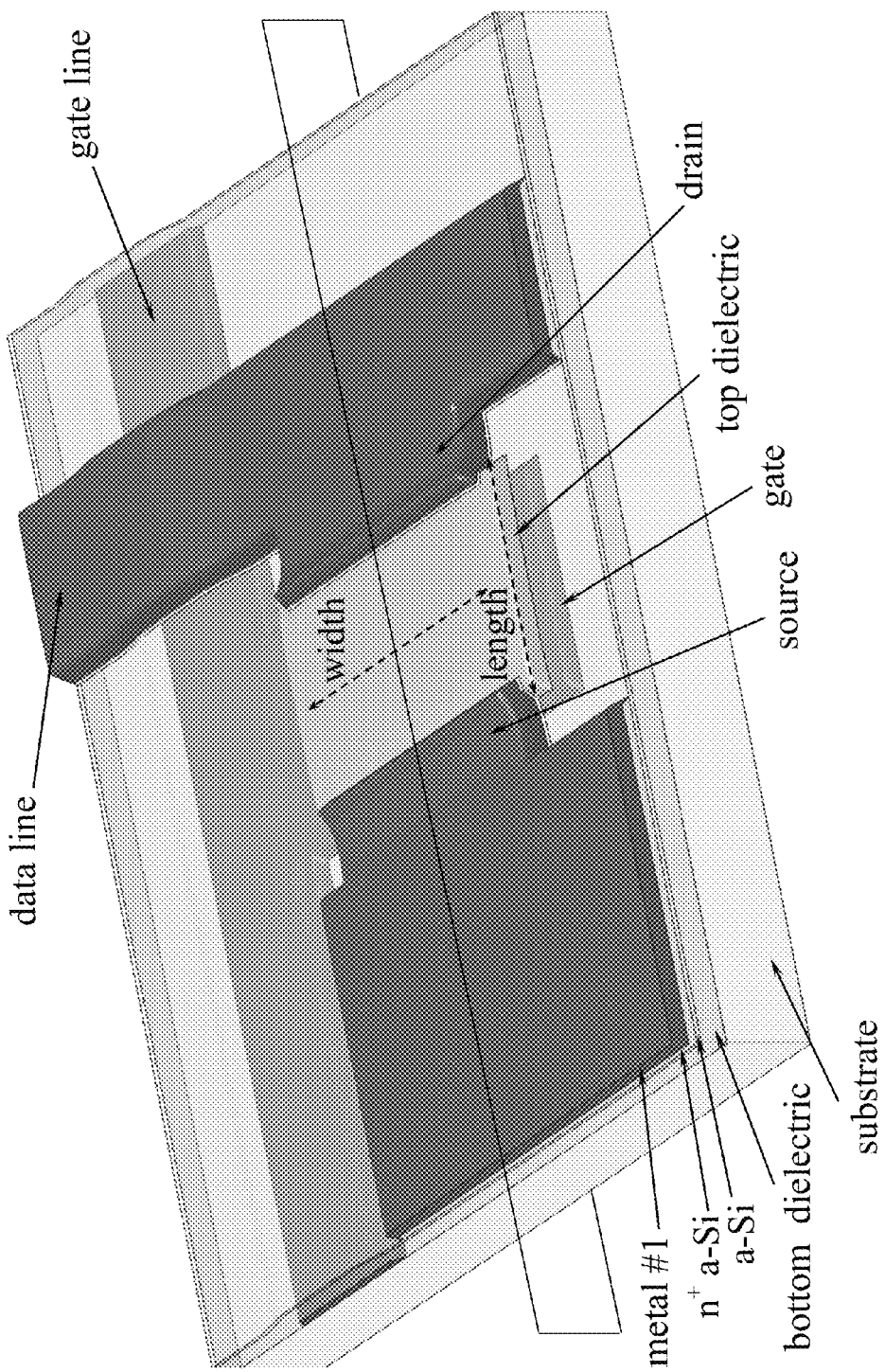
FIG. 1 is a schematic, three-dimensional drawing of one form of an a-Si thin-film transistor (TFT) showing the top of the TFT viewed from an oblique angle.

FIG. 1. Schematic, three-dimensional drawing of one form of an a-Si TFT. The top of the TFT is viewed from an oblique angle. While the illustration of the TFT is generic, the drawing also depicts the address lines that would be required if the TFT were the addressing switch in an AMFPI pixel. Thus, the figure illustrates a segment of a gate address line, at the point where it connects to the gate of the TFT, and a segment of a data address line, at the point where it connects to the drain of the TFT. The channel of the TFT has a width of 15 μm and a length of 10 μm, as indicated by the dashed arrows. The continuous bottom dielectric layer and a-Si layer are illustrated as being largely transparent so as to allow underlying features to be visible. In addition, for clarity of presentation, the drawing has been magnified by a factor of 4 in the direction perpendicular to the substrate relative to the direction parallel to the substrate, and only part of the substrate thickness is portrayed. The plane defined by the solid, black wire frame superimposed on the drawing indicates the location of the cross sectional view appearing in FIG. 2. Other labeled elements in this drawing are described in the caption for FIG. 2.

Figure 2:
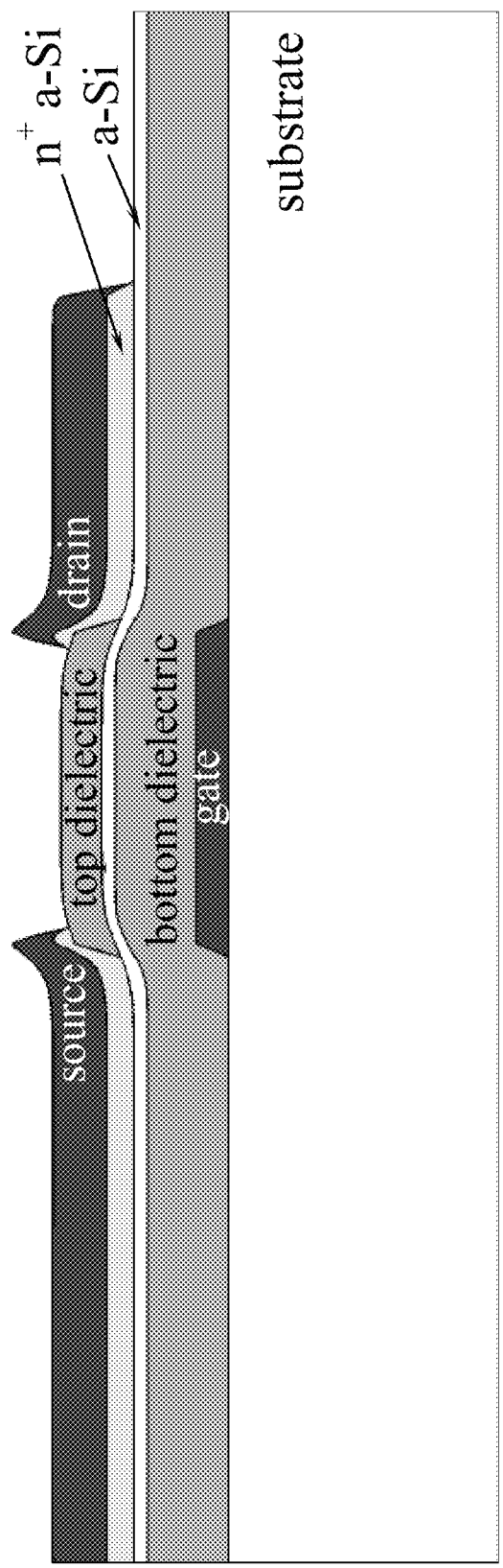
FIG. 2 is a schematic, cross-sectional view of the a-Si TFT shown in FIG. 1.

FIG. 2. Schematic, cross-sectional view of the a-Si TFT shown in FIG. 1. The location of this cross section corresponds to the plane defined by the wire frame in FIG. 1 and the convention for grey-scale shading of the elements of the TFT approximately corresponds to that used in FIG. 1. For clarity of presentation, the drawing has been magnified by a factor of 8 in the direction perpendicular to the substrate relative to the direction parallel to the substrate, and only part of the substrate thickness is portrayed. Labels are used to indicate the substrate, the gate, source and drain of the TFT, the bottom and top dielectric layers in the TFT, the a-Si layer that forms the channel of the TFT, and $n^+$ doped a-Si material used to complete the structure of this n-type transistor.

Figure 3:
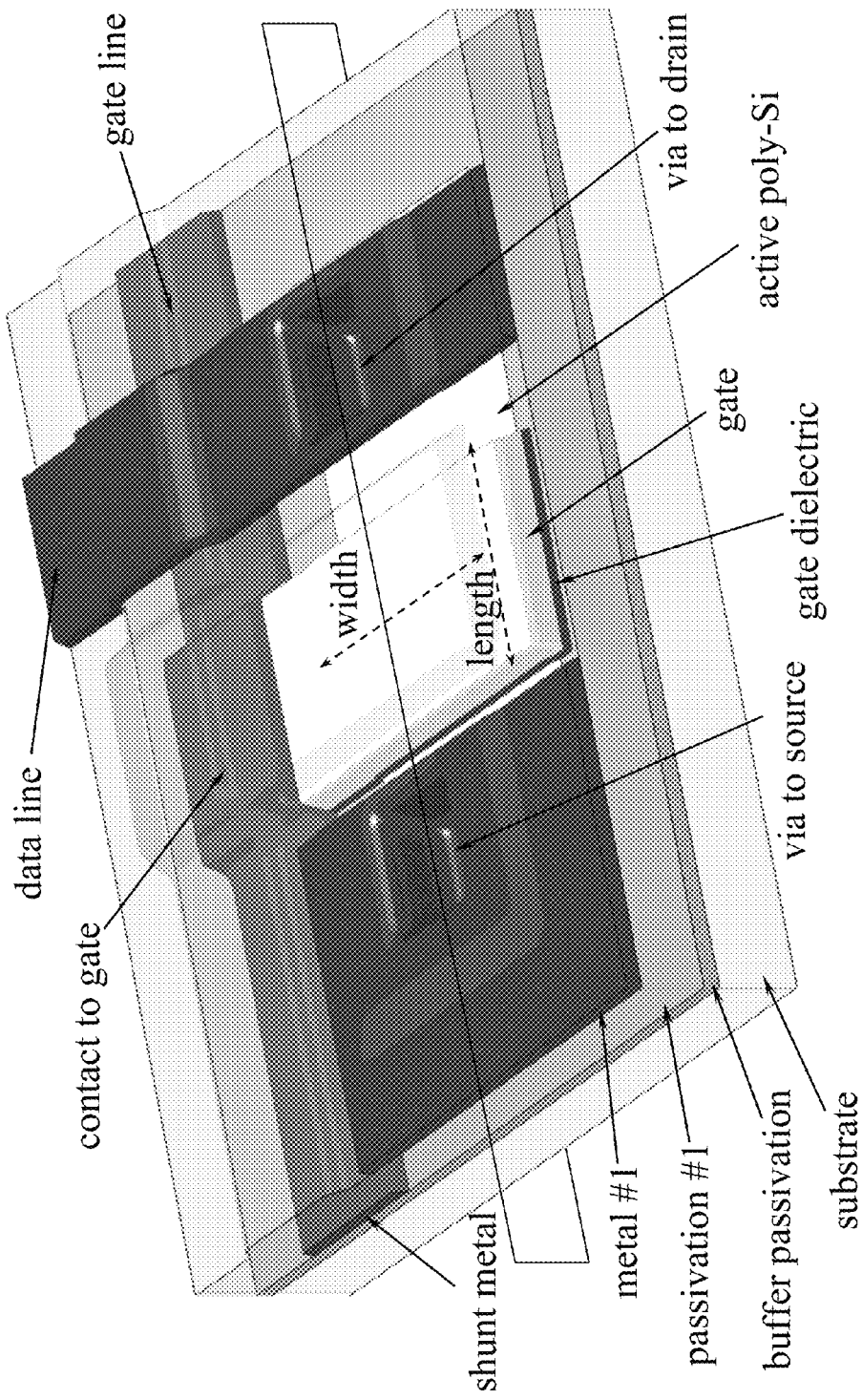
FIG. 3 is a schematic, three-dimensional drawing of one form of a poly-Si TFT showing the top of the TFT viewed from an oblique angle.

FIG. 3. Schematic, three-dimensional drawing of one form of a poly-Si TFT. The top of the TFT is viewed from an oblique angle. While the illustration of the TFT is generic, the drawing also depicts the address lines that would be required if the TFT were the addressing switch in an AMFPI pixel. Thus, the figure illustrates a segment of a gate address line, at the point where it connects to the poly-Si gate of the TFT, and a segment of a data address line, at the point where contact to the drain of the TFT is established at a via. The channel of the TFT has a width of 15 μm and a length of 10 μm, as indicated by the dashed arrows. The continuous passivation layer (passivation #1) is illustrated as being largely transparent so as to allow underlying features to be visible. In addition, for clarity of presentation, the drawing has been magnified by a factor of 4 in the direction perpendicular to the substrate relative to the direction parallel to the substrate, and only part of the substrate thickness is portrayed. The plane defined by the solid, black wire frame superimposed on the drawing indicates the location of the cross sectional view appearing in FIG. 4. Other labeled elements in this drawing are described in the caption for FIG. 4.

Figure 4:
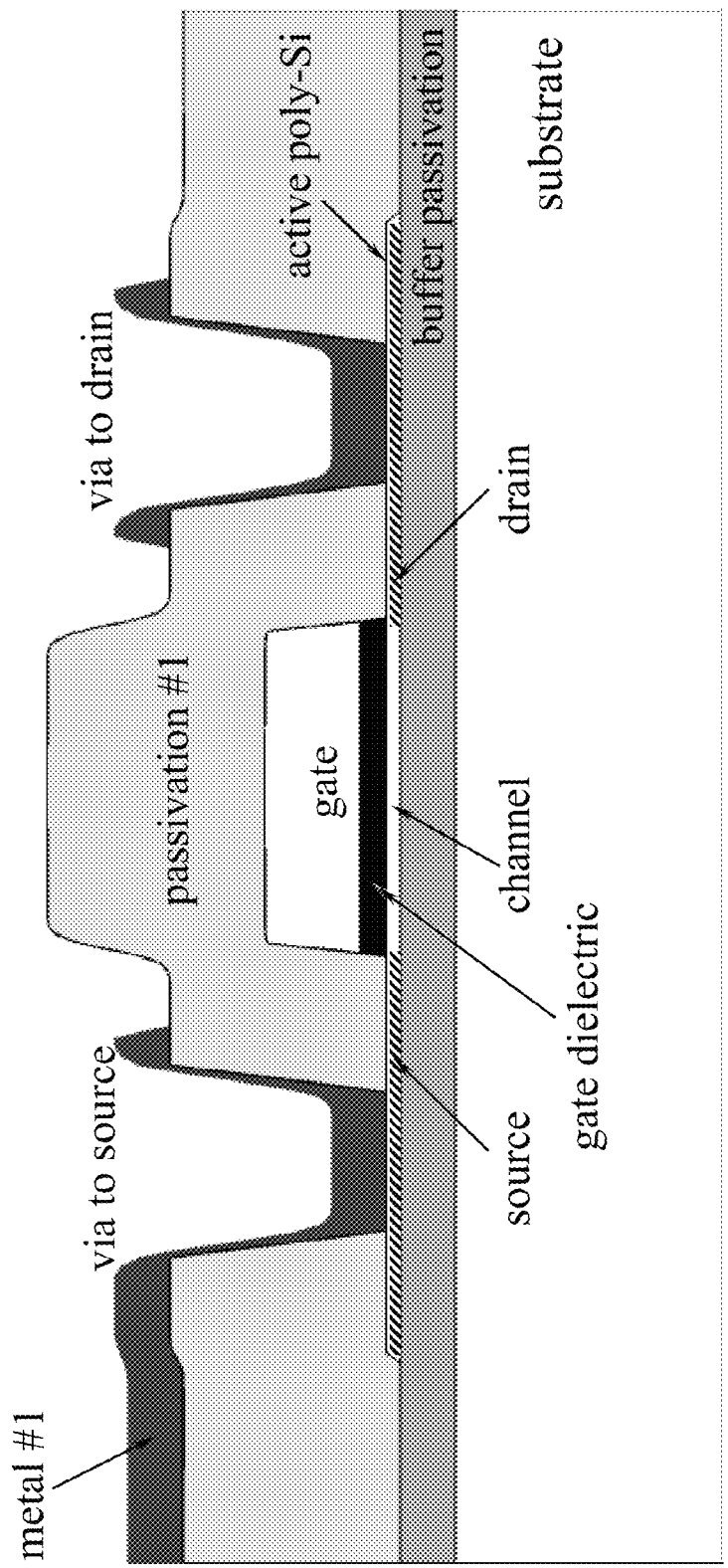
FIG. 4 is a schematic, cross-sectional view of the poly-Si TFT shown in FIG. 3.

FIG. 4. Schematic, cross-sectional view of the poly-Si TFT shown in FIG. 3. The location of this cross section corresponds to the plane defined by the wire frame in FIG. 3 and the convention for grey-scale shading of the elements of the TFT approximately corresponds to that used in FIG. 3. For clarity of presentation, the drawing has been magnified by a factor of 8 in the direction perpendicular to the substrate relative to the direction parallel to the substrate, and only part of the substrate thickness is portrayed. Labels are used to indicate the substrate, the buffer passivation, the gate dielectric, the gate of the TFT (which in this case is formed from poly-Si), the active poly-Si layer used to form the TFT channel (under the gate dielectric) as well as the source and drain of the TFT (indicated by angled lines superimposed over parts of the poly-Si layer), and the passivation layer over the TFT ("passivation #1"). The position of this cross sectional view does not show the connection between the gate address line and the poly-Si gate.

FIG. 5. Schematic circuit diagram for a pixel from an active matrix imaging array employing indirect detection of the incident radiation. The region defined by the straight, dashed lines indicates the boundaries of the pixel.

Figure 6:
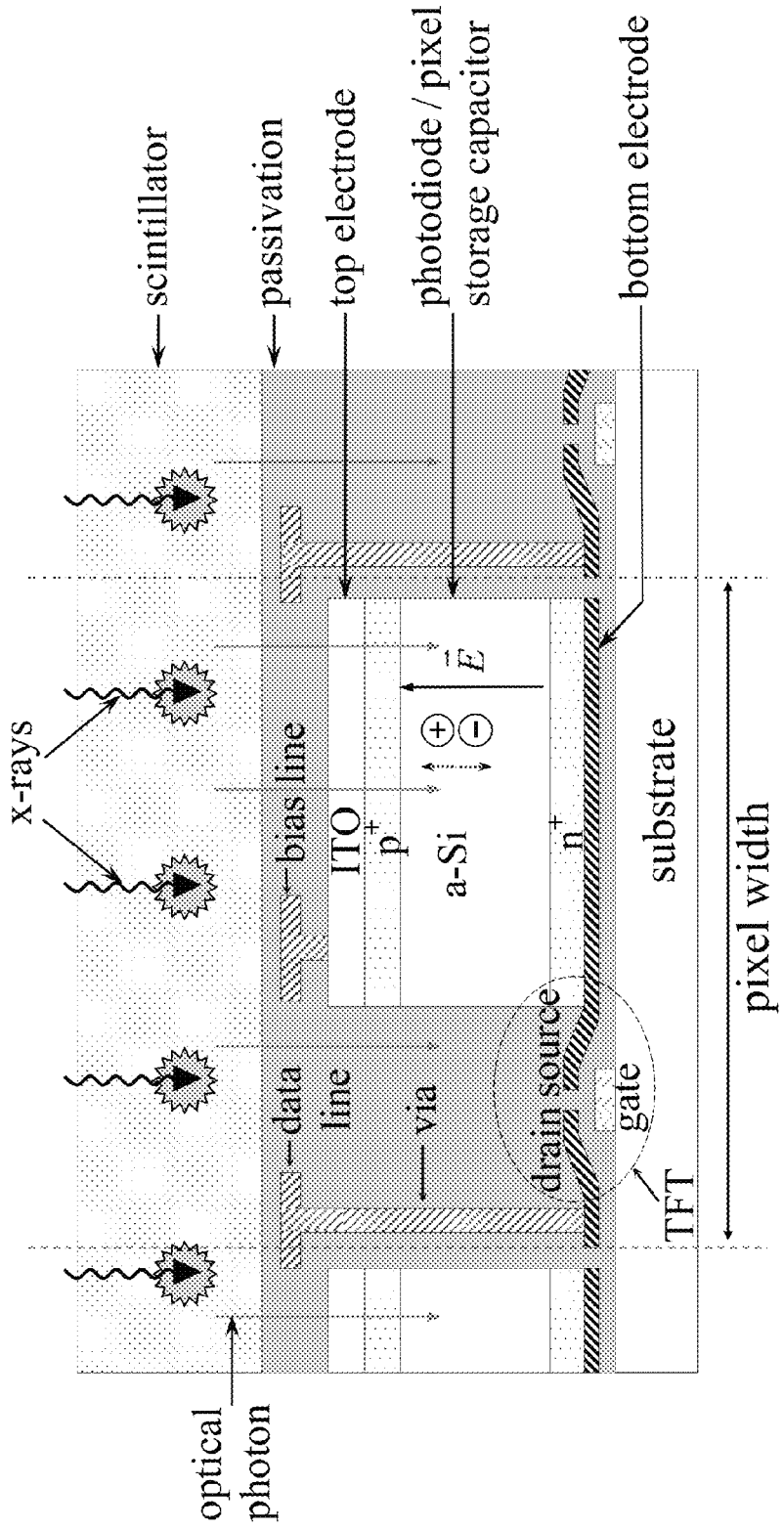
FIG. 6 is a schematic drawing of a cross sectional view of one form of an indirect detection pixel design having a discrete photodiode, corresponding to one particular structural implementation of the pixel circuit of FIG. 5 and referred to as the baseline architecture.

FIG. 6. Schematic, cross sectional view of one form of an indirect detection pixel having a discrete photodiode. This represents one particular structural implementation of the pixel circuit in FIG. 5 and is referred to as the baseline architecture. The view is parallel to the direction of the gate address line, which is not visible in this cross section. The distance between the vertical dashed lines represents the width of one pixel. For reasons of clarity, the layers and features in this illustration are not drawn to scale.

Figure 7:
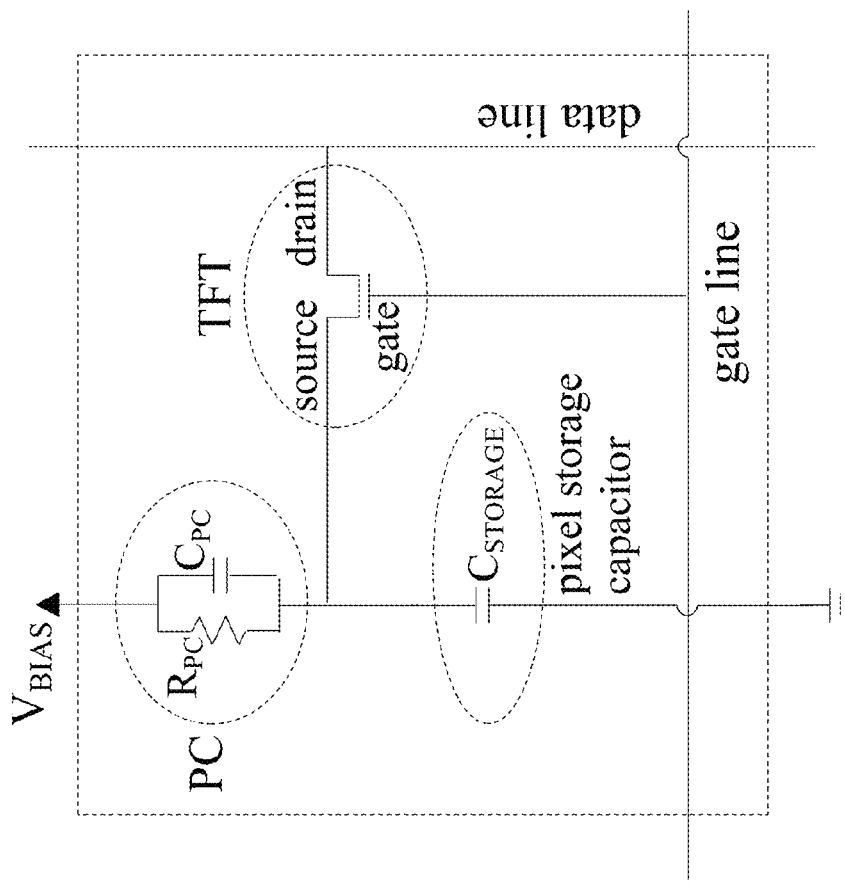
FIG. 7 is a schematic circuit diagram for a pixel from an active matrix imaging array employing direct detection of the incident radiation.

FIG. 7. Schematic circuit diagram for a pixel from an active matrix imaging array employing direct detection of the incident radiation. The conventions for labels, lines and symbols are similar to those used in FIG. 5. The region defined by the straight, dashed lines indicates the boundaries of the pixel.

Figure 8:
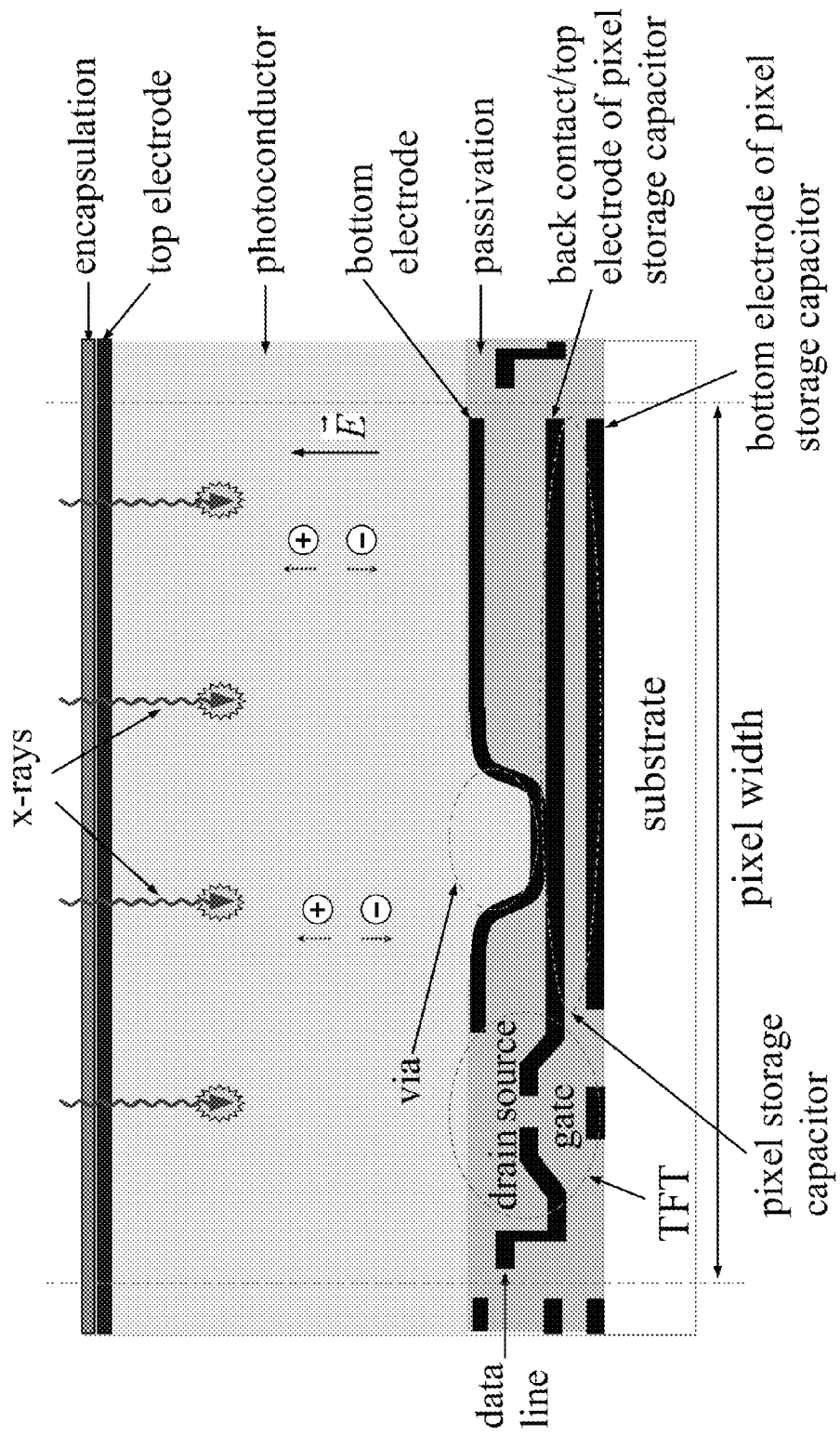
FIG. 8 is a schematic drawing of a cross sectional view of one form of a direct detection pixel design.

FIG. 8. Schematic, cross sectional view of one form of a direct detection pixel. The view is parallel to the direction of the gate address line, which is not visible in this cross section. The conventions for labels, lines, symbols and arrows are similar to those used in FIG. 6. The distance between the vertical dashed lines represents the width of one pixel. For reasons of clarity, the layers and features in this illustration are not drawn to scale. Also, the effect of the TFT and the via on the uniformity of the topology of the photoconductor is not illustrated.

Figure 9:
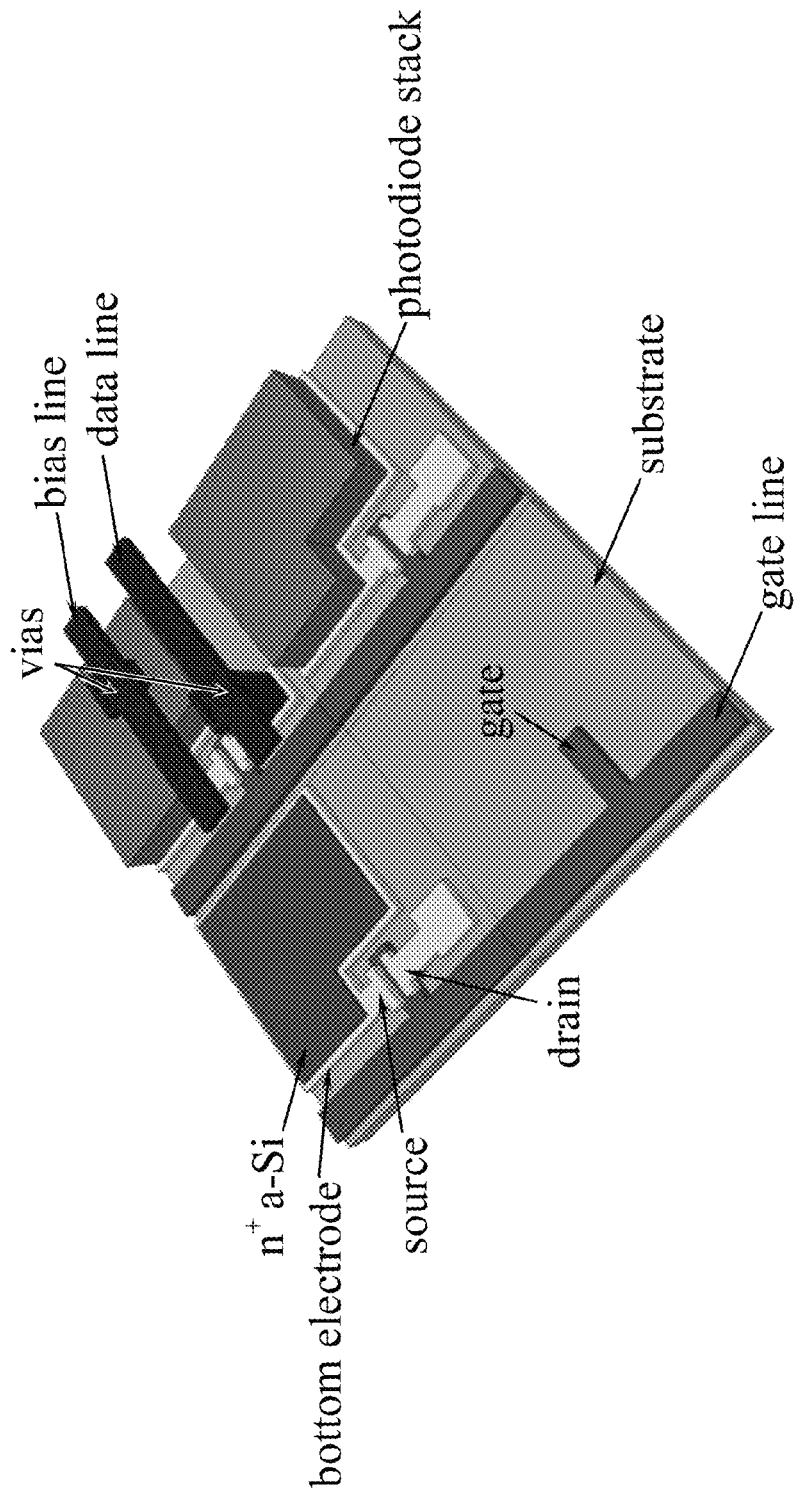
FIG. 9 is a schematic rendering of four adjacent pixels of an indirect detection active matrix array, corresponding to an implementation of the pixel circuit and baseline architecture shown in FIGS. 5 and 6, respectively.

FIG. 9. Schematic rendering of four adjacent pixels of an indirect detection active matrix array. The design of these pixels represents an implementation of the pixel circuit and of the baseline architecture illustrated in FIGS. 5 and 6, respectively. Each pixel in the drawing reveals varying degrees of the architectural detail of the design. In the pixel at the bottom of the figure, only the gate address line and the gate of the addressing TFT are shown. In the pixel on the left hand side, the source and drain of the addressing TFT, as well as the bottom electrode covered by the $n^+$ doped a-Si layer of the photodiode, have been added. In the pixel on the right hand side, the combined layers of the $n^+$ doped a-Si, intrinsic a-Si, $p^+$ doped a-Si, and top optically transparent electrode, collectively referred to as the photodiode stack, are illustrated. In this design, the bottom electrode extends slightly beyond the edge of the stack. In the pixel at the top of the figure, the data address line, connected to the drain of the addressing TFT by means of a via, and the bias line, connected to the top electrode of the photodiode by means of a via, have been added.

Figure 10:
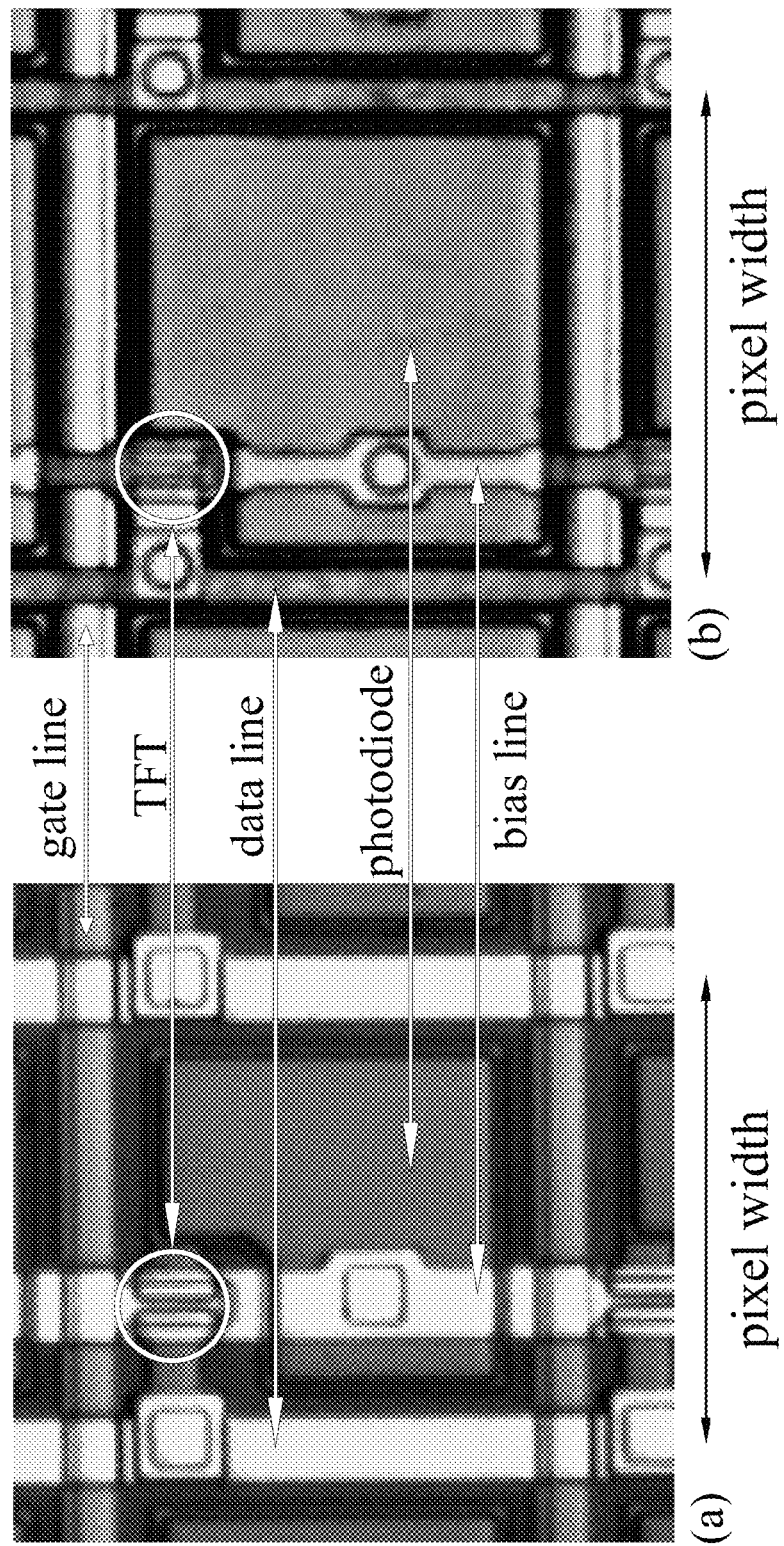
FIG. 10 is a collection of photomicrographs of the top surface of a pair of indirect detection active matrix arrays in the region of a single pixel, corresponding to an implementation of the baseline architecture in FIG. 6.

FIG. 10. Photomicrographs of the top surface of a pair of indirect detection active matrix arrays in the region of a single pixel. In each case, the design represents an implementation of the baseline architecture illustrated in FIG. 6. (a) Photomicrograph of a pixel from an early array having a design corresponding to the illustration in FIG. 9. (b) Photomicrograph of a pixel from a later array design in which the optical fill factor has been increased through optimization of the pixel design. In each photomicrograph, the addressing TFT is located within the region bounded by the circle superimposed on the image and the locations of the gate address line, data address line, bias line and photodiode are also indicated. Note that, in each photomicrograph, the top surface of the parts of the photodiode not obscured by the bias line is seen to be very uniform.

Figure 11:
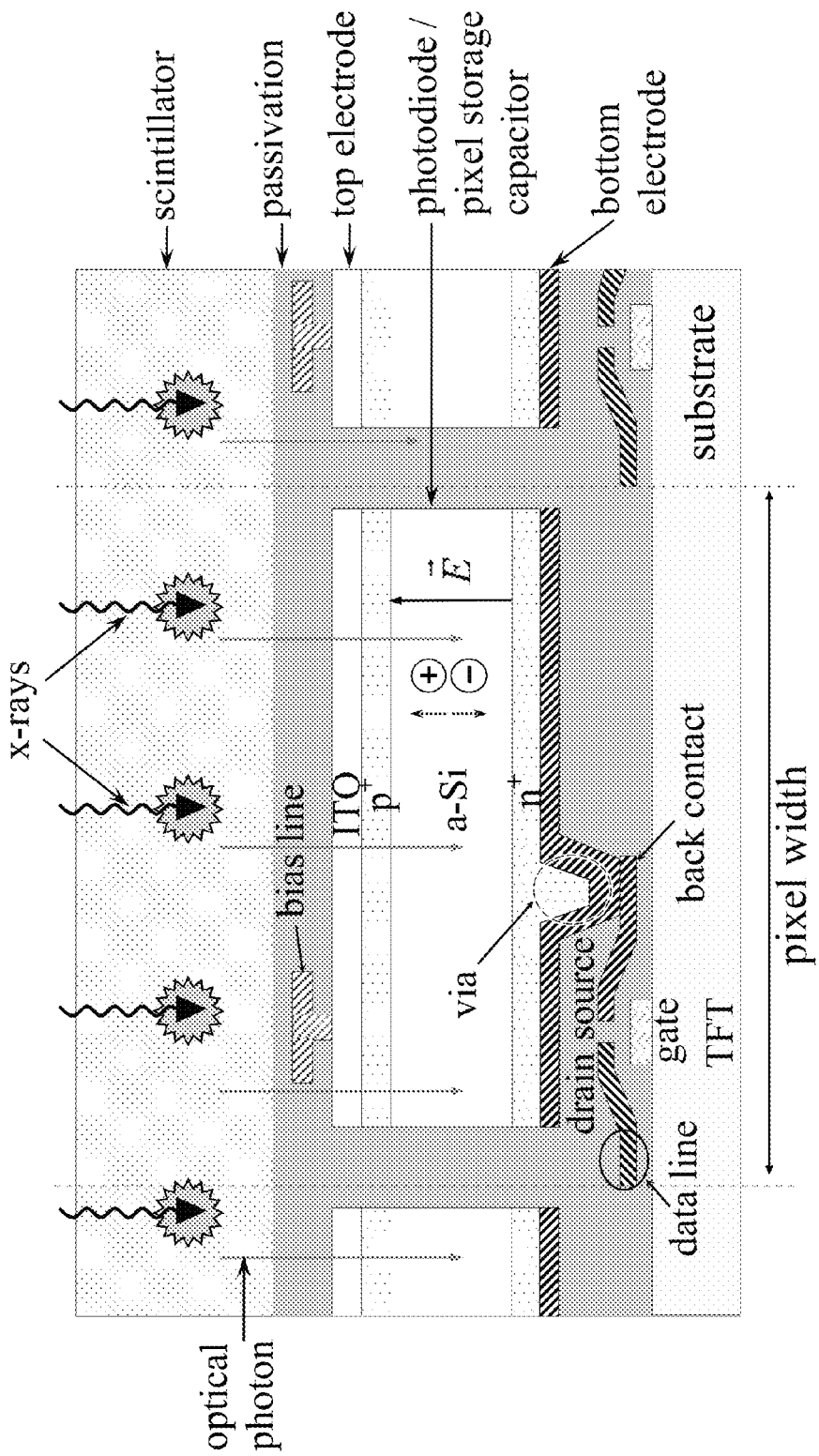
FIG. 11 is a schematic drawing of a cross sectional view of an indirect detection pixel design with a discrete, out-of-plane, photodiode structure.

FIG. 11. Schematic drawing of a cross sectional view of an indirect detection pixel design with a discrete, out-of-plane, photodiode structure. The view is parallel to the direction of the gate address line, which is not visible in this cross section. The labels, lines, arrows, symbols and conventions in the drawing are similar to those used in FIG. 6. The distance between the vertical dashed lines represents the width of one pixel. For reasons of clarity, the layers and features in this illustration are not drawn to scale. Also, the effect of the TFT and the via on the uniformity of the topology of the photodiode is not illustrated.

Figure 12:
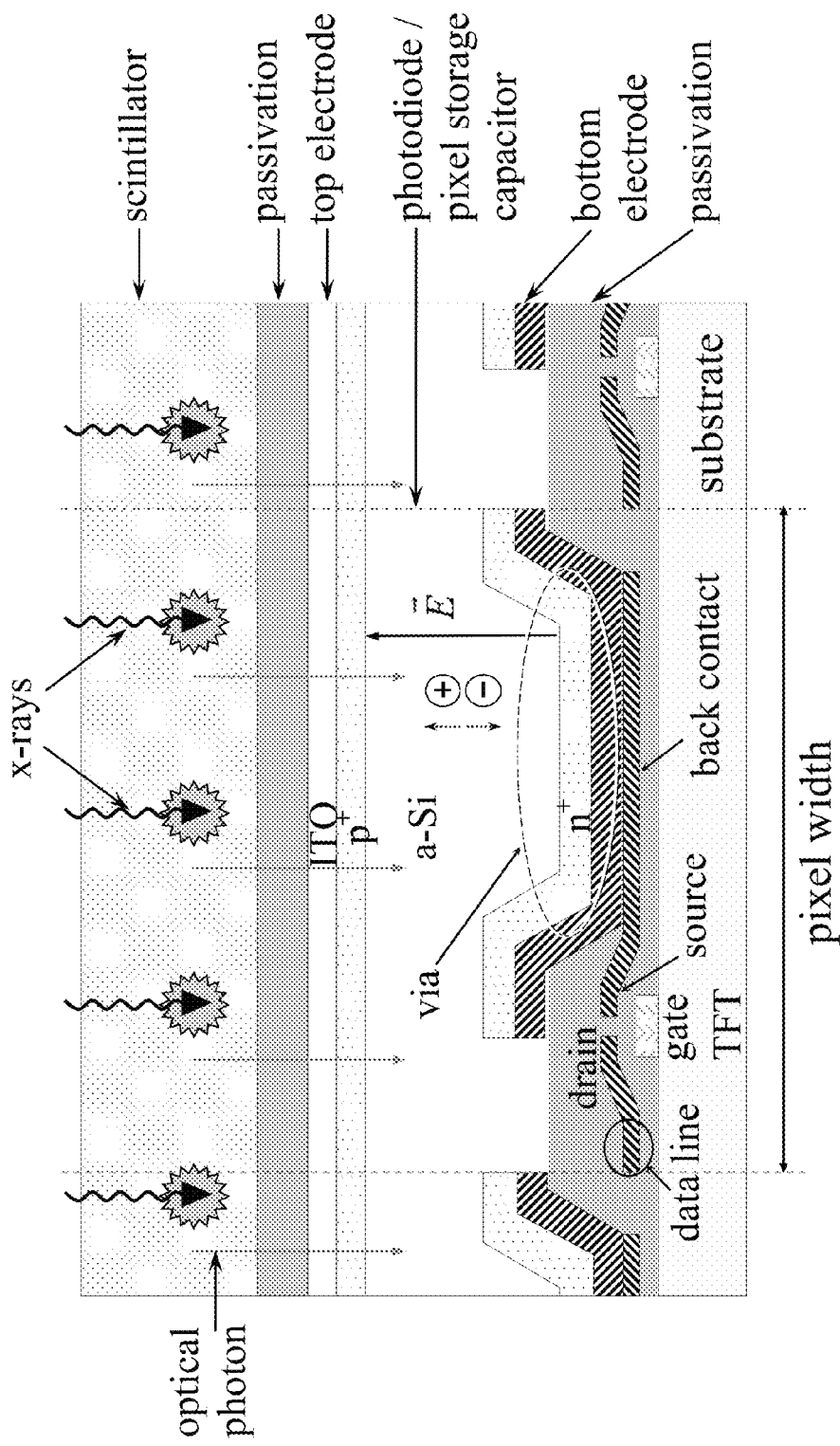
FIG. 12 is a schematic drawing of a cross sectional view of an indirect detection pixel design with a continuous, out-of-plane, photodiode structure.

FIG. 12. Schematic drawing of a cross sectional view of an indirect detection pixel design with a continuous, out-of-plane, photodiode structure. The view is parallel to the direction of the gate address line, which is not visible in this cross section. The labels, lines, arrows, symbols and conventions in the drawing are similar to those used in FIG. 11. The distance between the vertical dashed lines represents the width of one pixel. For reasons of clarity, the layers and features in this illustration are not drawn to scale. Also, the effect of the TFT and the via on the uniformity of the topology of the photodiode is not illustrated.

Figure 13:
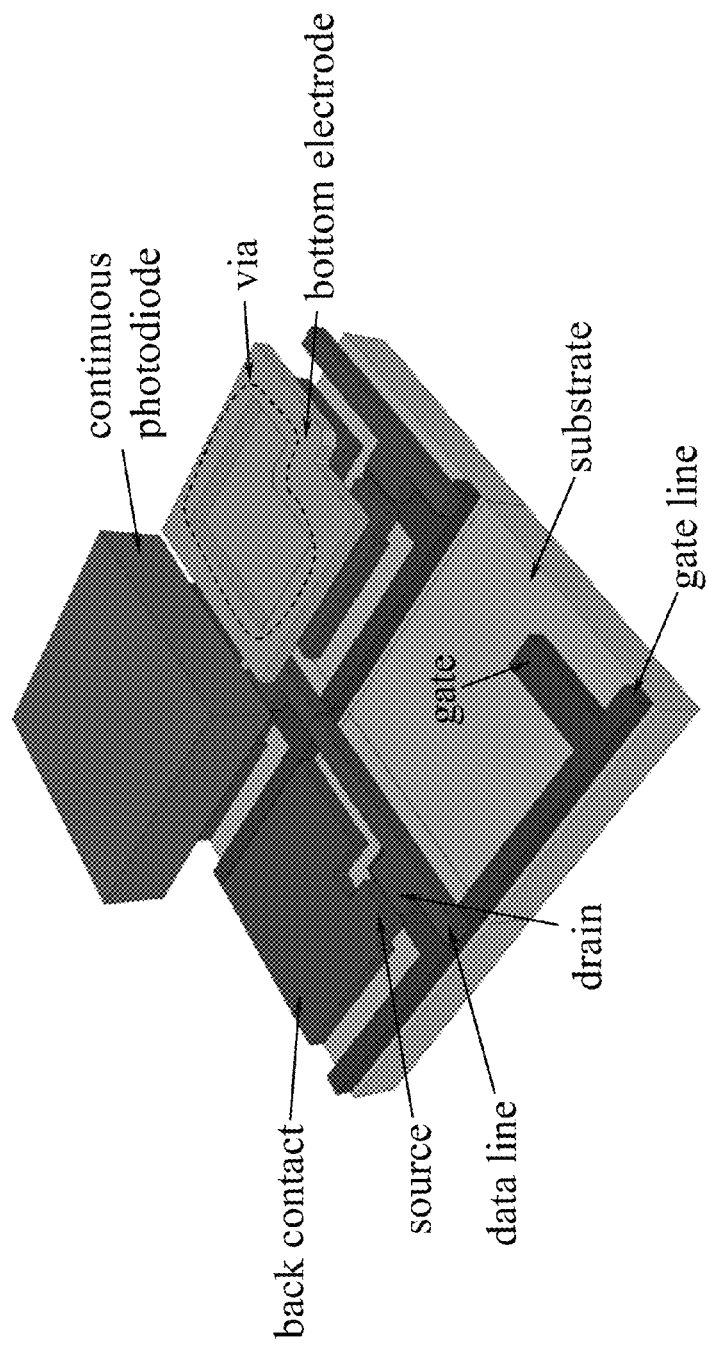
FIG. 13 is a schematic rendering of four adjacent pixels of an indirect detection active matrix array, corresponding to an implementation of the pixel circuit and architecture shown in FIGS. 5 and 12, respectively.

FIG. 13. Schematic rendering of four adjacent pixels of an indirect detection active matrix array. The design of these pixels represents an implementation of the pixel circuit and of the architecture illustrated in FIGS. 5 and 12, respectively. Each pixel in the drawing reveals varying degrees of the architectural detail of the design. In the pixel at the bottom of the figure, only the gate address line and the gate of the addressing TFT are shown. In the pixel on the left hand side, the source and drain of the addressing TFT, the data address line, and the back contact have been added. In the pixel on the right hand side, the bottom electrode, including the via connecting this electrode to the back contact (which resides within the region bounded by the dashed line), is illustrated. In the pixel drawing at the top of the figure, a simple representation of the continuous photodiode structure is shown, with the n$^+$ doped layer not visible and the remaining layers of the photodiode not distinguished.

Figure 14:
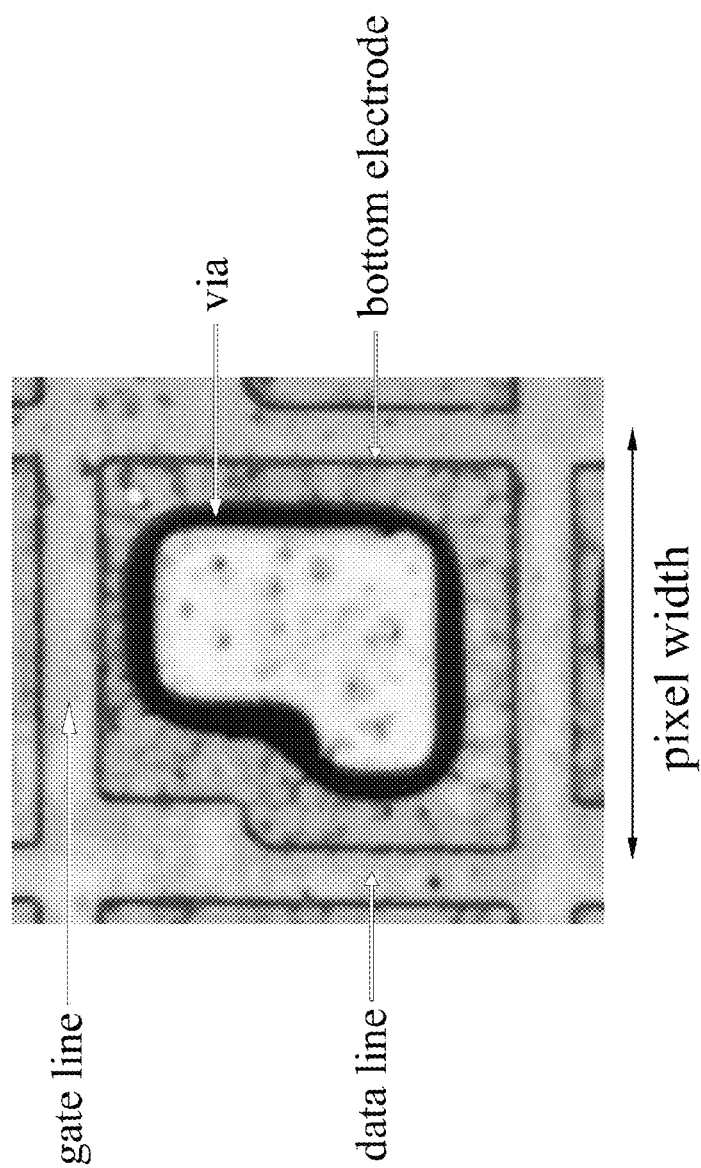
FIG. 14 is a photomicrograph of the top surface of an indirect detection active matrix array in the region of a single pixel, corresponding to an implementation of the pixel architecture in FIG. 12 and to the rendering in FIG. 13.

FIG. 14. Photomicrograph of the top surface of an indirect detection active matrix array in the region of a single pixel. The design represents an implementation of the architecture illustrated in FIG. 12 and corresponds to the rendering in FIG. 13. The locations of the gate address line, data address line, the bottom electrode, and the via connecting this electrode to the back contact are indicated. Note that the various details visible in the image correspond to the topology of the top of the continuous photodiode structure.

FIG. 15. Schematic circuit diagram for a pixel from an indirect detection array based on an active pixel design with a one-stage, in-pixel amplifier. The data address line, gate address line, reset TFT, TFT$_{RST}$, source follower TFT, TFT$_{SF}$, addressing TFT, TFT$_{ADDR}$, and photodiode, PD (with capacitance C$_{PD}$) are indicated. V$_{BIAS}$ is the magnitude of the reverse bias voltage applied to the top electrode of the photodiode and V$_{G-RST}$, V$_{D-RST}$ and V$_{CC}$ are other voltages used to operate the array. Two of the TFTs, TFT$_{RST}$ and TFT$_{ADDR}$, are illustrated as having a dual-gate structure. All the TFTs are n-type transistors.

FIG. 16. Schematic rendering of four adjacent pixels of an indirect detection array based on an active pixel design employing poly-Si TFTs. The design of these pixels represents an implementation of the pixel circuit illustrated in FIG. 15. The TFTs in this figure have structures that are similar to that of the poly-Si TFT illustrated in FIGS. 3 and 4. The photodiode has a continuous structure similar to that shown in FIG. 12. Each pixel in the drawing reveals varying degrees of the architectural detail of the design. In the pixel at the bottom of the figure, the gate of each TFT (formed from poly-Si), the active poly-Si used to form the channel of each TFT, the gate address line, and the reset voltage line that serves in the operation of the reset TFT are shown. In the pixel on the left hand side, the data address line, the back contact, a supply voltage line, as well as various traces and vias have been added. In the pixel on the right hand side, the bottom electrode, including vias connecting this electrode to the back contact, are illustrated. In the pixel at the top of the figure, a simple representation of the continuous photodiode structure is shown, with the patterned n$^+$ doped layer not visible and the remaining layers of the photodiode not distinguished.

FIG. 17. Photomicrograph of the top surface of an indirect detection array in the region of a single pixel. The design represents an implementation of the pixel circuit illustrated in FIG. 15 and corresponds to the rendering in FIG. 16. The photomicrograph is orientated such that the directions of the gate and data address lines of the array (which are below the continuous photodiode of the design) are aligned vertically and horizontally, respectively, along the plane of this image. Superimposed on the image is a box formed by thick, dashed lines (indicating the boundary of one complete pixel) and a thin, dashed, horizontal line (indicating the location of a cross sectional view appearing in later figures). Note that the various details visible in the image correspond to the topology of the top of the continuous photodiode structure.

FIG. 18. Schematic circuit diagram for a pixel from an indirect detection array based on an active pixel design with a two-stage, in-pixel amplifier. The data address line, gate address line, reset TFT, TFT$_{RST}$, common source amplifier TFT, TFT$_{CSA}$, active load TFT, TFT$_{AL}$, source follower TFT, TFT$_{SF}$, addressing TFT, TFT$_{ADDR}$, feed-back capacitor (with capacitance C$_{FB}$) and photodiode, PD (with capacitance C$_{PD}$) are indicated. V$_{BIAS}$ is the magnitude of the reverse bias voltage applied to the top electrode of the photodiode and V$_{G-RST}$, V$_{G-AL}$, V$_{CC}$ and V$_{GND}$ are other voltages used to operate the array. Two of the TFTs, TFT$_{RST}$ and TFT$_{ADDR}$, are illustrated as having a dual-gate structure. Among the TFTs, TFT$_{AL}$ is a p-type transistor while the remaining transistors are n-type.

FIG. 19. Schematic rendering of four adjacent pixels of an indirect detection array based on an active pixel design employing poly-Si TFTs. The design of these pixels represents an implementation of the pixel circuit illustrated in FIG. 18. The TFTs in this figure have structures that are similar to that of the poly-Si TFT illustrated in FIGS. 3 and 4. The photodiode has a continuous structure similar to that shown in FIG. 12. Each pixel in the drawing reveals varying degrees of the architectural detail of the design. In the pixel at the bottom of the figure, the gate of various TFTs (formed from poly-Si), the active poly-Si used to form the channel of each TFT, and the gate address line are shown. In the pixel on the left hand side, the data address line, the back contact, as well as various traces and vias have been added. In the pixel on the right hand side, the bottom electrode, including vias connecting this electrode to the back contact, are illustrated. In the pixel at the top of the figure, a simple representation of the continuous photodiode structure is shown, with the patterned n$^+$ doped layer not visible and the remaining layers of the photodiode not distinguished.

FIG. 20. Photomicrograph of the top surface of an indirect detection array in the region of a single pixel. The design represents an implementation of the pixel circuit illustrated in FIG. 18 and corresponds to the rendering in FIG. 19. The photomicrograph is orientated such that the directions of the gate and data address lines of the array (which are below the continuous photodiode of the design) are aligned vertically and horizontally, respectively, along the plane of this image. Superimposed on the image is a box formed by thick, dashed lines (indicating the boundary of one complete pixel) and a thin, dashed, horizontal line (indicating the location of a cross sectional view appearing in later figures). Note that the various details visible in the image correspond to the topology of the top of the continuous photodiode structure.

FIG. 21. Calculated cross sectional view of an indirect detection array based on a one-stage, in-pixel amplifier design employing poly-Si TFTs. The design represents an implementation of the pixel circuit illustrated in FIG. 15 and corresponds to the illustrations in FIGS. 16 and 17. The location of this cross section corresponds to a plane perpendicular to the top surface of the array, passing through the thin, dashed horizontal line appearing in FIG. 17. The horizontal field of view corresponds to a distance slightly larger than a single pixel, and the distance between the vertical dashed lines represents the width of one pixel. This illustration, created from a calculational simulation of the deposition, photolithographic, etching and other processes used in fabrication of the array, shows the order, structure and native topology of various features and materials in the array. For clarity of presentation, the drawing has been magnified by a factor of 8 in the direction perpendicular to the substrate relative to the direction parallel to the substrate, and only part of the substrate thickness is portrayed.

FIG. 22. Calculated cross sectional views of an indirect detection array based on a two-stage, in-pixel amplifier design employing poly-Si TFTs. The design represents an implementation of the pixel circuit illustrated in FIG. 18 and corresponds to the illustrations in FIGS. 19 and 20. The location of both cross sections corresponds to a plane perpendicular to the top surface of the array, passing through the thin, dashed horizontal line appearing in FIG. 20. (a) The horizontal field of view in this illustration corresponds to a distance slightly larger than a single pixel, and the distance between the vertical dashed lines represents the width of one pixel. (b) The horizontal field of view in this illustration corresponds to the same distance as the field of view in FIG. 21, and shows only part of one pixel. These illustrations, created from a calculational simulation of the deposition, photolithographic, etching and other processes used in fabrication of the array, shows the order, structure and native topology of various features and materials in the array. For clarity of presentation, the drawings have been magnified by a factor of 8 in the direction perpendicular to the substrate relative to the direction parallel to the substrate, and only part of the substrate thickness is portrayed.

FIG. 23. Top views of a one-stage, in-pixel amplifier array in the region of a single pixel corresponding to the design illustrated in FIG. 16. (a) Illustration created from the same calculational simulation used to create FIG. 21. (b) Photomicrograph of the surface of an actual realization of the array, corresponding to the photomicrograph in FIG. 17. Note that the various details visible in each view correspond to the native topology of the top of the continuous photodiode structure.

FIG. 24. Top views of a two-stage, in-pixel amplifier array in the region of a single pixel, corresponding to the design illustrated in FIG. 19. (a) Illustration created from the same calculational simulation used to create FIG. 22. (b) Photomicrograph of the surface of an actual realization of the array, corresponding to the photomicrograph in FIG. 20. Note that the various details visible in each view correspond to the native topology of the top of the continuous photodiode structure.

FIG. 25. Drawings illustrating the general concept of radius of curvature, which can be applied to the characterization of changes in the planarity of a surface. The degree of sharpness (i.e., abruptness) in the change of surface planarity is quantified by an arc of radius r. The sharper (i.e., more abrupt) change depicted in (a) has a shorter radius of curvature than the less sharp change depicted in (b). The scale of the drawings are such that $r_2=10\times r_1$.

Figure 26:
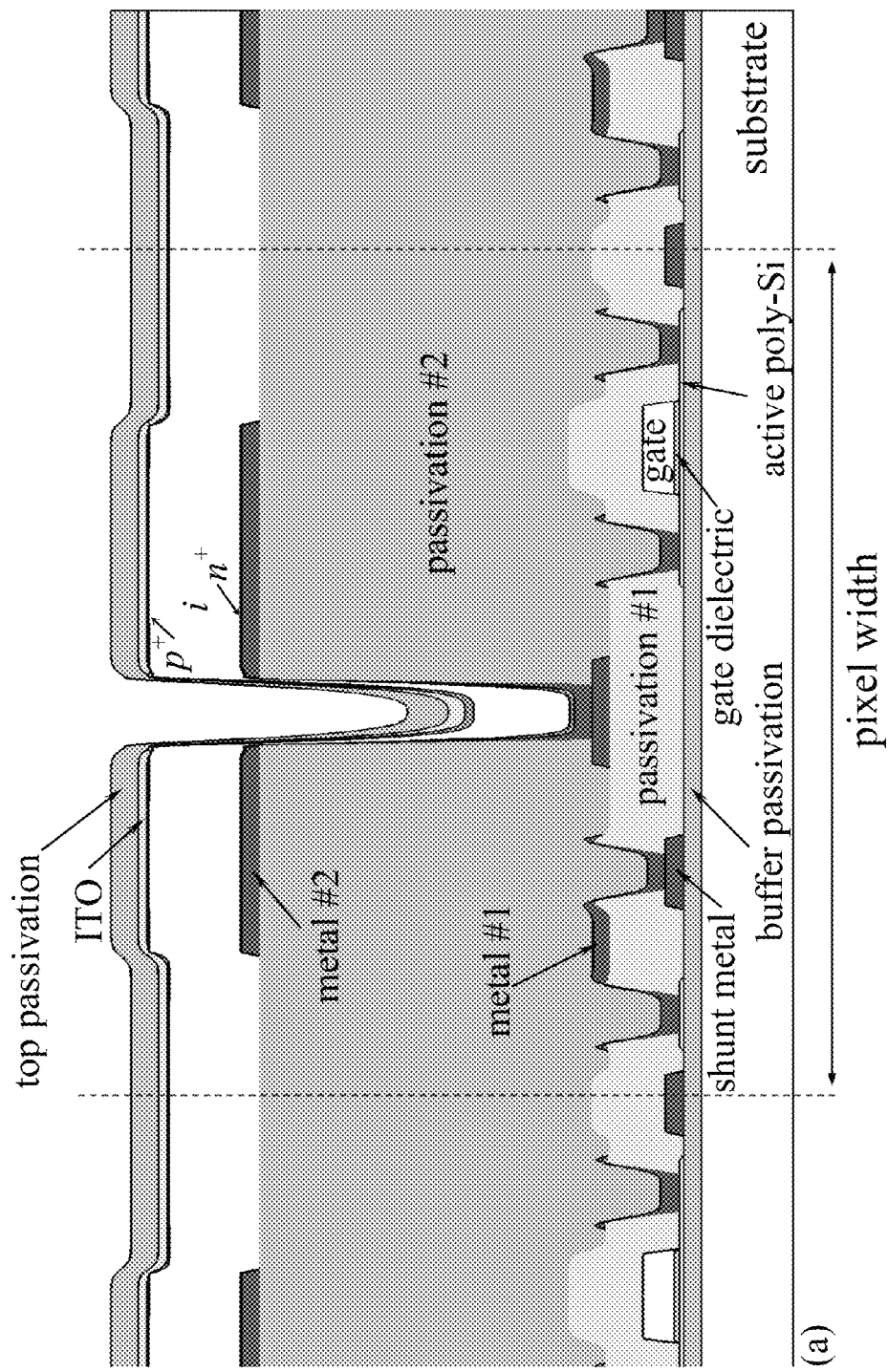
FIG. 26($a$) is a calculated cross sectional view of an indirect detection array, corresponding to FIG. 21, but with a more uniform topology achieved through complete planarization of passivation #2.
Figure 26:
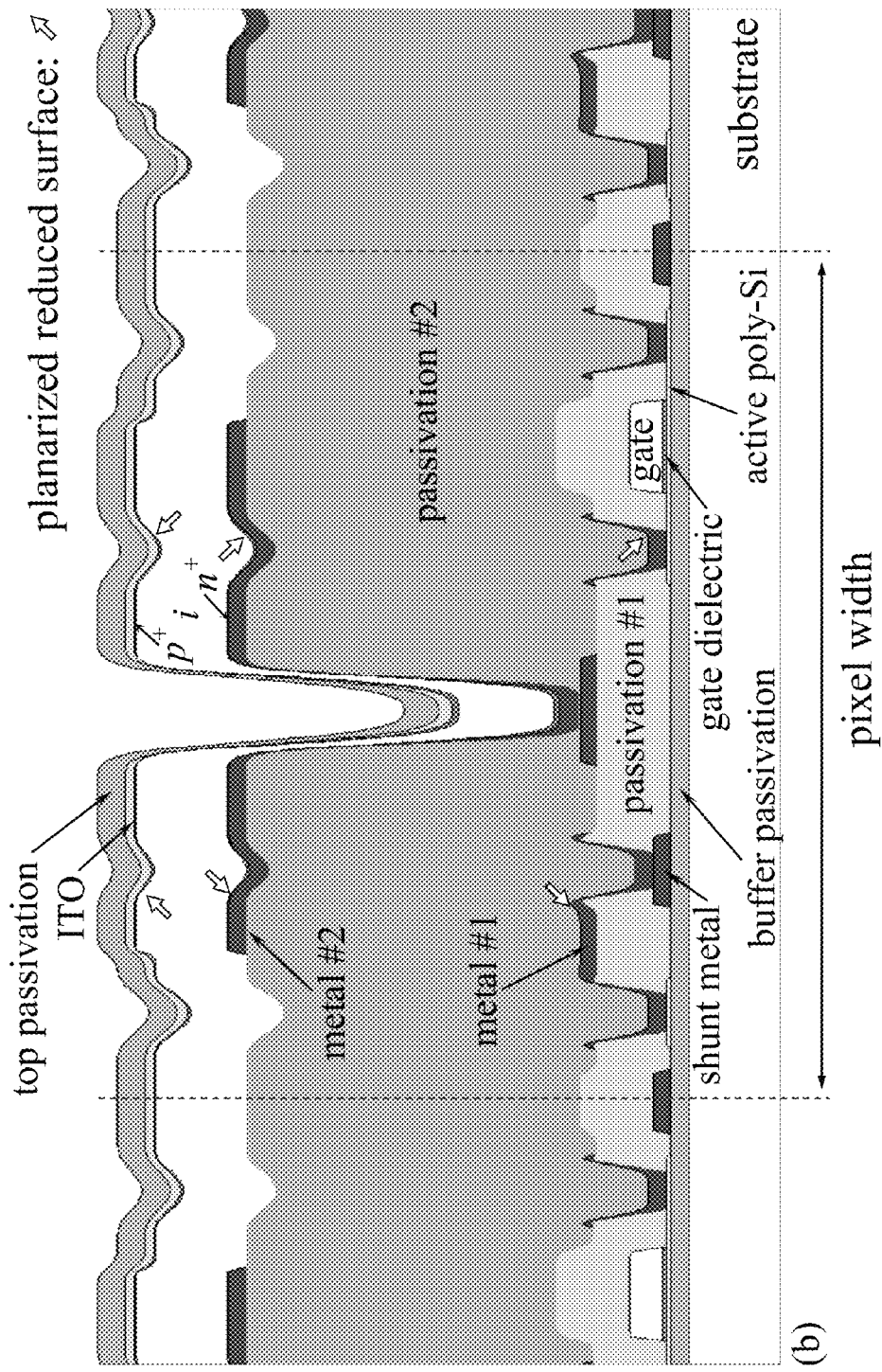

FIG. 26. Calculated cross sectional views of an indirect detection array based on a one-stage in-pixel amplifier design. (a) This view corresponds to the cross sectional view appearing in FIG. 21, but with a more uniform topology for the photodiode structure achieved through complete planarization of one of the passivation layers, passivation #2. (b) This view also corresponds to the cross sectional view appearing in FIG. 21, but with a more uniform topology for the photodiode structure achieved through partial planarization of passivation #2.

FIG. 27. Calculated cross sectional views of an indirect detection array based on a two-stage in-pixel amplifier design. The views in (a) and (b) correspond to the cross sectional views appearing in FIGS. 22(a) and 22(b), respectively, but with a more uniform topology for the photodiode structure achieved through complete planarization of one of the passivation layers, passivation #2.

FIG. 28. Calculated cross sectional view of an indirect detection array based on a one-stage in-pixel amplifier design. This view corresponds to the cross sectional view appearing in FIG. 26(a), but with a more uniform topology for the photodiode structure achieved through smoothing of the peripheral edges of the bottom electrode (formed from the metal #2 layer) of the photodiode.

FIG. 29. Calculated cross sectional view of an indirect detection array based on a two-stage in-pixel amplifier design. This view corresponds to the cross sectional view appearing in FIG. 27(a), but with a more uniform topology for the photodiode structure achieved through smoothing of the peripheral edges of the bottom electrode (formed from the metal #2 layer) of the photodiode.

FIG. 30. Calculated cross sectional view of an indirect detection array based on a one-stage in-pixel amplifier design. This view corresponds to the cross sectional view appearing in FIG. 28, but with an even more uniform topology for the photodiode structure achieved through narrowing of the vias that connect the bottom electrode of the photodiode with the back contact and filling those vias with metal.

FIG. 31. Top views of a one-stage, in-pixel amplifier array in the region of a single pixel, created from calculational simulations. (a) Illustration corresponding to the same view shown in FIG. 23(a). (b) Illustration corresponding to that in (a), but with a more uniform topology for the photodiode structure achieved through complete planarization of one of the passivation layers, passivation #2. (c) Illustration corresponding to that in (b), but with a more uniform topology for the photodiode structure achieved through smoothing of the peripheral edges of the bottom electrode of the photodiode. (d) Illustration corresponding to that in (c), but with an even more uniform topology for the photodiode structure achieved through narrowing of the vias that connect the bottom electrode of the photodiode with the back contact and filling those vias with metal.

FIG. 32. Top views of a two-stage, in-pixel amplifier array in the region of a single pixel, created from calculational simulations. (a) Illustration corresponding to the same view shown in FIG. 24(a). (b) Illustration corresponding to that in (a), but with a more uniform topology for the photodiode structure achieved through complete planarization of one of the passivation layers, passivation #2. (c) Illustration corresponding to that in (b), but with a more uniform topology for the photodiode structure achieved through smoothing of the peripheral edges of the bottom electrode of the photodiode. (d) Illustration corresponding to that in (c), but with an even more uniform topology for the photodiode structure achieved through narrowing of the vias that connect the bottom electrode of the photodiode with the back contact and filling those vias with metal.

FIG. 33. Calculated cross sectional views of an indirect detection array based on a one-stage in-pixel amplifier design. (a) This view corresponds to the cross sectional view appearing in FIG. 21, but with a more uniform topology for the top electrode of the photodiode structure achieved through complete planarization of the layer of intrinsic a-Si in the photodiode. (b) This view corresponds to the cross sectional view appearing in FIG. 21, but with a more uniform topology for the top electrode of the photodiode structure achieved through partial planarization of the layer of intrinsic a-Si in the photodiode.

FIG. 34. Top views of a one-stage, in-pixel amplifier array in the region of a single pixel, created from calculational simulations. (a) Illustration corresponding to the same view shown in FIG. 23(a). (b) Illustration corresponding to that in (a), but with a more uniform topology for the photodiode structure achieved through partial planarization of the layer of intrinsic a-Si in the photodiode. (c) Illustration corresponding to that in (b), but with a more uniform topology for the photodiode structure achieved through complete planarization of the layer of intrinsic a-Si in the photodiode.

The invention claimed is:

1. A radiation sensor comprising:
a scintillation layer configured to emit photons upon interaction with ionizing radiation;
a photodetector including in order a first electrode, a photosensitive layer, and a photon-transmissive second electrode disposed in proximity to the scintillation layer;
said photosensitive layer configured to generate electron-hole pairs upon interaction with a part of said photons;
pixel circuitry electrically connected to the first electrode and configured to measure an imaging signal indicative of said electron-hole pairs generated in the photosensitive layer;
a planarization layer disposed on the pixel circuitry between the first electrode and the pixel circuitry such that the first electrode is above a plane including the pixel circuitry;
a surface of at least one of said first electrode and said second electrode at least partially overlapping the pixel circuitry and having a surface inflection above features of the pixel circuitry; and
said surface inflection having a radius of curvature greater than one half micron.

2. The sensor of claim 1, wherein said surface inflection has a radius of curvature greater than one micron.

3. The sensor of claim 1, wherein said surface inflection has a radius of curvature greater than five microns.

4. The sensor of claim 1, wherein said surface inflection has a radius of curvature greater than ten microns.

5. The sensor of claim 1, wherein said surface inflection has a radius of curvature greater than one hundred microns.

6. The sensor of claim 1, wherein said planarization layer at least partially planarizes over said features of the pixel circuitry.

7. The sensor of claim 1, wherein said planarization layer at least partially planarizes over array features, over electrical via interconnects connecting to the source or drain of TFTs, over one-stage in-pixel amplifier elements, or over two-stage in-pixel amplifier elements.

8. The sensor of claim 1, wherein said planarization layer comprises at least one of a passivation layer, a dielectric layer, or an insulation layer.

9. The sensor of claim 1, further comprising:
address and data lines disposed underneath the photodetector; and
said planarization layer is disposed on the address and data lines and on vias of the address and data lines.

10. The sensor of claim 1, further comprising:
an electrical via interconnect extending through the planarization layer and connecting the first electrode to said pixel circuitry, wherein a surface inflection of the electrical via interconnect in contact with the photosensitive layer has a radius of curvature greater than one half micron.

11. The sensor of claim 10, wherein said surface of the electrical via interconnect has a radius of curvature greater than one micron.

12. The sensor of claim 10, wherein said surface of the electrical via interconnect has a radius of curvature greater than five microns.

13. The sensor of claim 10, wherein said surface of the electrical via interconnect has a radius of curvature greater than ten microns.

14. The sensor of claim 10, wherein said surface of the electrical via interconnect has a radius of curvature greater than one hundred microns.

15. The sensor of claim 1, wherein the photosensitive layer comprises one of a p-i-n semiconductor stack, a n-i-p semiconductor stack, or a metal insulator semiconductor stack.

16. The sensor of claim 1, wherein said pixel circuitry comprises one of thin film transistors, diodes, capacitors, resistors, traces, vias, control lines, address lines, and ground planes.

17. The sensor of claim 1, wherein said pixel circuitry comprises one of an amorphous semiconductor transistor or a polycrystalline semiconductor transistor or a microcrystalline semiconductor transistor.

18. The sensor of claim 1, wherein said pixel circuitry comprises at least one of an addressing transistor, an amplifier transistor, and a reset transistor.

19. The sensor of claim 1, wherein said pixel circuitry comprises at least one of amorphous silicon, low temperature amorphous silicon, and microcrystalline silicon.

20. The sensor of claim 1, wherein said pixel circuitry comprises at least one of a silicon semiconductor, a chalcogenide semiconductor, a cadmium selenide semiconductor, an organic semiconductor, an organic small molecule or polymer semiconductor, carbon nanotubes, or graphene.

21. The sensor of claim 1, wherein said photosensitive layer comprises at least one of 1) a continuous photosensitive layer extending across plural photodetector pixels or 2) discrete photosensitive layers associated with respective ones of the plural photodetector pixels.

22. The sensor of claim 1, wherein said scintillation layer comprises at least one of $CsI:Tl$, $Gd_2O_2S:Tb$, $CsI:Na$, $NaI:Tl$, $CaWO_4$, $ZnWO_4$, $CdWO_4$, $Bi_4Ge_3O_{12}$, $Lu_{1.8}Yb_{0.2}SiO_5:Ce$, $Gd_2SiO_5:Ce$, $BaFCl:Eu^{2+}$, $BaSO_4:Eu^{2+}$, $BaFBr:Eu^{2+}$, $LaOBr:Tb^{3+}$, $LaOBr:Tm^{3+}$, $La_2O_2S:Tb^{3+}$, $Y_2O_2S:Tb^{3+}$, $YTaO_4$, $YTaO_4:Nb$, $ZnS:Ag$, $(Zn,Cd)S:Ag$, $ZnSiO_4:Mn^{2+}$, $CsI$, $LiI:Eu^{2+}$, $PbWO_4$, $Bi_4Si_3O_{12}$, $Lu_2SiO_5:Ce^{3+}$, $YAlO_3:Ce^{3+}$, $CsF$, $CaF_2:Eu^{2+}$, $BaF_2$, $CeF_3$, $Y_{1.34}Gd_{0.6}O_3:Eu^{3+}$, $Pr$, $Gd_2O_2S:Pr^{3+}$, $Ce$, SCGI, $HFG:Ce^{3+}$ (5%) and $C_{14}H_{10}$.

23. The sensor of claim 1, further comprising:
a base substrate supporting the pixel circuitry, the photodetector, and the scintillation layer; and
a plurality of photodetector pixels arranged in a regular pattern on the base substrate, wherein
said photon-transmissive second electrode forms a bias plane for said plurality of the photodetector pixels.

24. The sensor of claim 23, wherein a part of the pixel circuitry is disposed on the base substrate in a gap region between adjacent photodetector pixels.

25. The sensor of claim 24, wherein said part of the pixel circuitry disposed in the gap region comprises one of thin film transistors, diodes, capacitors, resistors, vias, traces, control lines, address lines, and ground planes.

26. The sensor of claim 23, wherein said first electrode has beveled ends terminating near the gap region.

27. The sensor of claim 1, wherein a dark current, normalized to unit photodetector area, between the first electrode and the photon-transmissive second electrode is less than 10 $pA/mm^2$.

28. The sensor of claim 1, wherein a dark current, normalized to unit photodetector area, between the first electrode and the photon-transmissive second electrode is less than 5 $pA/mm^2$.

29. The sensor of claim 1, wherein a dark current, normalized to unit photodetector area, between the first electrode and the photon-transmissive second electrode is less than 1 $pA/mm^2$.

30. The sensor of claim 1, wherein a dark current, normalized to unit photodetector area, between the first electrode and the photon-transmissive second electrode is less than 0.5 $pA/mm^2$.

31. The sensor of claim 1, wherein an electric field in regions in the photosensitive layer proximate said surface inflection is greater than 60 percent and less than 300 percent of an electric field in the photosensitive layer between a pair of parallel first and second electrodes.

32. The sensor of claim 1, further comprising a metal plate disposed on the scintillation layer or on an encapsulation on the scintillation layer.

33. A radiation sensor comprising:
a scintillation layer configured to emit photons upon interaction with ionizing radiation;
a photodetector including in order a first electrode, a photosensitive layer, and a photon-transmissive second electrode disposed in proximity to the scintillation layer;
said photosensitive layer configured to generate electron-hole pairs upon interaction with a part of said photons;
pixel circuitry electrically connected to the first electrode and configured to measure an imaging signal indicative of said electron-hole pairs generated in the photosensitive layer; and
a planarization layer disposed on the pixel circuitry between the first electrode and the pixel circuitry such that the first electrode is above a plane including the pixel circuitry,
wherein
the planarization layer has a first surface inflection along a peripheral edge of features of the pixel circuitry elements,
the first electrode has a second surface inflection above the first surface inflection and on a surface of the planarization layer opposite the base substrate, and
said second surface inflection has a radius of curvature greater than one-half micron.

34. A radiation sensor comprising:
a scintillation layer configured to emit photons upon interaction with ionizing radiation;
a photodetector including in order a first electrode, a photosensitive layer, and a photon-transmissive second electrode disposed in proximity to the scintillation layer;
said photosensitive layer configured to generate electron-hole pairs upon interaction with a part of said photons;
pixel circuitry electrically connected to the first electrode and configured to measure an imaging signal indicative of said electron-hole pairs generated in the photosensitive layer;
a planarization layer disposed on the pixel circuitry between the first electrode and the pixel circuitry such that the first electrode is above a plane including the pixel circuitry; and
said photodetector having a dark current, normalized to unit photodetector area, between the first electrode and the photon-transmissive second electrode that is less than 10 $pA/mm^2$.

35. A radiation sensor comprising:
a scintillation layer configured to emit photons upon interaction with ionizing radiation;
a photodetector including in order a first electrode, a photosensitive layer, and a photon-transmissive second electrode disposed in proximity to the scintillation layer;
said photosensitive layer configured to generate electron-hole pairs upon interaction with a part of said photons;
pixel circuitry electrically connected to the first electrode and configured to measure an imaging signal indicative of said electron-hole pairs generated in the photosensitive layer;
a planarization layer disposed on the pixel circuitry between the first electrode and the pixel circuitry such that the first electrode is above a plane including the pixel circuitry; and
said photodetector having a level of charge trapping per photodetector pixel, quantified by the amount of said imaging signal lost to trapping during a single radiographic frame, and expressed as a percentage of the imaging signal obtained under conditions where charge trapping and charge release are in equilibrium, that is less than ~20%.

36. A radiation sensor comprising:
a scintillation layer configured to emit photons upon interaction with ionizing radiation;
a photodetector including in order a first electrode, a photosensitive layer, and a photon-transmissive second electrode disposed in proximity to the scintillation layer;
said photosensitive layer configured to generate electron-hole pairs upon interaction with a part of said photons;
pixel circuitry electrically connected to the first electrode and configured to measure an imaging signal indicative of said electron-hole pairs generated in the photosensitive layer;
a planarization layer disposed on the pixel circuitry between the first electrode and the pixel circuitry such that the first electrode is above a plane including the pixel circuitry; and
said photodetector having a charge release per photodetector pixel, quantified by the amount of said imaging signal released from trapping states during the first frame acquired in the absence of radiation following a series of frames acquired with radiation and under conditions where charge trapping and charge release are in equilibrium, and expressed as a percentage of the imaging signal obtained under conditions where charge trapping and release are in equilibrium, that is less than ~15%.

37. A radiation sensor comprising:
a scintillation layer configured to emit photons upon interaction with ionizing radiation;
a photodetector including in order a first electrode, a photosensitive layer, and a photon-transmissive second electrode disposed in proximity to the scintillation layer;
said photosensitive layer configured to generate electron-hole pairs upon interaction with a part of said photons;
pixel circuitry electrically connected to the first electrode and configured to measure an imaging signal indicative of said electron-hole pairs generated in the photosensitive layer;
a planarization layer disposed on the pixel circuitry between the first electrode and the pixel circuitry such that the first electrode is above a plane including the pixel circuitry; and
said photodetector having a lag per photodetector pixel, quantified by the amount of said imaging signal that originates from charge trapped in one or more previous frames and is released from trapping states during the first frame acquired in the absence of radiation following one, or a series of frames acquired with radiation, and expressed as a percentage of the imaging signal from the previous frame, that is less than ~15%.

38. A radiation sensor comprising:
a scintillation layer configured to emit photons upon interaction with ionizing radiation;
a photodetector including in order a first electrode, a photosensitive layer, and a photon-transmissive second electrode disposed in proximity to the scintillation layer;
said photosensitive layer configured to generate electron-hole pairs upon interaction with a part of said photons;
pixel circuitry electrically connected to the first electrode and configured to measure an imaging signal indicative of said electron-hole pairs generated in the photosensitive layer;
a planarization layer disposed on the pixel circuitry between the first electrode and the pixel circuitry such that the first electrode is above a plane including the pixel circuitry;
said first electrode extending over a part of the pixel circuitry and having a lateral edge, a longitudinal edge, and a corner at the intersection of the lateral and longitudinal edges; and
at least one of said lateral edge and said longitudinal edge comprising a beveled edge.

39. A radiation sensor comprising:
a scintillation layer configured to emit photons upon interaction with ionizing radiation;
a photodetector pixel including in order a first electrode, a photosensitive layer, and a photon-transmissive second electrode disposed in proximity to the scintillation layer;
said photosensitive layer configured to generate electron-hole pairs upon interaction with a part of said photons;
pixel circuitry electrically connected to the first electrode and configured to measure an imaging signal indicative of said electron-hole pairs generated in the photosensitive layer;
a passivation layer disposed on the pixel circuitry between the first electrode and the pixel circuitry such that the first electrode is disposed above a plane including the pixel circuitry;
the passivation layer having a first surface inflection above the pixel circuitry elements;
said second electrode having a second surface inflection above the first surface inflection; and
said second surface inflection having a radius of curvature greater than one-half a micron.

40. A radiation sensor comprising:
a scintillation layer configured to emit photons upon interaction with ionizing radiation;
a photodetector including in order a first electrode, a photosensitive layer, and a photon-transmissive second electrode disposed in proximity to the scintillation layer;
said photosensitive layer configured to generate electron-hole pairs upon interaction with a part of said photons;
pixel circuitry electrically connected to the first electrode and configured to measure an imaging signal indicative of said electron-hole pairs generated in the photosensitive layer;
a passivation layer disposed on the pixel circuitry between the first electrode and the pixel circuitry such that the first electrode is above a plane including the pixel circuitry;
a surface of at least one of said first electrode and said second electrode at least partially overlapping the pixel circuitry and exhibiting no surface features indicative of the underlying pixel circuitry.

41. A radiation sensor comprising:
a photoconductor detector including in order a first electrode, a photoconductive layer, and an ionizing radiation transmissive second electrode, and said photoconductive layer configured to generate electron-hole pairs upon interaction with ionizing radiation;
pixel circuitry electrically connected to the first electrode and configured to measure an imaging signal indicative of said electron-hole pairs generated in the photoconductive layer;
a planarization layer disposed on the pixel circuitry between the first electrode and the pixel circuitry such that the first electrode is above a plane including the pixel circuitry;
a surface of at least one of said first electrode and said second electrode at least partially overlapping the pixel circuitry and having a surface inflection above features of the pixel circuitry; and
said surface inflection having a radius of curvature greater than one half micron.

42. The sensor of claim 41, wherein the photoconductive layer comprises at least one of VB-VIB, VB-VIIB, IIB-VIB, IIB-VB, IIIB-VB, IIIB-VIB, IB-VIB, and IVB-VIIB semiconductors.

43. The sensor of claim 41, wherein the photoconductive layer comprises at least one of a-Se, $PbI_2$, $HgI_2$, PbO, CdZnTe, CdTe, $Bi_2S_3$, $Bi_2Se_3$, $BiI_3$, $BiBr_3$, CdS, CdSe, HgS, $Cd_2P_3$, InAs, InP, $In_2S_3$, $In_2Se_3$, $Ag_2S$, $PbI_4^{-2}$ and $Pb_2I_7^{-3}$.

44. A radiation sensor comprising:
a photoconductor detector including in order a first electrode, a photoconductive layer, and an ionizing radiation transmissive second electrode, and said photoconductive layer configured to generate electron-hole pairs upon interaction with ionizing radiation;
pixel circuitry electrically connected to the first electrode and configured to measure an imaging signal indicative of said electron-hole pairs generated in the photoconductive layer;
a planarization layer disposed on the pixel circuitry between the first electrode and the pixel circuitry such that the first electrode is above a plane including the pixel circuitry, wherein
the planarization layer has a first surface inflection along a peripheral edge of features of the pixel circuitry elements,
the first electrode has a second surface inflection above the first surface inflection and on a surface of the planarization layer opposite the base substrate, and
said second surface inflection has a radius of curvature greater than one-half micron.

45. A radiation sensor comprising:
a photoconductor detector including in order a first electrode, a photoconductive layer, and an ionizing radiation transmissive second electrode, and said photoconductive layer configured to generate electron-hole pairs upon interaction with ionizing radiation;
pixel circuitry electrically connected to the first electrode and configured to measure an imaging signal indicative of said electron-hole pairs generated in the photoconductive layer;
a planarization layer disposed on the pixel circuitry between the first electrode and the pixel circuitry such that the first electrode is above a plane including the pixel circuitry; and
said photoconductor detector having a dark current, normalized to unit photoconductor detector area, between the first electrode and the second electrode that is less than 10 pA/mm$^2$.

46. A radiation sensor comprising:
a photoconductor detector including in order a first electrode, a photoconductive layer, and an ionizing radiation transmissive second electrode, and said photoconductive layer configured to generate electron-hole pairs upon interaction with ionizing radiation;
pixel circuitry electrically connected to the first electrode and configured to measure an imaging signal indicative of said electron-hole pairs generated in the photoconductive layer;
a planarization layer disposed on the pixel circuitry between the first electrode and the pixel circuitry such that the first electrode is above a plane including the pixel circuitry; and
said photoconductor detector having a level of charge trapping per photoconductor detector pixel, quantified by the amount of said imaging signal lost to trapping during a single radiographic frame, and expressed as a percentage of the imaging signal obtained under conditions where charge trapping and charge release are in equilibrium, that is less than ~20%.

47. A radiation sensor comprising:
a photoconductor detector including in order a first electrode, a photoconductive layer, and an ionizing radiation transmissive second electrode, and said photoconductive layer configured to generate electron-hole pairs upon interaction with ionizing radiation;
pixel circuitry electrically connected to the first electrode and configured to measure an imaging signal indicative of said electron-hole pairs generated in the photoconductive layer;
a planarization layer disposed on the pixel circuitry between the first electrode and the pixel circuitry such that the first electrode is above a plane including the pixel circuitry; and
said photoconductor detector having a charge release per photoconductor detector pixel, quantified by the amount of said imaging signal released from trapping states during the first frame acquired in the absence of radiation following a series of frames acquired with radiation and under conditions where charge trapping and charge release are in equilibrium, and expressed as a percentage of the imaging signal obtained under conditions where charge trapping and release are in equilibrium, that is less than ~15%.

48. A radiation sensor comprising:
a photoconductor detector including in order a first electrode, a photoconductive layer, and an ionizing radiation transmissive second electrode, and said photoconductive layer configured to generate electron-hole pairs upon interaction with ionizing radiation;
pixel circuitry electrically connected to the first electrode and configured to measure an imaging signal indicative of said electron-hole pairs generated in the photoconductive layer;
a planarization layer disposed on the pixel circuitry between the first electrode and the pixel circuitry such that the first electrode is above a plane including the pixel circuitry; and
said photoconductor detector having a lag per photoconductor detector pixel, quantified by the amount of said imaging signal that originates from charge trapped in one or more previous frames and is released from trapping states during the first frame acquired in the absence of radiation following one, or a series of frames acquired with radiation, and expressed as a percentage of the imaging signal from the previous frame, that is less than ~15%.

49. A radiation sensor comprising:
a photoconductor detector including in order a first electrode, a photoconductive layer, and an ionizing radiation transmissive second electrode, and said photoconductive layer configured to generate electron-hole pairs upon interaction with ionizing radiation;
pixel circuitry electrically connected to the first electrode and configured to measure an imaging signal indicative of said electron-hole pairs generated in the photoconductive layer;
a planarization layer disposed on the pixel circuitry between the first electrode and the pixel circuitry such that the first electrode is above a plane including the pixel circuitry; and
said first electrode extending over the pixel circuitry and having a lateral edge, a longitudinal edge, and a corner at the intersection of the lateral and longitudinal edges; and
at least one of said lateral edge and said longitudinal edge comprising a beveled edge.

50. A radiation sensor comprising:
a photoconductor detector including in order a first electrode, a photoconductive layer, and an ionizing radiation transmissive second electrode, and said photoconductive layer configured to generate electron-hole pairs upon interaction with ionizing radiation;
pixel circuitry electrically connected to the first electrode and configured to measure an imaging signal indicative of said electron-hole pairs generated in the photoconductive layer;
a passivation layer disposed on the pixel circuitry between the first electrode and the pixel circuitry such that the first electrode is above a plane including the pixel circuitry;
the passivation layer having a first surface inflection above the pixel circuitry elements;
said second electrode having a second surface inflection above the first surface inflection; and
said second surface inflection having a radius of curvature greater than one-half a micron.

51. A radiation sensor comprising:
a photoconductor detector including in order a first electrode, a photoconductive layer, and an ionizing radiation transmissive second electrode;
said photoconductive layer configured to generate electron-hole pairs upon interaction with ionizing radiation;
pixel circuitry electrically connected to the first electrode and configured to measure an imaging signal indicative of said electron-hole pairs generated in the photoconductive layer;
a passivation layer disposed on the pixel circuitry between the first electrode and the pixel circuitry such that the first electrode is above a plane including the pixel circuitry;
a surface of at least one of said first electrode and said second electrode at least partially overlapping the pixel circuitry and exhibiting no surface features indicative of the underlying pixel circuitry.

52. A method for fabricating a radiation sensor, comprising:
forming pixel circuitry elements on a base substrate;
forming a planarization layer over the pixel circuitry elements;
forming a hole in the planarization layer to expose a connection to the pixel circuitry elements;
metallizing the patterned hole;
forming a first electrode in electrical contact to the metallized hole; and
forming on the first electrode a layer sensitive to light or ionizing radiation,
wherein forming a planarization layer provides, on a surface of the first electrode at least partially overlapping the pixel circuitry, a surface inflection, above features of the pixel circuitry, having a radius of curvature greater than one half micron.

53. A method for fabricating a radiation sensor, comprising:
forming pixel circuitry elements on a base substrate;
forming above the pixel circuitry a first electrode and a photosensitive layer;
planarizing the photosensitive layer;
forming on the planarized photosensitive layer a photon-transmissive second electrode; and
forming a scintillator layer on the photon-transmissive second electrode,
wherein at least one of the first electrode and the second electrode has a surface inflection, above features of the pixel circuitry, having a radius of curvature greater than one half micron.

54. A method for fabricating a radiation sensor, comprising:
forming pixel circuitry elements on a base substrate;
forming a planarization layer over the pixel circuitry elements;
forming a hole in the planarization layer to expose a connection to the pixel circuitry elements;
metallizing the patterned hole;
forming a first electrode in electrical contact to the metallized hole; and
forming on the first electrode a layer sensitive to light or ionizing radiation,
wherein forming a planarization layer provides a surface of said first electrode, at least partially overlapping the pixel circuitry, that exhibits no surface features indicative of the underlying pixel circuitry.

55. A method for fabricating a radiation sensor, comprising:
forming pixel circuitry elements on a base substrate;
forming above the pixel circuitry a first electrode and a photosensitive layer;
planarizing the photosensitive layer;
forming on the planarized photosensitive layer a photon-transmissive second electrode; and
forming a scintillator layer on the photon-transmissive second electrode,
wherein planarizing the photosensitive layer provides a surface of said second electrode, at least partially overlapping the pixel circuitry, that exhibits no surface features indicative of the underlying pixel circuitry.

56. A radiation sensor comprising:
a scintillation layer configured to emit photons upon interaction with ionizing radiation;
a photodetector including in order a first electrode, a photosensitive layer, and a photon-transmissive second electrode disposed in proximity to the scintillation layer;
said photosensitive layer configured to generate electron-hole pairs upon interaction with a part of said photons;
pixel circuitry electrically connected to the first electrode and configured to measure an imaging signal indicative of said electron-hole pairs generated in the photosensitive layer, said pixel circuitry comprising oxide semiconductors;
a planarization layer disposed on the pixel circuitry between the first electrode and the pixel circuitry such that the first electrode is above a plane including the pixel circuitry; and
a surface of at least one of said first electrode and said second electrode at least partially overlapping the pixel circuitry and having a surface inflection above features of the pixel circuitry.

57. A radiation sensor comprising:
a photoconductor detector including in order a first electrode, a photoconductive layer, and an ionizing radiation transmissive second electrode, and said photoconductive layer configured to generate electron-hole pairs upon interaction with ionizing radiation;
pixel circuitry electrically connected to the first electrode and configured to measure an imaging signal indicative of said electron-hole pairs generated in the photoconductive layer, said pixel circuitry comprising oxide semiconductors;
a planarization layer disposed on the pixel circuitry between the first electrode and the pixel circuitry such that the first electrode is above a plane including the pixel circuitry;
a surface of at least one of said first electrode and said second electrode at least partially overlapping the pixel circuitry and having a surface inflection above features of the pixel circuitry.

58. A method for fabricating a radiation sensor, comprising:
forming pixel circuitry elements on a base substrate, said pixel circuitry comprising oxide semiconductors;
forming a planarization layer over the pixel circuitry elements;
forming a hole in the planarization layer to expose a connection to the pixel circuitry elements;
metallizing the patterned hole;
forming a first electrode in electrical contact to the metallized hole; and
forming on the first electrode a layer sensitive to light or ionizing radiation, wherein forming a planarization layer provides, on a surface of the first electrode at least partially overlapping the pixel circuitry, a surface inflection, above features of the pixel circuitry.

* * * * *

UNITED STATES PATENT AND TRADEMARK OFFICE
CERTIFICATE OF CORRECTION

Page 1 of 1

PATENT NO. : 8,492,728 B2
APPLICATION NO. : 12/817634
DATED : July 23, 2013
INVENTOR(S) : Larry E. Antonuk It is certified that error appears in the above-identified patent and that said Letters Patent is hereby corrected as shown below:

On the Title Page

In the ABSTRACT, delete "The surface inflection has a radius of curvature greater than one half micron."

In the Specification

Column 5, line 47, change "Te" to --$Tl^{+}$--

Column 5, line 63, change "$Tb^{+}$" to --$Tb^{3+}$--

Column 10, line 10, change "The doped" to --The $n^{+}$ doped--

Column 23, line 58, change "$Lu_{18}$" to --$Lu_{1.8}$--

Column 39, line 50, change "photosensitive" to --photoconductor--

In the Claims

Claim 26, Column 51, line 16, change "23" to --24--

Signed and Sealed this
Second Day of September, 2014

Michelle K. Lee
*Deputy Director of the United States Patent and Trademark Office*